United States Patent [19]

Tanabe et al.

[11] Patent Number: 5,855,998

[45] Date of Patent: Jan. 5, 1999

[54] HARD MATERIAL-COATED WAFER, METHOD OF MAKING SAME, POLISHING APPARATUS AND POLISHING METHOD OF HARD MATERIAL-COATED WAFER

[75] Inventors: Keiichiro Tanabe; Akihoko Ikegaya; Yuichiro Seki; Naoji Fujimori, all of Hyogo, Japan

[73] Assignee: Sumitomo Electric Industries, Ltd., Osaka, Japan

[21] Appl. No.: 874,536

[22] Filed: Jun. 13, 1997

Related U.S. Application Data

[63] Continuation of Ser. No. 442,723, May 16, 1995, abandoned.

[30] Foreign Application Priority Data

May 23, 1994 [JP] Japan ................................. 6-133773
Jun. 24, 1994 [JP] Japan ................................. 6-165914

[51] Int. Cl.$^6$ ..................... H01L 21/461; B24B 1/00
[52] U.S. Cl. ..................... 428/216; 428/408; 428/704; 428/446; 428/698; 428/141; 428/426; 427/532; 427/560; 427/255; 427/255.2; 427/249
[58] Field of Search ..................... 428/212, 216, 428/408, 446, 704, 698, 141, 626; 427/249, 255, 255.2, 532, 560

[56] References Cited

U.S. PATENT DOCUMENTS

| 5,071,785 | 12/1991 | Nakazato et al. | 437/62 |
|---|---|---|---|
| 5,240,749 | 8/1993 | Chow. | |
| 5,241,140 | 8/1993 | Itoh et al. | 181/169 |
| 5,270,077 | 12/1993 | Knemeyer et al. | 427/249 |
| 5,273,731 | 12/1993 | Anthony et al. | 423/446 |
| 5,587,013 | 12/1996 | Ikegaya et al. | 117/929 |

FOREIGN PATENT DOCUMENTS

| 0040137 | 11/1981 | Germany. |
|---|---|---|
| 62-252937 | 11/1987 | Japan. |
| 63-256356 | 10/1988 | Japan. |
| 2026900 | 1/1990 | Japan. |
| 2173264 | 7/1990 | Japan. |

OTHER PUBLICATIONS

JP-A-05 090888 (Sumitomo Electric Ind Ltd) Apr. 9, 1993.
Wild et al., "Textured Growth and Twinning in Polycrystalline CVD Diamond films", Proceedings of the Second International Symposium on Diamond Materials, vol. 91-8 (1991), US, pp. 224–239.
Wolter et al., "Textured Growth of Diamond on Silicon Via in situ Carburization and Bias–Enhanced Nucleation", Applied Physics Letters, vol. 62, No. 11, 1993, Mar. 15, 1993, pp. 1215–1217.
Tenth International Symposium Proceedings, Oct.–Nov. 1993.

*Primary Examiner*—Archene Turner
*Attorney, Agent, or Firm*—Cushman Darby & Cushman IP Grou of Pillsbury Madison & Sutro, LLP

[57] ABSTRACT

A hard material-coated wafer that having a distortable substrate and a hard material film deposited thereon by a CVD method is provided. The substrate is substantially flat while in a free-standing state. However, deposition of the hard material film having a Vickers hardness of more than Hv3000 on the substrate causes the substrate to distort into a generally convex-shape. Specifically, the wafer is distorted to the film side with a distortion height H of –150 μm to –2 μm. The resulting wafer can have a total thickness that ranges from 0.1 mm to 2.1 mm; and a diameter that is bigger than 25 mm. Moreover, more than 50% of the film can be polished to a roughness less than Rmax 50 nm and Ra 20 nm.

13 Claims, 21 Drawing Sheets

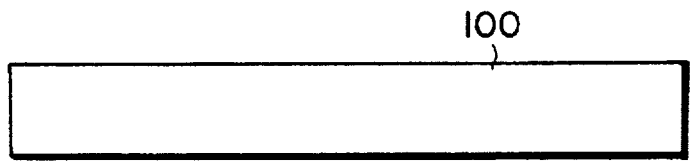
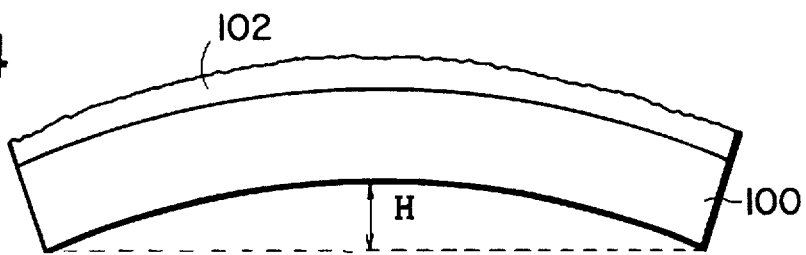
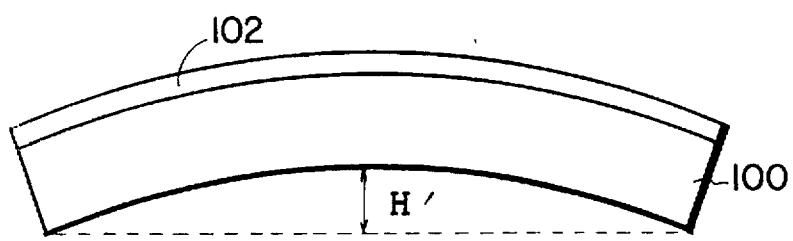
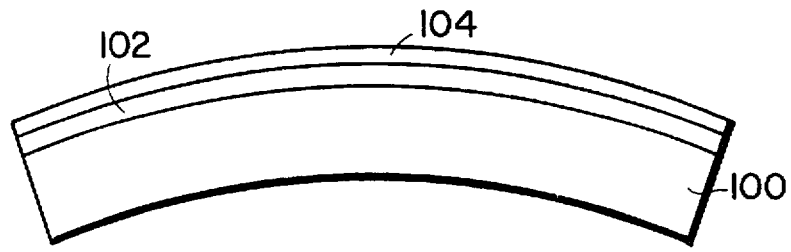
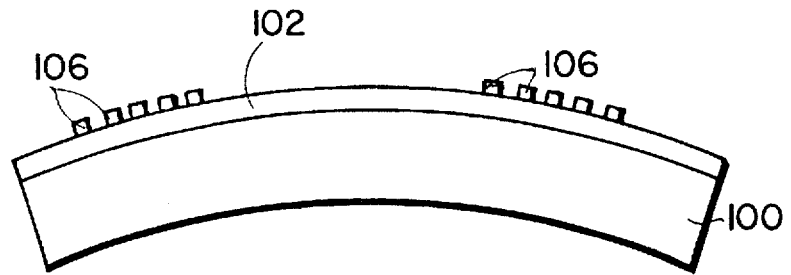

⑭ FLAT WAFER (< 5 μm)

⑬ CONCAVE-DISTORTED WAFER (~30 μm)

⑮ CONVEX-DISTORTED WAFER (~−20 μm)

Fig.25
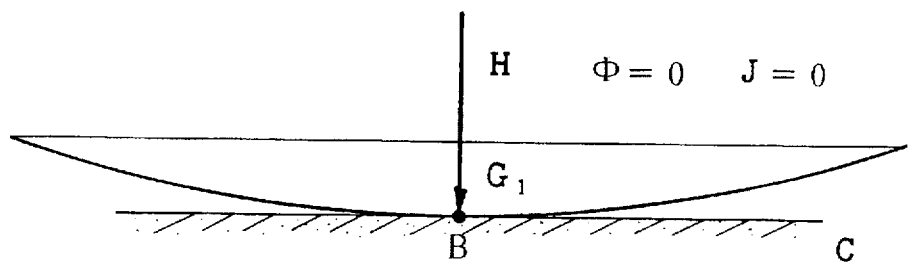
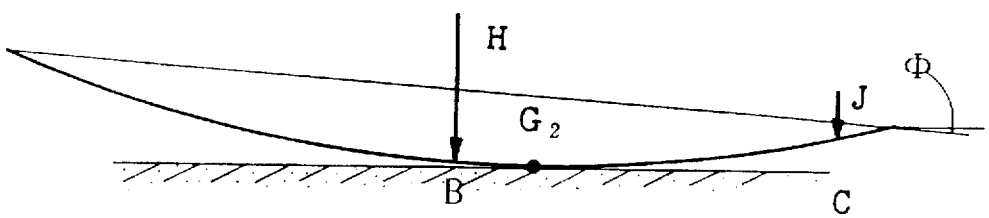
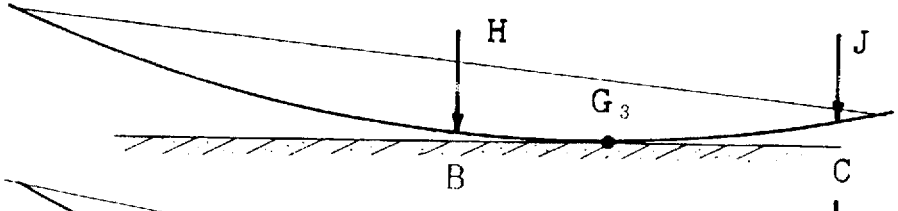
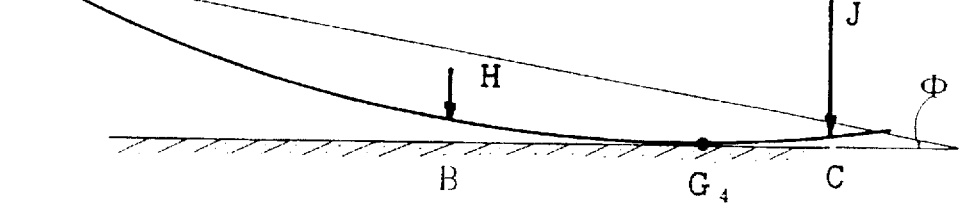
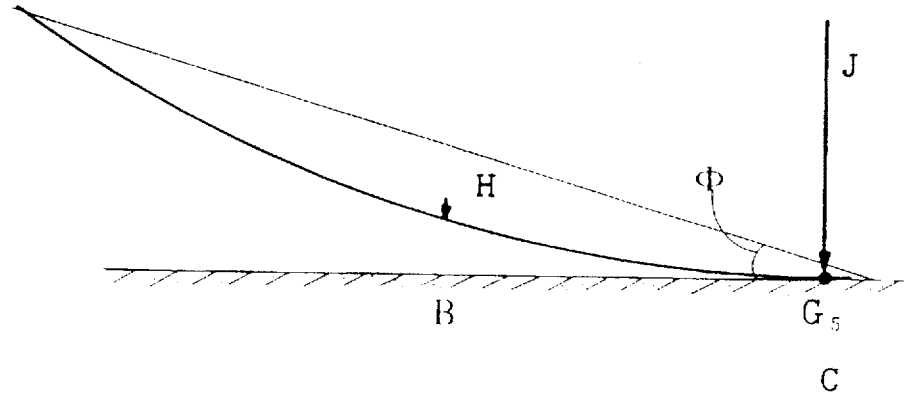

$K_2$ ··· maximum contact circle $$r_2 = \frac{W}{2}$$

PRECESSION

VARIATION OF PRECESSION

HARD MATERIAL-COATED WAFER, METHOD OF MAKING SAME, POLISHING APPARATUS AND POLISHING METHOD OF HARD MATERIAL-COATED WAFER

This is a continuation of application Ser. No. 08/442,723, filed on May 16, 1995, which was abandoned upon the filing hereof.

FIELD OF THE INVENTION

This invention relates to a hard-material coated wafer, a method of coating a substrate with hard material, a polishing apparatus and a polishing method. The hard-material wafer can be utilized for SAWs (surface acoustic wave devices), thermistors, substrates for semiconductor devices, protecting films of discs, and X-ray windows. Here "hard materials" generally indicate diamond, c-BN, or diamond-like carbon. All the hard materials cited herein have a Vickers hardness of more than Hv3000 in the state of bulk materials. The hard materials are endowed with high sound velocity which is determined by the ratio of Young modulus divided by density. Therefore, the velocity of the surface acoustic wave is extremely high. In particular, such hard material-coated wafers now attract attention as a material for the substrates of SAW devices. Suitable applications of SAWs include filters, phase shifters or convolvers. Diamond and c-BN which are intrinsically insulators can be converted to semiconductors by doping them with some impurity.

This invention further relates to a polishing method and a polishing apparatus for polishing surfaces of hard-material coated wafers which can be utilized in the technical fields of electronics, optics or optoelectronics. The hard-material coated wafer is referred to herein as a complex wafer. The wafer has a hard film which is made of a material selected from the group of diamond, diamond-like carbon and c-BN (cubic boron nitride), and a substrate base wafer. The base wafers are made of a softer material than the hard film. For example, Si or Mo is adopted as the base substrate. In particular, this invention is directed to a method and apparatus of polishing diamond-coated wafers which have been synthesized by the vapor phase CVD methods.

BACKGROUND OF THE INVENTION

This application claims the priority of Japanese Patent Application No. 165914/1994 filed Jun. 24, 1994 and No. 133773/1994 filed May 23. The above-mentioned hard materials are favored with excellent physical and chemical properties. However, these materials have not been utilized in various fields for practical uses, since fabrication of wide and inexpensive plates or wafers of the materials has not been accomplished to date. Since the hard materials are provided with several physical and chemical advantages, actual applications of the hard materials to various objects are earnestly desired and have been attempted by applying the technology of silicon semiconductor devices to the hard materials. The object has been produce wide plates (or wafers) of the hard materials.

Technologies have already ripened into a definite level capable of producing films of diamond, c-BN (cubic boron nitride) or diamond-like carbon by vapor phase deposition methods. The vapor phase deposition method makes a hard-material of the material by supplying a material gas to a pertinent substrate heated at a suitable temperature, letting the gas react with the hot substrate and depositing a film of the hard material on the substrate in vapor phase. A film of diamond or c-BN is produced by introducing a material gas including hydrogen gas and hydrocarbon gas, or another material gas including hydrogen gas, boron-containing gas and nitrogen-containing gas in the reaction chamber, supplying the material gas on the heated substrate, synthesizing diamond or c-BN by chemical reaction and depositing the synthesized material as a film on the substrate.

There are some methods for exciting the material gas, including, for example, a hot filament CVD method, a microwave plasma CVD method, a radio wave plasma CVD method or a DC plasma jet CVD method. Some methods are capable of making a wide film of hard materials on a substrate. However, the speed of synthesis is so slow that the methods cannot easily make a thick film at present. In accordance with these methods, a long for deposition is needed to make a considerably thick film on the substrate.

Nevertheless, there are still no pure wafers consisting only of a hard material free from a substrate. In other words, at present, there are no diamond wafers or c-BN wafers in their true meanings, because prior technology has not been able to produce a pure diamond wafer or a pure c-BN wafer.

The application of the hard materials, i.e., diamond, c-BN or diamond-like carbon to electronics technology requires wide area wafers of the hard materials. While surface acoustic wave devices on very small diamond substrates have been produced, larger substrates have not.

However the fact that a new device was fabricated on a quite small diamond substrate, e.g., from 5 mm square to 10 mm square, was rather insignificant from an industrial standpoint, even if the device itself exhibited an excellent performance. Since the small substrate allowed only a small number of devices to be made on it, the productivity was poor. The devices made on the small substrate had little practical significance due to the poor productivity.

What brought about the success of silicon semiconductor devices is the ability to treat a wide area Si wafer by the same wafer processes at the same time and make several equivalent devices in a short time. It has been believed that the same would perhaps hold for the hard materials. If diamond, c-BN or diamond-like carbon is to obtain a practical importance as substrates, the material should be formed into wide, round thin plates (wafers). The advent of the wide wafers will enable manufacturers to apply the technology which has been developed by the silicon semiconductor industry to the hard materials.

In the case of silicon, big single crystals with a wide section can easily be grown by Czochralski methods, and mainly 8-inch wafers are produced for making devices at present. 12-inch wafers also can be produced now for silicon.

However, a diamond or c-BN single crystal cannot be grown by the conventional methods, e.g., Czochralski methods, at present. Thus, it is still not promising to produce homogeneous wafers consisting only of a single material of the hard materials, unlike silicon (Si) or gallium arsenide (GaAs). In fact, it is impossible to make wide, homogeneous diamond wafers or c-BN wafers by conventional methods.

This invention gives up the attempt of making a homogeneous wide wafer consisting only of a single material of diamond, c-BN or diamond-like carbon. Instead of starting from the premise of making a homogeneous bulk single crystal, this invention employs a substrate of a different material than the film for making complex wafers containing a non-hard material substrate and hard material films formed on the substrate. The present invention intends to make a hard material film on a commonplace material, e.g., Si, GaAs or so, which can easily be produced or obtained. The complex wafter having a substrate plus a hard material film provides the possibility of making a wide hard material wafer by employing a wide base wafer as a substrate. The base wafer of non-hard material plays the role of the base mount on which the hard material film is deposited. The film on the base wafer is the principal portion of the wafer which will contribute to the production of semiconductor devices or SAWs.

A homogeneous wafer consisting only of pure diamond or c-BN, made by forming a very thick film on the substrate and eliminating the substrate by etching, is still unpractical, because it takes very long time and very much material to deposit such a thick layer. Further, a large inner stress would break the film when the substrate is etched away. Therefore, the production of a freestanding film remains an unpractical object.

This invention is directed to the complex, non-homogeneous wafer having a non-hard material wafer as the substrate of the wafer. The substrate of the wafer does not cause a problem in application, since almost all the devices make use only of the surface of the wafer. This invention employs a non-homogeneous, complex wafer having a Si or GaAs surface on the bottom and a diamond or c-BN surface on the top. The adoption of the complex wafer can overcome the difficulty of making a wide bulk single crystal of the hard materials, because complex wafers can be made by the thin film-formation technology. The term "hard material wafer" in the present invention is quite different from the ordinary wafers produced by slicing an ingot of bulk single crystal. The wafers proposed by the present invention are different from the silicon wafers or the gallium arsenide wafers in their production methods.

This invention satisfies another requirement of the hard material wafers. As mentioned before, it has been attempted to make surface acoustic wave devices on a diamond substrate of 3 mm square or 5 mm square. Such attempts may have a certain significance from the standpoint of technological research. However, such a small substrate is useless for making devices on the industrial scale. The industrial production requires circularity, constant thickness, flatness, unbentness, and large diameter for substrate wafers.

With regard to the area of a wafer, the application to electronics devices demands that the materials have wide circular or rectangular wafers of at least an inch diameter (25 mm). Wafers of a diameter less than an inch cannot be treated by the wafer processes which have been developed by the silicon semiconductor industries. Furthermore, a two-inch diameter wafer is better than a one-inch diameter wafer. The three-inch diameter wafer is more preferable to the two-inch diameter wafer from the standpoint of industrial production, which desires large, flat and smooth wafers.

Fortunately, progress in the technology of vapor phase synthesis enables the production of a considerably broad film of diamond or c-BN on a suitable substrate. However, the blunt possibility of forming wide thin films does not increase the probability of making wide wafers suitable for the wafer process. Wafers having rugged surfaces are useless. Namely, a smooth surface is one of the requisites for wafers. Flatness or unbentness is another matter of significance. The hard material wafer must be a mirror wafer without bending or bow. Here flatness means a long range regularity of a surface. Bending or bow indicates a long range irregularity of a surface. Smoothness is defined as a short range regularity, and ruggedness or raggedness signifies a short range irregularity with may convex or concave imperfections on a surface.

The wafer must be mirror-smooth and flat in order to make devices on the wafer by photolithography. If the wafer is not flat or not mirror-smooth, exact patterns cannot be drawn on the wafer by an optical means.

Films which have been made by the vapor phase deposition have a lot of micro convexes or concaves on their surfaces. Wavy morphology is sometimes formed on the surface of the film. In other cases, granular convexes distribute on the surface of the film. In general, the films which have been made by vapor phase deposition cannot be used as a substrate wafer due to the ruggedness of the surface.

If a wafer suffers from a rugged surface, the wafer could be converted into a mirror wafer by eliminating the ruggedness out of the surface with a polishing apparatus. The polishing would remove the convexes, concaves or wavy morphology out of the surface and would make a flat, smooth wafer. Actually in the case of silicon wafers, mirror wafers are made by slicing an Si ingot into a lot of as-cut wafers, etching the as-cut wafers and polishing the etched wafers by a polishing apparatus. Can the same treatment make flat, smooth hard-material coated wafers? No, the same treatment does not make smooth wafers. The polishing of the hard materials has presented unexpected problems.

Since the convex or concave imperfection would be removed from the surface of the hardmaterial coated wafer by polishing, the starting film must have a sufficient thickness to allow for a margin of polishing. It takes a long time and much material to produce a thick film of the hard materials. This has obvious economic disadvantages.

Another big problem is the difficulty of polishing of the hard materials. The hard-material film can be to difficult to polish. Diamond and c-BN are the hardest materials which are far more difficult to polish than silicon wafers. Diamond or c-BN is polished by diamond powder as an abrasive. The polishing is sometimes called the "together-polishing", because diamond powder shaves diamond by reducing itself during polishing. Lengthy together-polishing can polish surfaces of diamond crystals. The problem of hardness thus can be solved by practicing together-polishing.

However, there is still a more difficult problem. The thermal expansion coefficients are different between the hard material-coated film and the non-hard material substrate. The complex wafer will have a large inner stress due to the difference between the thermal expansion coefficients of the film and substrate. After the complex wafer is produced in a reaction chamber, and is cooled, the complex wafer will bend due to the release of the inner stress when it is removed from of the reaction chamber.

In one case, the complex wafer bends convexly to the side of the film. In another case, the complex wafer bends concavely to the side of the substrate. In yet another case, the wafer stays flat as a whole. The directions of bending are now defined with regard to the side of the film. The wafer bending is classified by the directions of bending. The bending which defines a convex shape on the surface of the film is called "convex-distortion". The bending which defines a concave shape on the surface of the film is called "concave-distortion". The problem of the distortion is still latent in the case of small plates. No distortion occurs for small complex plates of, e.g., 3 mm square or 5 mm square.

The present invention aims at making complex wafers of 1 inch diameter, 2 inch diameter or still bigger diameters. Large amounts of bending appears in the complex wafer due to the difference of the thermal expansion coefficients or the inner stress of the complex film itself. The broadness of the wafer induces a large distortion. The problem of the distortion is quite serious for the hard material coating wafers. In the case of silicon, large, flat mirror wafers can easily be produced since Si wafers are homogeneous without the complexity of a multilayer structure. However, the distortion causes a significant problem due to the non-homogeneity and complexity in the case of hard material-coated wafers.

The distortion of wafers causes many difficulties. The distortion prevents the photolithograpy from transcribing mask patterns exactly on the resist coating of the wafer. This is a big drawback in itself. To begin with, the distortion of a wafer is a large hindrance for polishing the wafer. A conventional polishing machine cannot polish a bending wafer at all. Polishing converts a rugged wafer into a mirror wafer. If polishing is impossible, no mirror wafer can be produced. If a wafer is not mirror-polished, the photolithography is entirely impotent. Thus, it is impossible to make devices on a rugged wafer. Polishing is a fundamental requirement for wafers.

Diamond is the hardest material; there is no harder material than diamond. Thus, diamond is polished by diamond. Namely, diamond plates are polished by an apparatus using diamond powder.

There are two methods for polishing diamond plates. One method adopts free polishing powder. The other adopts fixed polishing powder. Skife polishing which has been known as a way of the former polishing method uses an iron polishing plate and diamond free polishing powder. The method polishes a diamond plate by the steps of gluing the diamond plate to a holder, pushing the holder on a rotary polishing turn-table (round whetstone), supplying polishing liquid containing diamond powder, revolving the turn-table, rotating the holder and whetting the object diamond plate by the physical action of diamond granules. The method has a drawback of producing a large amount of diamond powder waste since it depends on free diamond powder in polishing. The consumption of diamond powder raises the cost of whetting. Another fault of the method is the slow whetting speed and the poor accuracy of finishing.

Another (fixed powder) method grinds diamond plates with a whetstone on which diamond powder is fixed. There are several kinds of diamond whetstones, which are classified by the manner of fixing diamond granules on the whetstones. The whetstone on which diamond powder is fixed by phenol resin, polyimide resin or so is called a resin-bonded whetstone. Another whetstone on which diamond powder is fixed by bronze, cobalt, tungsten, iron, nickel and so forth is called a metal-bonded whetstone. The whetstone on which diamond powder is fixed by plating of nickel etc. is called an electrodeposition whetstone. These whetstones using fixed diamond powder have an advantage of avoiding the waste of diamond granules.

The fixed granule method polishes the surface of diamond plates by the steps of sticking a diamond plate on a holder, pushing the holder on a rotary whetstone table, revolving the whetstone table, rotating also the holder around own axis and polishing the surface of the diamond by the physical interaction with the fixed diamond granules.

All the methods grind diamond plates or diamond films by the physical contact with the diamond granules. The methods depend on the physical action of the diamond powder. Because of the heightened physical interaction, these methods require imposing a heavy load on the polishing faces. The high pressure of the load enables the diamond powder to scuff, scratch, or scrape the surface of the object diamond plates or films. The heavy load also defaces the diamond granules either being fixed on the whetstone or flowing in the liquid. Without the heavy load, the object diamond can be ground no more, slipping in vain on the whetstone.

It has been suggested to develop a polishing method which dispenses with the heavy load. Japanese Patent Laying Open No. 2-26900 (26900/90) proposes a thermochemical method which polishes diamond by chemical reaction by bringing diamond into contact with a heated flat metal table under the oxidizing atmosphere at a high temperature. This chemical method uses no diamond powder.

FIG. 16 and FIG. 17 demonstrate conventional polishing apparatuses for general purposes. The object plate to be polished is hereinafter called a wafer now.

In FIG. 16, a polishing turn table (1) (rotary grindstone) is a diamond whetstone on which diamond powder is fixed by some means. An object wafer (2) is fixed on the bottom of a holder (3). The holder (3) is fixed to a shaft (4). The surface of the holder (3) is parallel with the face of the polishing turn table (1). An air-pressure cylinder or an oil pressure cylinder (5) is mounted on the top of the shaft (4) for pressing the holder (3) via the shaft (4) to the turn table (1). When the apparatus polishes a soft material, the load is unnecessary. But a heavy load is essential for grinding hard materials, i.e., diamond, c-BN or diamond-like carbon. An arm (6) supports the cylinder (5) and the shaft (4). The arm (6) can displace in a radial direction. The region of the whetstone table (1) which is in contact with the object moves in the radial direction for equalizing the defacement of the turn-table (1). The object wafer contacts the central part and the peripheral part of the polishing turn-table (1). The turn-table is worn out uniformly, maintaining the flatness of its face. The flatness of the turn-table ensures the long life time of the polishing table. In the apparatus of FIG. 16, the holder (3) does not rotate. The hard-material film of the wafer is whetted by the interaction between the revolving turn-table and the film.

When a hard-material having a Vickers hardness higher than Hv3000 is polished, the following problems arise.

One problem is the non-uniform polishing which is originated from the imparallelism of the wafer with the polishing table. The wafer must be kept rigorously in parallel with the grinding table in order to polish the whole surface uniformly. However, it is difficult to maintain the wafer in parallel with the polishing table. When the face of the wafer slants, the hard-material film is polished slantingly. Some parts of the film are thinner than other parts, which may be left unpolished. Therefore, the thickness of the film is not uniform in the whole plane. Such an uneven whetting is undesirable. It is important to obtain a uniformly thick film. In the case of a thin film, if the slanting polishing arises, the polishing starts from a corner which comes in contact with the polishing table at first, and then the other parts are later polished. Before some parts are polished at all, the base wafer is revealed under the film. Such a wafer is useless as a hard-material coated wafer. This problem is called a slanting polishing problem.

The other problem is originated when the wafer has an inherent wavy distortion, a concave distortion or a convex distortion. In the case of soft silicon, the convexes or concaves are entirely eliminated where the object is polished by a thickness larger than the heights of the convexes or concaves. However, such an easy solution does not apply to the hard-material coated wafers. The inherent distortion of wafers causes a serious problem in the case of hard-materials. Polishing diamond is far more difficult than silicon. The speed of polishing is far slower. In an initial stage of polishing, the turn-table comes into localized contact with the most prominent part of the film. The area of the contact is small enough, which allows polishing proceed in a pertinent speed. As the polishing operation progresses, the initially-concave parts come into contact with the polishing table. The increase in contact area reduces the pressure per unit area. Thus, the speed of polishing decreases. Eventually, the polishing ceases substantially. An addition to the load is needed to restore the progress of polishing.

However, the apparatus cannot impose an indefinitely heavy load upon the holder. The amount of the load is restricted within a range that will not cause the wafer to break. The limitation of the load causes a shortage of the pressure per unit area, which leaves unpolished parts or insufficiently-polished parts on the wafer. This is a defect of the static polishing apparatus shown in FIG. 16 which does not rotate the holder.

FIG. 17 indicates a perspective view of another prior apparatus which rotates the holder around its axis. The polishing turn-table (1) is a diamond whetstone. A wafer (2) is fixed to the bottom of a holder (3). The holder (3) is fixed to the shaft(4). Bearings sustain the shaft (4) vertical with respect to an arm (6), allowing the shaft (4) to rotate. An oil pressure cylinder or an air pressure cylinder (5) is mounted on the arm (6) above the shaft (4) for applying a load upon the holder (3) via the shaft (4). The arm (6) holds a motor (7) for driving the shaft (4). The rotation torque is transmitted from the motor (7) via a pulley, a belt and a pulley to the shaft (4). The torque rotates the holder (3) and the wafer (2). The wafer is polished by both the revolution of the turn-table (1) and the rotation of the holder (3).

This apparatus positively rotates the shaft (4) by a motor. However, a simpler example can be built by eliminating the motor and holding the shaft rotatably with bearings. Without the positive driving torque, the holder (3) rotates by itself around its own axis. Namely the line velocities of the contact regions are different between the central region and the peripheral region of the turn-table. The difference of the line velocities rotates the holder (3) in a certain direction at a moderate speed. This is a passive rotation. This rotation also is called "accompanying rotation". The wafer (2) rotates on the turn-table whether the motor positively drives the shaft or the speed difference drives the wafer passively.

The rotation of the wafer equalizes the contact of the wafer on the turn-table. In both cases, the rotation of the wafer can solve the problem of the slanting polishing which is caused by an inclination of the shaft with respect to a normal of the turn-table.

However, the rotation of the wafer cannot solve the other problem of the unpolished parts being left on the wavy distorted, convex-distorted or concave-distorted wafer. If the distorted wafer were polished to the bottom of the convexes, a flat wafer could be obtained. However, the amount of polishing cannot be increased so much in the case of hard materials. An application of a heavy load is restricted in order to avoid breakage of the wafer. The limitation on the load compels the apparatus to terminate polishing far before the wafer is completely polished.

The Inventors found that the prior polishing apparatus cannot polish a hard-material coated wafer with a distortion of a height more than 50 μm perfectly, i.e., to the bottom of the convexes. Instead, wide unpolished parts are left on the wafer. Even for wafers of a distortion height between 20 μm and 40 μm, conventional polishing techniques are likely to leave some parts unpolished or imperfectly polished.

For facilitating an understanding of these problems, three kinds of imperfection of polishing are now clarified by referring to FIG. 21, FIG. 22 and FIG. 23. In FIG. 21 to FIG. 23, left figures indicate sectional views of complex wafers having a base wafer (substrate), and a rugged hard-material film, and right figures show the plan views after polishing. FIG. 21 denotes the case of an even wafer. The height of distortion is less than 5 μm. Unpolished parts remain isolated at random within a circle distanced by 5 μm to 10 μm from the circumference. FIG. 22 indicates the case of a concave-distorted wafer. The height of distortion is, for example, 30 μm. A continual, annular part is left unpolished in the middle region within an annular region extending between 5 μm and 10 μm from the circumference. Namely, the periphery and the central part are polished. FIG. 23 denotes the case of a convex-distorted wafer. The height of distortion is, for example, −20 μm. A continual circumference part is left unwhetted. The polishing starts from the central part, develops to the middle region and then pervades to the periphery. This pattern is simpler and more promising than the other two displayed in FIGS. 21 and 22. These are the types of imperfections of polishing. The inclination polishing explained before by FIG. 16 is not shown here, because it appears in the case of a static holder and it is solved by adopting a rotary holder.

The applicability of the conventional wafer process is indispensable for the exploitation of hard-material coated complex wafers, that is, diamond-coated wafers, diamond-like carbon coated wafers or c-BN coated wafers to the fields of electronics, optics or optoelectronics. For example, the technology of photolithography must be able to be applied to the complex wafers for fine processing. Photolithography requires flatness of the object wafers. The various wafer processes have been highly developed in the silicon semiconductor technology. The hard-material coated complex wafers must cope with the conditions presented by the established wafer processes.

The hard-material coated complex wafer must comply with the requirements involved with the fabrication of semiconductor devices. In general, the fabrication technology demands a diameter of more than 2 inch and a thickness of less than 1 mm of a wafer.

The sizes of electronic devices become smaller year by year. The miniaturization of devices requires the reduction of thickness of wafers. The thinning technique has been established for silicon wafers.

Unlike silicon, wide, homogeneous wafers composed of only a single material cannot be produced pursuant to current technology in the case of hard materials, that is, diamond, diamond-like carbon and c-BN, because of the difficulties involved with making big and long single crystals. However, complex wafers can be produced by coating a pertinent substrate with a film of the hard-material. Instead of homogeneous wafers, two-component, complex wafers will be produced for the hard-materials. The nonhomogeneous wafer consists of a substrate and a hard-material film. The hard-materials are hereinafter represented by diamond for brevity.

Diamond-coated wafers can be made by the known plasma CVD method, the hot filament CVD method and so forth. Various materials can be adopted as the substrates. The most convenient substrate is a silicon wafer, because the technology of making and processing silicon wafers has matured. It is easy to obtain flat silicon wafers at low cost.

A complex wafer can be made by depositing a diamond thin film on the substrate by the above-mentioned methods. The surface of the film is rugged. Then the rugged surface of the diamond-coated wafer must be polished into a smooth and flat surface.

However, diamond is the hardest material among all the materials obtainable at present. There is no material harder than diamond. Thus, diamond is mechanically polished by a polishing machine using diamond powder as whetting medium. In the polishing, high pressure must be applied to the surface of the object diamond. Thus, a diamond wafer must endure strong stress. However, a diamond wafer consists of a substrate wafer and a thin diamond film. The mechanical strength of the wafer is determined by the nature of the substrate. High loads affect mainly the substrate in the long run.

Silicon which is used as a substrate is a fragile material. When a silicon wafer is adopted as a substrate, the complex wafer is likely to break, in particular when the wafer has a big diameter and thin thickness. If another material is used as a substrate, the problem will not be solved, since the material is likely to be broken by the high pressure. This problem of high pressure must be solved in order to make a mirror diamond wafer.

There is still another problem. A strong inner stress arises in the complex wafer having a substrate and a film due to the two layered structure. A diamond is synthesized at a high temperature in vapor phase from the excited material gas. Then the wafer is cooled to room temperature. Thermal stress occurs in the complex wafer due to the differences of thermal expansion between the substrate and the film. In addition, a diamond film has inherently intrinsic stress. The thermal stress and the intrinsic stress distort the complex wafer convexly or concavely to a great extent.

Conventional polishing apparatuses whet a flat object by a flat holder and a flat polishing turn-table. The conventional machines are entirely unsuitable for polishing distorted objects. One alternative is polishing a distorted object by gluing a distorted object in a forcibly flattened state on a flat holder, pushing the object by the holder upon the turn-table, rotating the holder and revolving the turn-table in a conventional machine. However, such a superficial improvement would be in vain. One problem is the high probability of breakage of the wafers. Another problem is the difficulty of whetting the film uniformly. Another difficulty is a large fluctuation of the thickness of the film polished. These problems impede the application of the conventional polishing machines to the two-layered wafers having a substrate and a hard-material film.

One purpose of the present invention is to provide a broad complex wafer having a non-hard material substrate and a hard material film.

Another purpose of the invention is to provide an unbent complex wafer without inner stress.

Another purpose of the invention is to provide a smooth complex wafer without micro convexes or micro concaves.

Another purpose is to provide a method of polishing a complex wafer having a fragile substrate and a hard material film.

Another purpose is to provide a method of polishing a complex wafer without breaking or cracking the wafer.

Another purpose is to provide a method of polishing a complex wafer with distortion.

Another purpose is to provide a method of polishing a complex wafer without leaving unpolished parts.

Another purpose is to provide a method of polishing a complex wafer having a substrate and a hard film with little fluctuation of the thickness of the polished film.

Another purpose of the invention is to provide a method of polishing a hard film of a complex wafer with high efficiency.

Another purpose is to provide a machine for polishing a complex wafer having a non-hard material substrate and a hard material film into a mirror wafer.

Another purpose is to provide a machine for polishing a complex wafer without breaking or cracking the wafer.

Another purpose is to provide a machine for polishing a complex wafer with efficiency.

SUMMARY OF THE INVENTION

The hard material-coated wafer of this invention comprises a non-hard material base wafer and a hard material film with a thickness from 5 μm to 100 μm (preferably from 15 μm to 50 μm) and having a surface with a roughness less than Rmax 50 nm and Ra 20 nm, wherein the wafer bends convex on the side of the film with a bending height of 2 μm to 150 μm.

The method of producing a hard material-coated wafer comprises the steps of depositing a film of hard material of diamond, c-BN or diamond-like carbon to provide a thickness from 5 μm to 100 μm by a vapor phase deposition method, and polishing the film until the roughness attains Rmax less than 50 nm and Ra less than 20 nm.

The vapor phase method of producing the film can be selected from a filament CVD method, a microwave plasma CVD method, a radio-frequency plasma CVD method, a plasma flame method or so. The pertinent pressure of reaction is 1 Torr to 300 Torr. The material gas is hydrogen gas and hydrocarbon gas for the production of diamond or diamond-like carbon film. The material gas is hydrogen gas, boride gas and nitride gas for making a c-BN film.

In the formation of a diamond film or a diamond-like film, hydrogen gas and hydrocarbon gas constitute a main part of the material gas. However, the hydrogen gas can be replaced in whole or in part with a rare gas. Hydrocarbon gas can also be replaced with some organic gas or inorganic gas including carbon in the case of diamond or diamond-like carbon. It is preferable to dope the material gas with some organic gas or inorganic gas containing oxygen gas.

The vapor phase synthesis conditions should be selected in order to make a convex-distorted wafer which bends toward the side of the synthesized film. This is an important matter. A flat wafer is surprisingly rather inoperative, since a substantially flat wafer has a wavy surface unsuitable for polishing. A concave-distorted wafer is also improper. Only convex-distorted wafers can be polished uniformity by the polishing apparatus of this invention. The film of the convex-distorted wafer should be polished until the roughness of the film is reduced to Rmax less than 50 nm and Ra less than 20 nm. Although the surface is not perfectly smooth, a film having such a roughness is suitable for forming electrodes, implanting impurity atoms, diffusing impurities or etching metals, oxides or semiconductors selectively by photolithography.

FIG. 1 shows a sectional view of a hard material-coated wafer of the present invention. This is a convex-distorted wafer.

Partly because of the difference of thermal expansion coefficients and partly because of the big thickness of the film, strong inner stress occurs in the complex wafer when the wafer is cooled to room temperature after the synthesis of the hard material film. The strong inner stress deforms the complex wafer either to a convex-form or to a concave-form. The distortion is now expressed by the height H, which is measured from the center of an imaginary plane connecting opposing peripheral portions of the wafer to the bottom surface of the wafer. The sign of the height H is determined herein to be positive for concave distortion and to be negative for convex distortion. This invention prefers convex-distorted wafers with negative heights H between −2 µm and −150 µm. FIG. 1 shows a convex-distorted wafer of a negative distortion height which is suitable for the polishing apparatus of the present invention.

The Inventors have found that the distortion of wafers can be controlled by controlling the conditions of the vapor phase deposition of the film on the substrate. Some synthesis conditions can make a flat wafer. A flat wafer seems to be preferred for polishing. However, this is wrong. A flat wafer actually contains waves, as shown in FIG. 2. The wafer which seems flat is actually partly concave and partly convex. Namely, a flat wafer is more complex than a convex wafer or a concave wafer as a whole. When a flat wafer with a wavy surface is polished, unpolished portions remain. Thus this invention avoids flat wafers. Further, this invention does not employ concave-distorted wafers because of the difficulty of polishing.

The present invention requires the following conditions of hard materials, substrates and distortion as optima.

[A. hard material films]

Diamond films, diamond-like films and c-BN films should be provided with the conditions below:

1. Thickness of film: 5 µm to 100 µm; preferably 15 µm to 50 µm. A large film thickness raises the cost of formation of the film. A 1000 µm thick film is operative but such a thick film needs too much material and too long time for deposition. Thus, a film thicker than 100 µm is disadvantageous from the economical standpoint. On the other hand, too small of a film thickness complicates polishing. The base wafer is exposed at some parts of the surface after polishing. Sometimes the wafer is broken by the contact of the base material to the polishing plate. Therefore, this invention employs films with a thickness more than 5 µm. Preferably, the thickness is 15 µm to 50 µm.

2. Roughness of surface: Rmax is less than 50 nm. Ra is less than 20 nm. If the surface roughness is larger than these values, the wafer cannot be utilized as a wafer for electronic devices or a wafer for abrasion resistant tools. If the roughness of a wafer is large, the photolithograpy techniques are not suitable to form fine patterns of wires of devices on the wafer. A high roughness raises the friction coefficient of the complex wafer. The wafer with high friction is not suitable as a material of abrasion resistant tools.

[B. base wafer (substrate)]

The base wafer on which a hard material film is grown is a non-hard material which is suitable for being formed into a wide, thin plate. The material of the base wafer is one of Si, GaAs, GaP, AlN, SiC, $Si_3N_4$, $LiTaO_3$, $LiNbO_3$, $Li_2B_4O_7$, $PbTiO_3$, $PZT(PbZrO_3$—$PbTiO_3)$ or quartz. A Si single crystal wafer is, in particular, the most desirable. Furthermore, a (100) Si wafer is the optimum material among various oriented silicon wafers.

The optimum thickness depends on the material selected for the base wafer. In general, the thickness of the base wafer should be 0.1 mm to 1 mm. A base wafer thinner than 0.1 mm would undergo a large distortion and be prone to breakage. On the other hand, a wafer thicker than 1 mm cannot be treated by the wafer process. Thus, devices cannot be built on such a thick wafer by the process. If devices are made on the thick wafer, the devices cannot be mounted on packages unless the wafer is thinned by grinding its bottom surface.

With regard to the shape, circular wafers are the most convenient for handling, e.g., conveyance, fixation, storing, or supporting. However, a rectangular wafer or square wafer is also suitable as a base wafer. Such wafers are used for special purposes. In general, circular wafers are most suitable for treatment by the common semiconductor process like silicon wafers.

The diameter is an arbitrary parameter which will be determined in accordance with the application for which the wafer is designed. The diameter, however, must be larger than one inch (25 mm) to enhance the efficiency of the treatment in the wafer process. 2-inch wafers, 3-inch wafers, 4-inch wafers, 5-inch wafers or 8-inch wafers are also useful as base wafers of the invention.

[C. distortion]

This invention requires that, after the synthesis of the films, the wafer exhibit a convex distortion. Namely the wafer should be distorted convex to the side of the film monotonously from the periphery to the center. The absolute value |H| of the height of distortion must range from 2 µm to 150 µm. The distortion of the wafer is here expressed by the height H measured from the center of an imaginary plane including the peripheral circle of the wafer to the lower surface of the wafer. The distortion may be designated by a curvature radius R. R and H are simply related by an equation $R=D^2/8H$, where D is the diameter of the wafer. Further, the convex-distortion is allocated with a negative H but the concave-distortion is assigned with a positive H. Thus the requirement of distortion is briefly described by −150 µm≦H≦−2 µm, and preferably by −50 µm≦H≦−5 µm.

The present invention is not specifically directed to a wafer without distortion, that is, H =0. Wafers having no distortion may seem to be the best for the following polishing process. However, if a wafer has no macroscopic distortion, it actually has some waves which invite more complex modes of bending, as shown in FIG. 2. Such a wavy wafer cannot be polished perfectly by any technique. Unpolished parts or insufficiently polished parts remain at random on the surface. Wafers exhibiting some bending are more suitable for polishing, even though the distortion is pretty large. The minimum distortion is determined to be 2 µm for excluding non-distortion H=0. On the other hand, the maximum distortion is 150 µm. A wafer having a distortion height larger than 150 µm will exhibit some unpolished regions. Wafers should be uniformly polished overall. The uniform polishing is impossible for wafers which bend more than 150 µm. Thus this invention attempts to avoid a distortion of more than 150 µm.

Next, the polishing method and polishing machine of the present invention will be explained.

The polishing method of the present invention comprises the steps of attaching a complex wafer having a substrate and a hard film of more than Hv3000 to a center of a bottom face of a holder in a convex-distorted state, introducing the convex film to a rotating turn-table, applying a heavy load on the center of the holder, rotating the holder, inclining the bottom face of the holder with respect to the turn-table, bringing a contact region between the wafer and the turn-table from the center to the peripheral portion of the wafer gradually, and thereby moving a polishing region from the center to the periphery of the film. Since the contact region moves from the center to the periphery, the entire surface is perfectly polished, leaving no unpolished portions. The movement of rotation around a slanting axis whose direction is changing is now called a "precession" or a "swaying movement". In the restrict meaning in physics, the precession denotes the rotation in a rigorous cone of the slanting axis itself. However, the word "precession" here means arbitrary rotation movement of the slanting axis of the holder. The locus of the axis includes not only circles but also ellipsoids. The swaying movement means the reciprocal inclinations of the rotational axis in the radial direction. The locus of the axis is a part of a straight line. Thus, swaying movement is a limit of the precession whose locus ellipsoid has a shorter axis of a length of zero. Thus, sometimes both the precession and the swaying movement are represented by precession in short.

This invention polishes a hard material coated wafer by attaching the wafer to the center of the bottom of the holder, contacting the holder on a whetting turn-table, rotating the holder and allowing the holder take a precession or a swaying movement. In addition, the invention preferably reciprocates the holder in the radial direction. Thus, the present invention can mirror-polish the whole surface of the wafer into a flat film of uniform thickness without breaking the wafer. No portion is left unpolished. All the surface is whetted uniformly by the precession or the swaying movement.

Further, it is more desirable to insert a buffer between the wafer and the holder. The buffer allows the wafer to deform, absorbs the impulse and prevents the wafer from breaking. The buffer can be made from an elastic material, for example, rubber, plastics or so.

This invention can be applied to a convex-distorted wafer, a substantially flat wafer and a concave-distorted wafer. In each instance, the wafer must be attached to the holder in the state of the convex-distortion. This restriction is important for polishing. The pertinent height of the convex-distortion ranges from 3 μm to 50 μm in the wafer.

In the case of a convex-distorted wafer with a pertinent curvature, the wafer can be attached to the buffer which is connected to the bottom of the holder. The wafer is held by the holder via the buffer. The elastic deformation of the buffer maintains the suitable convex-distortion of the wafer.

Otherwise, when the wafer is flat, concave-distorted or convex-distorted with a curvature out of the optimum range between 3 *m and 50 μm, a spacer is inserted between the wafer and the buffer for deforming the wafer forcibly into the convex-distorted state so as to take on a distortion height within the range of 3 μm and 50 μm. The use of the spacer is inevitable in the case of the wafer whose inherent distortion is outside of the range between −3 μm and −50 μm. But the adoption of the spacer is optional in the case of the wafer having an inherent distortion from −3 μm to −50 μm.

What is important is the precession or the swaying motion of the holder for bringing the whole convex-distorted surface into contact with the polishing turn-table. The amplitude of the precession or the swaying motion is nearly equal to the center angle of the curved face of the convex-distortion of the wafer. The precession of the holder is the most essential part of the invention. Without the precession, nothing but the central part would come in contact with the polishing table, and the peripheral portions could not be polished at all. The precession enables the machine to whet the periphery of the wafer.

As explained before, the optimum height of distortion is −3 μm to −50 μm. The height of distortion is defined as a distance between the top of distortion and the imaginary plane connecting opposing peripheral portions of the wafer.

This invention can be applied to any size wafer. In particular, the method is suitable for a wafer having a diameter of more than 1 inch (25 mm) and a thickness between 0.1 mm and 2.1 mm. The wider the wafer is, the more difficult the polishing becomes. However, this application can be applied to wafers having a diameter of more than 1 inch (25 mm). The method can treat 2-inch wafers, 3-inch wafers and 4-inch wafers.

The distortion of wafers is here represented by the height (H). H is determined to be positive for concave distortions. H is negative for convex distortions. The curvature of wafers differs for the same distortion height if the diameters of the wafers are different. In the case of a simple quadratic distortion, the radius R of curvature is related to the distortion height H by the equation $H=D^2/8R$, where D is the diameter of the wafer. Namely, the curvature radius R is in reverse proportion to the distortion height. The product of the two parameters is $D^2/8$. The curvature $1/R$ is of course in proportion to the distortion height H.

Irrespective of the initial distortion, the wafer is attached to the bottom of the holder via the spacer which gives the wafer a pertinent convex-distortion of −3 μm to −50 μm. Thus, the wafer is connected to the holder in the convex-distorted state of H=−3 μm to −50 μm. If the wafer has the suitable distortion of H=−3 μm to −50 μm, the wafer can be easily attached to the spacer and fixed on the holder. However, in many cases, the curvature of the spacer differs from the inherent curvature of the wafer. Nevertheless, such wafers can still be polished by the apparatus of this invention. For example, even an originally concave-deformed wafer can be forcibly bent into the reverse tendency and attached to the holder. The difference of the curvatures gives rise to inner stressing the sample. However, the buffer protects the wafer from breaking.

A convex-distorted wafer can be attached to the holder via a convex spacer and a buffer without forcibly bending the wafer. A flat wafer and a concave-distorted wafer also are fixed to the holder via a convex spacer and a buffer.

In preparation, the wafer is polished by a polishing machine which applies the precession or the swaying motion to the holder. The machine can polish the wafer until the surface maximum roughness Rmax is reduced to less than 50 nm and the average roughness Ra is reduced to less than 20 nm on at least 50% of the whole surface. Here Rmax≦50 μm and Ra≦20 μm define smooth enough surfaces to enable the wafers to be treated by the wafer processes, including photolithography. Accordingly, the apparatus of the present invention can whet a hard-material coated wafers to a smooth wafer having more than half of its surface polished. If an unpolished portion remains, it is in a peripheral circular zone. In many cases, the mirror-polished portion exceeds 90% of the whole surface. The ratio of the mirror-polished portion can be raised to 100% by the adjustment of the amplitude of the precession angle or the swaying angle. Since this invention extends the contact region of the convex-distorted wafer from the center to the periphery gradually, an arbitrary portion from the center can be polished continually by adjusting the angle of the precession. This invention prevents such a random distribution of unpolished portions shown in FIG. 21 or a middle zone of unpolished part denoted in FIG. 22 or intermediate polishing shown in FIG. 23.

In addition of the precession or the swaying motion, it is also profitable to displace the holder in a direction not parallel with the circular direction. Since the turn-table is rotating, the non-circular displacement induces an effective radial movement of the contact portion. Thus the motion in the non-circular direction of the holder can be called now a radial displacement of the holder. The radial displacement of the holder changes the contact region of the turn-table and equalizes the defacement of the turn-table in a wide range.

Reciprocal displacement is more preferable for dispersing the defacement of the turn-table. If the defacement occurs uniformly on the turn-table, the flatness of the turn-table is maintained for a long time. Namely, the uniform defacement maintains the flatness and the parallelism of the surface of the polishing turn-table, and prolongs the life time of the turn-table. The reciprocal movement or the displacement in the radial direction is shown in FIG. 30 and FIG. 31. A solid circular line indicates an outer position (S) of the holder. Σs denotes the locus of the contact region of the holder(wafer) at S on the turn-table. A dotted circular line designates an inner position (T) of the same holder. Σt is the locus of the contact region of the holder (wafer) at T on the turn-table. When the holder is displaced or reciprocated between S and T, the whole zone between a small circle m and a big circle p comes into contact with the wafer.

The initial thickness of the film is arbitrary. The film thickness should be determined not to induce too large deformation of the wafer. The thickness of the substrate is also arbitrary. If the thickness of the substrate is determined to be, for example, 0.1 mm to 2 mm for an economical reason, the suitable initial thickness of the film shall be 0.01 mm to 1 mm.

It is difficult to make a thick hard film from the standpoint of economy of time and material. The practical thickness of the film is less than 200 μm perhaps. However, this invention is applicable to any thickness of films of course. The thicker the film is, the smaller the fluctuation of the thickness after whetting.

This invention is capable of reducing the fluctuation of the film thickness of the smooth parts having a roughness less than Rmax 50 nm and Ra 20 nm within ±10%. Two methods are available for suppressing the fluctuation of the film thickness of the smooth parts with Rmax less than 50 nm and Ra less than 20 nm within ±10%.

(A) A distortion-reducing method which gradually reduces the distortion according to the progress of hetting. FIG. 26 and FIG. 27 demonstrate this method. The wafer (shown in an inverted state) has a structure of a (substrate 100)/(hard film 102a)/(hard film 102b). The top hard film 102b has compressive stress. When the film 102b is removed, the excess compressive stress lessens and the distortion is reduced.

(B) A two-layered method which coats the substrate first with a harder layer and further coats the harder layer with a softer layer. FIG. 28 and FIG. 29 show the method. The structure is a (substrate 100)/(hard film difficult for polishing 102c)/(hard film facile for polishing 102d). When almost all the top film is polished away, the film difficult for polishing is revealed. The thickness of the final film is nearly equal to the thickness of the film difficult for polishing.

It takes a long time to polish a hard material film. This invention is capable of enhancing the whetting speed and raising the throughput of whetting by the following improvement. The improvement makes the contact region discontinuous for reducing the area of the substantial contact regions. There are some ways for reducing the contact area.

One is forming lattice-like grooves on the surface of the whetstone turn-table, as shown in FIG. 32. Many lengthwise grooves and many crosswise grooves are formed on the turn-table. Many small squares will be in contact with the wafer. Thus, the substantial area of contact regions is reduced by the grooves. The reduction of the contact area heightens the polishing speed by enhancing the pressure per unit area.

Another way for reducing the contact area is forming circular grooves on the turn-table. FIG. 33 indicates the plan view of the turn-table having concentric circular grooves.

Another way is forming lattice grooves or concentric circular grooves on the hard film. The grooves are not used as hard material coated chips. This way is applicable for the wafer which requires small chips for devices.

The slanting polishing of this invention polishes hard-material coated wafers by free diamond powder or fixed diamond powder. In the case of using free whetting powder, a polishing liquid including diamond powder is supplied on the turn-table which has a metal surface or a cloth surface.

In the case of using fixed powder, the turn-table must be a diamond whetstone itself. Diamond whetstones are classified into several kinds by the methods of fixing diamond powder on the base plate. This method can adopt any one of the resin-bonded diamond whetstones, metal-bonded whetstones, electrodeposited diamond whetstones, small diamond pellet whetstones and diamond pellet whetstones. These whetstones polish an object by physical action. In addition to the diamond whetstones, a flat metal turn-table heated at a suitable temperature can polish a hard material coated film by thermochemical reaction.

The advantages of the invention are now explained.

Bulk crystals of diamond and c-BN have been synthesized by some methods. All the bulk crystals had a poor practical significance aside from the academic meanings, because they had too narrow of a surface area. This invention succeeds in making big-sized wafers of the hardest materials, i.e. diamond, diamond-like carbon and c-BN, for the first time. The hard material wafers have a complex structure which includes a commonplace substrate and a hard film deposited on the substrate. The wafers are different from Si wafers or GaAs wafers which are homogeneous and entirely composed of a single material. The complex wafers are quite useful as a material for making electronic devices, since such devices make the best use of only the surface of the wafers.

The chemical vapor phase deposition (CVD) enables this invention to make large sized complex wafers on wide substrate wafers. Supply of large-sized wafers reduces the cost of producing devices by the wafer process.

The wafers of the present invention, however, are deformed by the difference of the thermal expansion between the substrate and the film. Conventional polishing machines are commonly understood as being effective only to polish flat objects but are entirely ineffective to polish distorted objects.

The Inventors disagree with this common understanding. A flat wafer is rather difficult to polish. Convex-distorted wafers with a distortion ranging from −150 μm to −2 μm can uniformly be polished by a polishing machine with a holder which rotates with swaying motion or precession motion. Concave-distorted wafers can be also polished by inserting a convex spacer between the buffer and the wafer.

One of the important matters of this invention is the discovery of the possibility of polishing of deformed objects, which allows this invention to make mirror wafers of hard material for the first time. The machine which this invention adopts polishes a convex-distorted wafer from the center to the periphery or vice versa by inclining the holder gradually until the entire convex surface is fully polished to a roughness less than Rmax 50 nm and Ra 20 nm, which enables photolithograpy to make various devices on the hard-material wafer.

A hard-material coated wafer is likely to bend in a convex shape or in a concave shape because of the difference of thermal expansion coefficients between the substrate and the hard-material film. Even when a complex wafer is immune from the distortion as a whole, the wafer has waves. In any cases, complex wafers are not flat in a rigorous meaning. Conventional machines could not polish all the surfaces without leaving unpolished portions.

This invention succeeds in polishing the whole surface of a complex wafer without leaving unpolished parts by attaching the wafer in convex-distortion to a holder, rotating the holder on a rotary turn-table and giving the holder a swaying motion or a precession which enables all the parts on the surface to come into contact with the turn-table. The polished part has a sufficient smoothness of less than Rmax 50 nm and Ra 20 nm. The present invention can suppress the fluctuation of the film thickness within ±10%.

A two-layered version film is also proposed for reducing the fluctuation of thickness of the polished film. This version coats the substrate with a polishing-difficult layer first until a definite thickness on the polishing difficult layer is formed and then deposits a polishing-easy layer. When the two-layered wafer is polished, the softer top layer is perfectly polished and the harder undercoat is revealed overall. Thus, the distribution of the thickness becomes uniform in the whole of the surface.

Big bulk crystals of hard material, that is, diamond, diamond-like carbon and c-BN cannot be grown by the present state of technology. Films of the hard materials can be synthesized by the vapor phase deposition methods. However, it takes a very long time and large financial expenditures to make a homogeneous wafer which contains no other material than the object hard material by growing a thick hard-material film on a substrate and eliminating the substrate. On the other hand, a complex wafer having a thin hard-material film is sufficient as a material for applications such as semiconductor devices, optical devices or optoelectronic devices. The complex wafers must be mirror-polished for the convenience of photolithography or other wafer processes. However, complex wafers are accompanied by strong distortion due to large inner stress. This invention enables mirror polishing of the distorted complex wafers for the first time. This is an important invention which leads to effective applications of the hard materials to various fields of technology.

BRIEF DESCRIPTION OF THE DRAWINGS

FIG. 3 is a sectional view of a base wafer as a substrate, which is suitable for practicing the first step of a process for making a hard material film and forming electrodes on the film according to an embodiment of the present invention.

FIG. 4 is a sectional view of the base wafer and a rugged hard material film deposited on the wafer which bends convexly.

FIG. 5 is a sectional view of the convex-distorted complex wafer having a smooth film which has been polished.

FIG. 6 is a sectional view of the convex-distorted complex wafer with the base wafer and the hard material film on which an aluminum film has been evaporated.

FIG. 7 is a sectional view of the complex wafer having the base wafer and the hard material film on which aluminum interdigital electrodes are made by selectively etching the aluminum of FIG. 6.

FIG. 25 is simplified sectional view of the wafer, the auxiliary shaft and the main shaft explaining the outward displacement of the contact region of the wafer in accordance with an increase in the force applied on the auxiliary shaft.

DETAILED DESCRIPTION OF THE PREFERRED EMBODIMENTS

Figure 1:
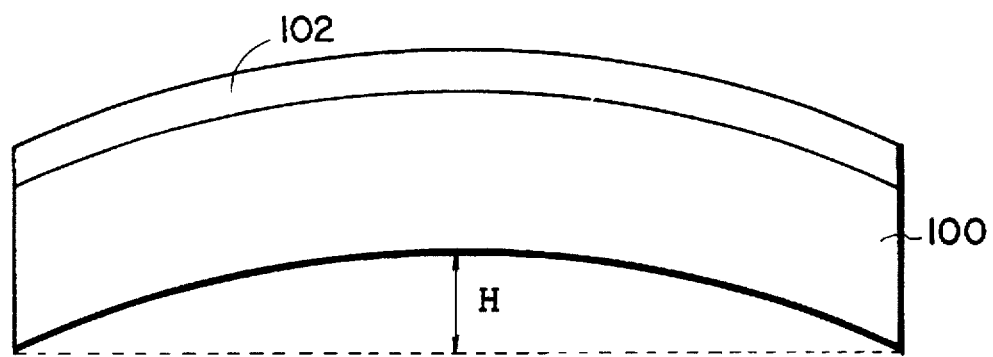
FIG. 1 is a sectional view of a convex-bending complex wafer having a substrate and a hard material film coated on the substrate.
Figure 2:
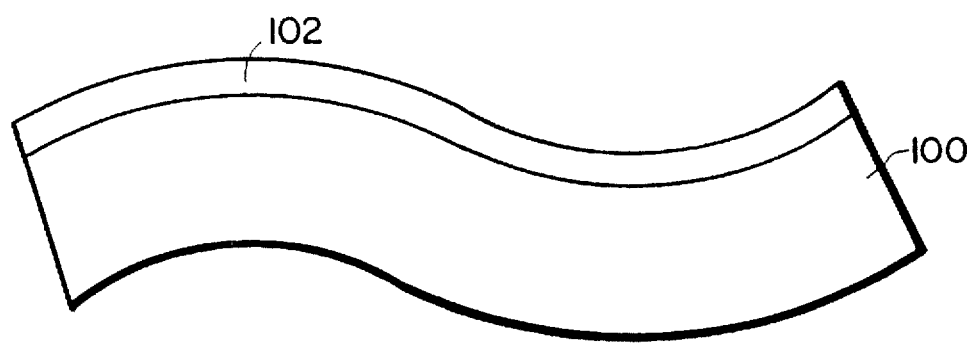
FIG. 2 is a sectional view of a macroscopically non-bending complex wafer which has a convex bending portion and a concave-bending portion defining a wave, since the distortion is defined by the height of the center from a plane including the periphery of the wafer.

FIG. 3 to FIG. 7 show the steps of an experiment of making a hard material film, e.g., diamond, c-BN or diamond-like carbon on a substrate, polishing the film, coating the film with a metal layer, forming electrodes by etching and inspecting how many wire patterns are broken. Table 1 indicates the conditions of forming a film, that is, the kind of a substrate, thickness of the substrate, diameter of the substrate, the kind of hard material, thickness of the film, of samples *1* to *12*. For avoiding citation of all hard materials and in the interest of brevity, the hard materials are represented by diamond in these samples.

At the first step, a flat free-standing circular base wafer is prepared as a substrate 100 which is indicated in FIG. 3. At the second step, a rough diamond film 102 is deposited on the base wafer substrate by the microwave plasma CVD method, the filament CVD method, the plasma jet CVD method or the plasma flame method. The reaction pressure is 1 Torr (133 Pa) to 300 Torr (0.04 MPa). The ratio of methane to hydrogen ($CH_4/H_2$) is 0.1 vol % to 10 vol %. A diamond film with a rugged surface is grown on the substrate wafer which is shown in FIG. 4. This is a complex wafer having a substrate wafer and a film. The distortion of the complex wafer is due to the inner stress which originates from the difference in the thermal expansions between the substrate and the film.

At the third step, the rugged surface of the diamond film 102 is polished by a mechanical polisher. Since the wafer is distorted, some contrivance is necessary for the polisher to polish such a bending wafer. The contrivance will be described later. Convexes and concaves are eliminated from the film surface. FIG. 5 shows the section of the complex wafer. The film becomes smooth. However, the distortion remains.

Then an aluminum film 104 is deposited on the hard-material film by evaporation or sputtering. FIG. 6 denotes a sectional view of the complex wafer after the fourth step. Micro wire patterns, or Al electrodes 106, are produced by etching parts of the aluminum film selectively by photolithography. The wires are parallel with each other. The line width of the wires is changed in a range from 0.6 μm to 2 μm. A sectional view of the wafer is shown in FIG. 7. The diamond wafer has parallel micro wire patterns. The size of the wires is similar to the size of the interdigital electrodes of SAWs. These steps were followed in preparing each sample wafer. Then the yield against the breaking of wire patters was investigated. The results are listed in table 1, table 2 and table 3. The Young modulus of the diamond films were measured by the vibration lead method. The result is also noted in table 3.

TABLE 1

Substrate, substrate thickness, substrate diameter, kinds of hard material and film thickness

| No substrate | substrate thickness (mm) | substrate diameter (inch) | hard material (CVD-method) | film thickness (μm) |
| --- | --- | --- | --- | --- |
| 1 Si (100) | 1 | 2 | diamond | 30 |
| 2 Si (111) | 1 | 4 | diamond | 50 |
| 3 Si (poly) | 0.35 | 8 | diamond | 100 |
| 4 GaAs | 0.1 | 1 | diamond | 15 |
| 5 AlN | 0.8 | 3 | diamond like carbon | 5 |
| 6 LiNbO$_3$ | 0.5 | 2 | c-BN | 30 |
| 7 LiTaO$_3$ | 0.3 | 5 | diamond | 100 |
| 8 Quartz | 1 | 4 | diamond | 5 |
| 9 Si (poly) | 0.05 | 2 | diamond | 150 |
| 10 Si (100) | 1 | 8 | diamond | 2 |
| 11 LiNbO$_3$ | 3 | 0.5 | diamond | 1000 |
| 12 GaAs | 0.5 | 3 | c-BN | 30 |

Samples *1* to *8* are embodiments of the present invention. Samples *9* to *12* are comparison examples. The thickness of the substrate is indicated in millimeters. The diameters of the substrates are reported in inches. The substrate of sample *1* was a (100) silicon wafer. Sample *2* had a(111) silicon wafer of a 4 inch diameter and a thickness of 1 mm. Sample *3* had a poly-silicon wafer as a substrate. Sample *4* had a GaAs wafer. Sample *5* had an AlN wafer as a substrate. The substrate of sample *6* was a LiNbO$_3$ crystal. Sample *7* had LiTaO$_3$ as a substrate.

Sample *9* for comparison had a polycrystalline silicon substrate of a 2 inch diameter and a 0.05 mm thickness. Sample *10* had a film on an 8-inch Si(100) wafer. Sample *11* had a LiNbO$_3$ substrate wafer. Sample *12* used a GaAs single crystal wafer of a 3 inch diameter.

The thicknesses of the base wafers was 0.1 mm to 1 mm for all the samples. The diameters of the base wafers ranged from 1 inch to 8 inches. The thickness of the hard-material films was measured in units of μm (micrometer). The thicknesses of the films were between 2 μm and 1000 μm. Sample *5* had a diamond-like carbon film. Sample *6* had a c-BN film. The other samples had diamond films on the substrate wafers.

Figure 8:
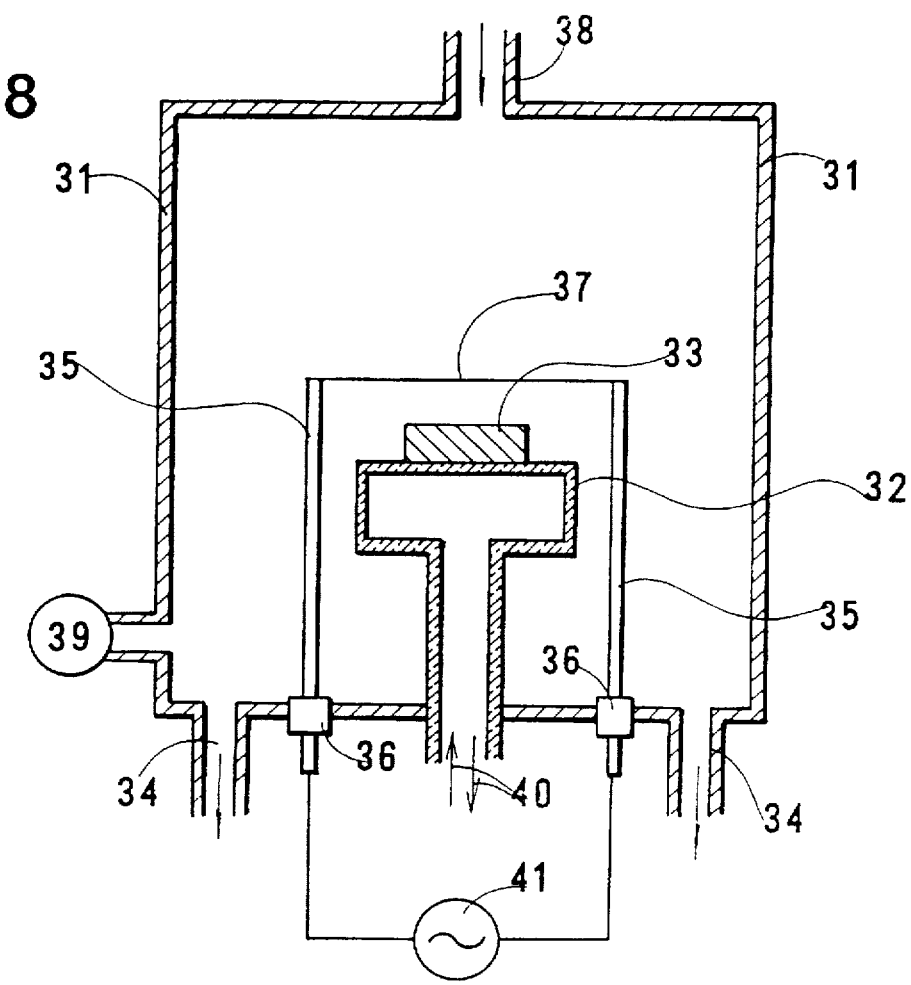
FIG. 8 is a sectional view of a filament CVD apparatus for depositing a hard material film on a substrate.

FIG. 8 indicates the schematic structure of a filament CVD apparatus for growing hard-material films on substrates by exciting a gas into plasma by heat. A vacuum chamber (31) contains a susceptor (32) for mounting a substrate wafer (33) on it. The chamber(31) has a gas exhaust outlet (34) which connects to a vacuum pump (not shown in the figure). Electrodes (35) are supported from the bottom of the chamber (31), sandwiching the susceptor (32). Filaments (37) span the susceptor (32) between the electrodes (35). A material gas including hydrogen gas and a hydrocarbon gas is supplied into the reaction chamber (31) through a gas inlet (38). A vacuum gauge (39) is installed at a point in the vacuum chamber (31). A power source (41) supplies a current to the filaments (37) through the electrodes (35). The current generates heat at the filaments (37). The filament (37) heats the substrate wafer (33) and the material gas. A cooling medium (40) circulates in the inner space of the susceptor (32) for cooling the susceptor and maintains the base wafer (33) at an acceptable temperature. The heat from the filaments (37) excites the material gas and induces a vapor phase reaction. The results of the reaction pile on the heated substrate wafer (33) and form a thin film on the wafer (33).

Figure 9:
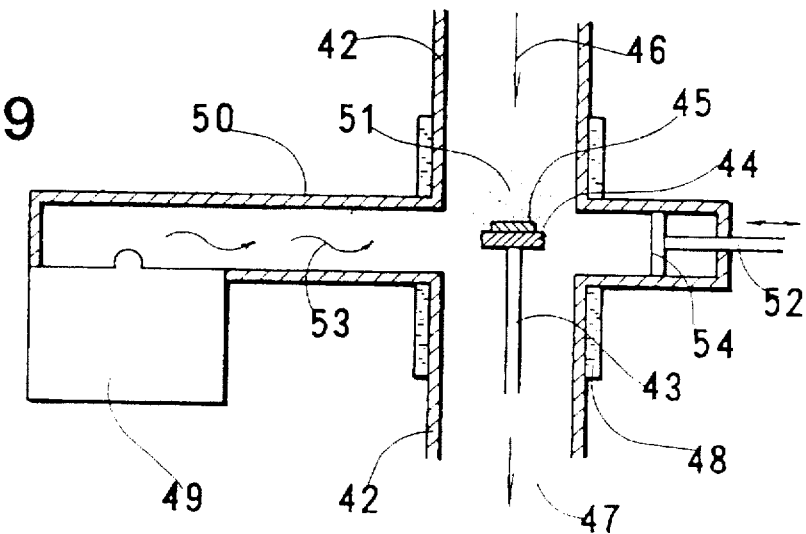
FIG. 9 is a sectional view of a microwave plasma CVD apparatus for producing a hard material film on a substrate.

FIG. 9 shows the schematic sectional view of a microwave CVD apparatus which excites a gas into plasma by microwaves. The apparatus has a vertically long chamber (42), a susceptor (44) and microwave devices. The chamber (42) is supplied with a material gas which flows from the top to the bottom of the chamber (42). A supporting shaft (43) stands in the chamber (42). The supporting shaft (43) sustains a susceptor (44) at the top thereof. A sample base wafer is laid on the susceptor (44). The material gas which is introduced into the chamber from the top passes in the vicinity of the substrate wafer (45) and goes out of the chamber through an exhaust outlet (not shown in the figure). The parts in which plasma is generated are cooled by a cooling device (48). A magnetron (49) oscillates microwaves. The microwaves propagate in a horizontally long wave-guide (50), transversely pass the flow of the material gas, and excite the gas into plasma (51). A resonance plate (54) which is made from a conductive plate is furnished in an extra tube which faces the wave-guide (50) over the susceptor(44). A piston (52) moves the resonance plate (54) either to the right or to the left for making standing waves of a pertinent mode between the beginning end of the wave-guide and the resonance plate (54).

Figure 10:
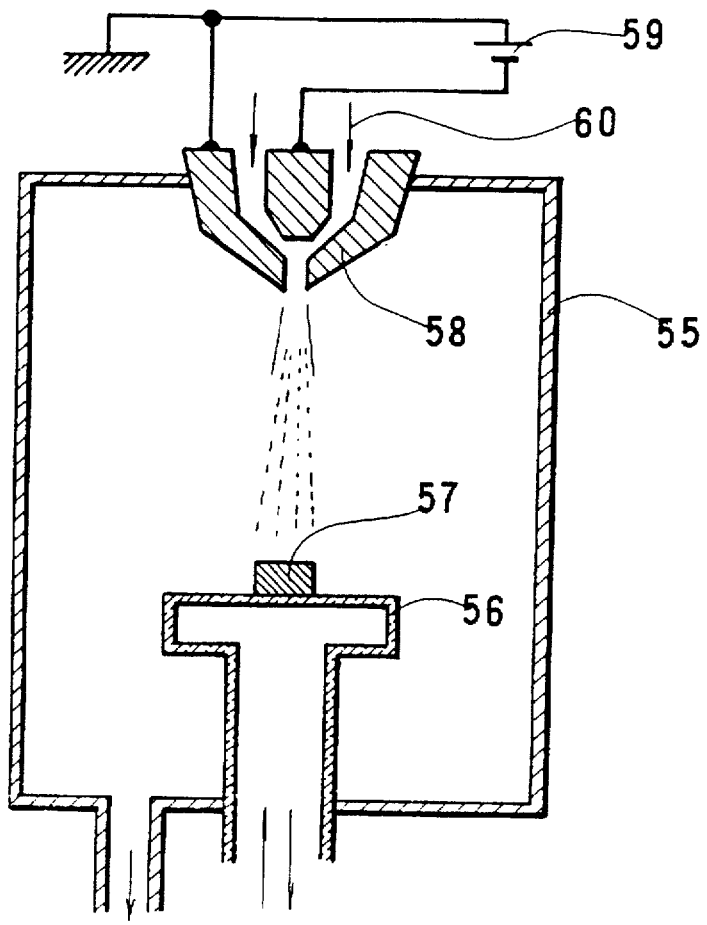
FIG. 10 is a sectional view of a plasma jet CVD apparatus for synthesizing a hard material film on a substrate.

FIG. 10 designates a schematic sectional view of a plasma jet CVD apparatus which excites a gas into plasma by DC arc discharge. A reaction chamber (55) has a susceptor (56) in the middle. The susceptor (56) holds a sample wafer substrate (57) on it. A plasma torch (58) is mounted at the top of the reaction chamber (55). The plasma torch (58) has an inner cathode, an outer anode and gas passageway between the cathode and the anode. Gases (40) are supplied through the passageway from outer gas cylinders into the reaction chamber (55). A power source (59) applies electric power between the cathode and the anode. An arc discharge occurs between the cathode and the anode. The DC arc discharge excites the gases into plasma. The gases are a gas for maintaining plasma, e.g., argon gas, a carrier gas, e.g., hydrogen gas, and a hydrocarbon gas, e.g., methane gas.

The apparatuses shown in FIG. 8, FIG. 9 and FIG. 10 are typical CVD apparatuses which enable a material gas to be excited and coat a substrate wafer with a hard-material film synthesized from the material gas. Thus, a diamond film, a diamond-like carbon film and a c-BN film can be formed in the apparatuses by supplying a material gas into a reaction chamber, exciting the gas by heat, microwaves, or arc discharge and depositing the result of the reaction on the sample wafer. The material gas is a mixture of hydrogen gas and hydrocarbon gas in the case of making diamond or diamond-like carbon and a mixture of hydrogen gas ($H_2$), borane ($B_2H_6$, $B_4H_{10}$, $B_5H_9$, - - - ), ammonia($NH_3$) or nitrogen ($N_2$) or so in the case of making c-BN. The films of the hard-material are produced here by the microwave plasma CVD method, the filament CVD method or the plasma jet CVD method, but other methods are also available.

The roughness Rmax and Ra of the complex wafers having a substrate and a film are measured. The roughness of a surface is defined by the difference of heights of points on the surface. A rugged surface has many small hills and small valleys. Rmax is the maximum difference between hills and valleys. Ra is the average of the differences between hills and neighboring valleys. The formation of the film generates some distortion in the wafer because of the inner stress originated from the difference of thermal expansion between the film and the substrate. Thus the distortion is also measured by the height H which, as depicted in FIG. 4 is measured from about the midpoint of an imaginary plane defined by the circumference of the wafer to the bottom surface of the substrate. Minus sign "−" means the convex-distortion on the film side. Plus sign "+" denotes the concave-distortion on the film side. The distortion height H is not the curvature of distortion. Since the distortion height is defined by the height from the center of the base plane including the circumference to the bottom surface of the substrate, a same distortion height gives different curvatures for different sizes of wafers. R denotes the radius of curvature and D indicates the diameter of the wafer. If the distortion is spherical, the parameters are correlated with each other by the equation $H=D^2/8R$. Table 2 indicates the roughness Rmax and Ra, and distortion heights H for all samples.

TABLE 2

Roughness and distortion of synthesized hard material

| | roughness after synthesis | | distortion |
|---|---|---|---|
| NO | Rmax (μm) | Ra (μm) | height H (μm) |
| 1 | 2.5 | 0.5 | −15 |
| 2 | 3.8 | 1.1 | −50 |
| 3 | 8 | 3 | −150 |
| 4 | 1 | 0.2 | −30 |
| 5 | 0.4 | 0.18 | −5 |
| 6 | 1.6 | 0.5 | −50 |
| 7 | 7 | 4.2 | −5 |
| 8 | 0.3 | 0.1 | −50 |
| 9 | 12 | 0.3 | cracks in substrate |
| 10 | 0.15 | 0.05 | +200 |

TABLE 2-continued

| | Roughness and distortion of synthesized hard material | | |
|---|---|---|---|
| | roughness after synthesis | | distortion |
| NO | Rmax (μm) | Ra (μm) | height H (μm) |
| 11 | 100 | 40 | break of substrate |
| 12 | 2.1 | 0.9 | 0 |

The values of Rmax after the synthesis are dispersed widely from 0.15 μm to 100 μm. Ra's after the film formation range from 0.05 μm to 40 μm. The distortions H distribute from +200 μm to −150 μm.

Sample *1* which had a 30 μm thick diamond film on a 2-inch Si wafer exhibited a roughness of Rmax 2.5 μm and Ra 0.5 μm. This is a smooth surface. The distortion H was −15 μm in a convex-shape on the film side.

Sample *2* which had a 4-inch Si wafer was distorted into a convex shape of H=−50 μm. Sample *3* which had a 100 μm film on a 8-inch polycrystal silicon wafer exhibited a big convex distortion H=−150 μm. Since the substrate was wide, the distortion also was big.

Sample *4* had a GaAs substrate and a 15 μm diamond film, and exhibited a moderate distortion of H=−30 μm. Sample *5* which had a thin diamond-like film on 3-inch AlN substrate exhibited a very small distortion of H=−5 μm. The surface was very smooth. The roughness was Rmax 0.4 μm and Ra 0.18 μm. Sample 6 had a 2-inch LiNbO₃ substrate and a 30 μm thick c-BN film. The roughness was Rmax 1.6 μm and Ra 0.5 μm. This is smooth enough. The distortion was H=−50 μm.

Sample *7* had a thick diamond film of 100 μm on a 5-inch LiTaO₃ substrate. The substrate was wide enough. The film was thick. The distortion was small (H=−5 μm) and the surface was rugged (Rmax 7 μm and Ra 4.2 μm).

Sample *8* employed a 4-inch quartz substrate of a thickness of 1 mm and a diamond film of a thickness of 5 μm. The surface was smooth (Rmax 0.3 μm and Ra 0.1 μm). The distortion was convex (H=−50 μm). Samples *1* to *8* are embodiments of the present invention. Samples *9* to *12* are comparison examples.

Sample *9* consisted of a thin 2-inch Si polycrystal wafer (0.05 mm=50 μm) and a thick diamond film of a 150 μm thickness. The roughness is Rmax 12 μm and Ra 0.3 μm on the diamond film. Cracks occurred in the Si substrate. Thus the distortion was not measured. The polishing was omitted for this sample, since the cracks hinder the polishing. The thinness of the substrate may cause it to break because of the strong inner stress of the thick film. Thus, too thin substrates or too thick films are inappropriate for making a complex wafer.

Sample *10* had a very wide(8-inch)(100) silicon monocrystal wafer(t=1 mm) and a very thin diamond of a 2 μm thickness. Sample *10* also was featured by the wideness of the substrate and thinness of the film. The surface was smooth enough (Rmax 0.15 μm and Ra 0.5 μm). However, the distortion was very large (H=+200μ) in a concave shape. The film was thin but the wafer too wide. Further, sample *10* exhibited a big distortion height.

Sample *11* had an extremely thick diamond film (1000 μm) on a 3 mm thick LiNbO₃ wafer. Sample *11* was characterized by the thick film and the thick substrate. The surface was very rugged with large roughness of Rmax 100 μm and Ra 40 μm. The substrate broke. Strong inner stress of the film may have destroyed the substrate. Sample *11* could not be polished. This result means too thick films are unsuitable for a complex wafer.

Sample *12* had a 3-inch GaAs wafer as a substrate and a 30 μm c-BN film on the GaAs wafer. The distortion was 0 (H=0 μm). This was a flat wafer. The non-distortion may result from the similarity of the thermal expansion coefficients between GaAs and diamond. Furthermore, the surface was smooth (Rmax 2.1 μm and Ra 0.9 μm). Thus, sample *12* appeared to be a very good complex wafer due to the flatness and the small roughness. As shown later, this expectation does not hold true.

A hard-material film grown by the vapor phase CVD method has a rugged surface with large roughness in general. Electronics devices cannot be fabricated on the rugged surface by the photolithography, because the big roughness would disturb the transcription by the light by scattering, reflecting or diffracting the light beams. Polishing is indispensable for the rugged CVD made hard films.

However, conventional polishing machines which have been used for polishing flat silicon wafers or flat gallium arsenide wafers are unable to polish a distorted wafer. Prior machines are suitable only for flat objects, since the holder is flat and the polishing turn-table is also flat. If distorted wafers are polished by the conventional machines, peripheral portions or intermediate portions are left unpolished, even if the holder presses the wafer to the turn-table with a strong force.

A special polishing machine and a new polishing method are required for treating with the inherently-distorted wafers. The Inventors have made a special polishing machine suitable for the distorted hard-material films. The hard-material films on the substrates of samples *1* to *8*, sample *10* and sample *12* have been mechanically polished by the special machine. The polishing reduces the roughness of the films and changes the distortion of the wafers. Then the roughness and the distortion are again measured for the samples after the polishing. Some samples cannot be perfectly polished because of the concave-distortion or the wavy shape. In these instances, the ratio of the polished part to the whole is also measured. The roughness is reduced by polishing. The distortion either increases or decreases by polishing. Usually, the polishing reduces the distortion.

Since the polishing method and apparatus are different from the case of polishing Si or GaAs wafers, the structure of the machine is first explained.

Figure 11:
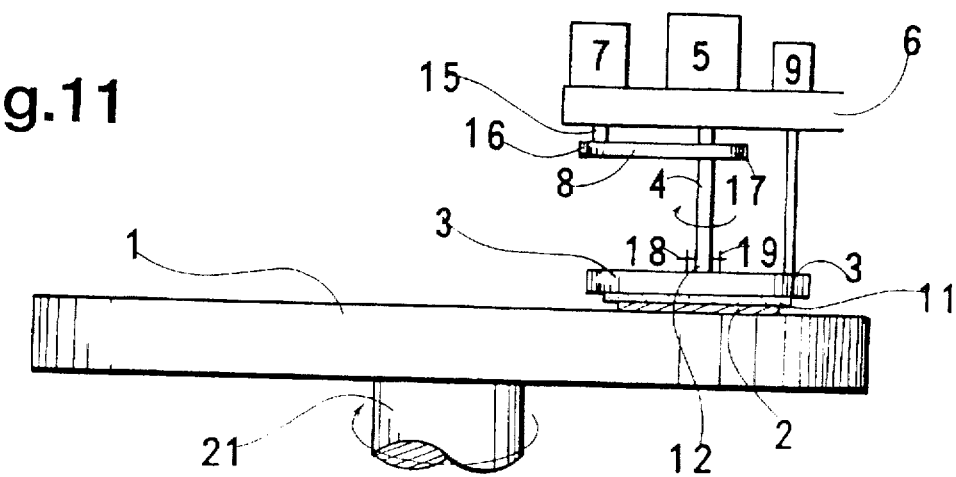
FIG. 11 is a front view of a polishing machine for polishing the surface of the hard material film according to the present invention.
Figure 12:
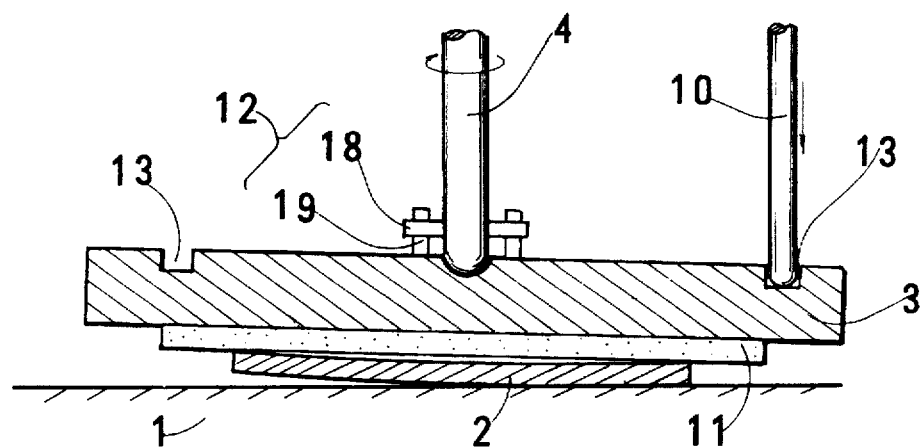
FIG. 12 is an enlarged sectional view only of the holder of the polishing machine.

FIG. 11 indicates the polishing machine which this invention adopts for the wafers having distortions. FIG. 12 is an enlarged sectional view of the holder.

A turn-table (1) is supported and driven by a rotary shaft (21). The turn-table (1)is a diamond whetstone. Since the turn-table (1) is designed for whetting hard films, the turn-table (1) must be covered with diamond powder on the surface. The diamond granules on the surface of the turn-table (1) polish the object by abrasion. It takes several tens to hundreds of hours. An elastic buffer (11) (e.g., rubber disc)is glued to the bottom of a holder (3). A complex wafer (2)is stuck to a buffer (11). A main shaft (4) is jointed to the center of the holder (3). The main shaft (4) transmits axial force (pressure) and rotation torque to the holder (3). However, the holder (3) is not fixed to the shaft (4). The shaft (4) allows the holder to incline in any direction within a certain range. The holder (3) rotates around its axis (a normal at the center), which sometimes is not aligned with the axis of the shaft (4). The angle between the axis and the shaft is called an inclination angle or a slanting angle. The turn-table (disc whetstone) (1) revolves about the rotary shaft (21).

An auxiliary shaft (10) presses a point on the holder (3). An arm (6) holds the top ends of the main shaft (4) and the auxiliary shaft (10). An oil pressure cylinder (5) is mounted on the arm (6) for applying strong pressure to the holder shaft (4). The wafer is pressed upon the diamond powder on the turn-table by the strong force from the main shaft (4). The diamond powder abrades the hard film of the wafer, thereby causing the powder to degrade. The pressure enhances the abrasion of the film as well as the degradation to the diamond powder fixed on the disc whetstone (1).

A motor (7) is mounted on the arm (6) for rotating the holder shaft (4). The torque of the motor (7) is transmitted from an output shaft (15) of the motor via a pulley (16) and a belt (8) to a pulley (17) of the main shaft (4). The shaft (4) rotates the holder (3) about its own central axis, which may not be aligned with the axis of the main shaft (4). An oil pressure cylinder (9) is mounted on the arm (6) for applying a strong force upon the auxiliary shaft (10). A circular groove (13) is defined in the upper surface of the holder (3). The bottom end of the auxiliary shaft (10) pushes the groove (13).

The main shaft (4) is connected to the holder (3) in a manner which transmits the axial force and the rotation from the main shaft to the holder but allows the relative slanting of the holder (3) to the shaft (4). The bias force of the auxiliary shaft (10) inclines the holder (3) to the turn-table (1). The inclination is represented by the inclination angle between the main shaft (4) and a normal (rotation axis) of the holder (3). The inclination angle depends upon the force of the auxiliary shaft (10). The convex-distortion of the wafer (2) facilitates a smooth inclination of the holder (3). The contact point of the wafer (2) to the turn-table (1) is varied by the inclination angle. Thus, the contact point can be controlled by allocating the forces between the main shaft (4) and the auxiliary shaft (10). The whole surface can be fully polished by moving either the contact point from the center to the periphery or from the periphery to the center of the wafer.

As explained before, a hard material coated wafer cannot be entirely polished by conventional machines which have a holder fixed to the main shaft. Some portions are left unpolished. If the wafer were treated by the conventional machine for an extremely long time, unpolished parts might be extinguished. However, if so, other parts of the film would be worn out to the point that the substrate would appear. The problems of the conventional machines are now clarified by referring to the FIG. 13 to FIG. 15. The roughness of wafers after the polishing depends on the configuration of the wafers after the synthesis.

Figure 13:
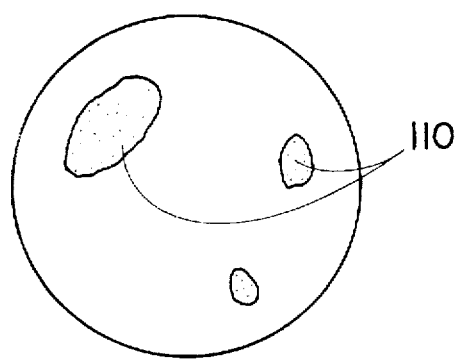
FIG. 13 is a plan view of a wafer with non-distortion which has been polished with a flat holder by the polishing apparatus. The blank region is a polished part. Dotted regions are unpolished parts.

(1) Case of a flat wafer (FIG. 13): a flat wafer after the synthesis of the film is not perfectly polished into a flat mirror wafer. The flat wafer suffers from randomly distributed unpolished parts 110. FIG. 13 indicates the dispersion of the unpolished portions. The unpolished parts are rugged and seem to be dull, since light is scattered randomly and is reflected weakly. A visual observation can easily distinguish unpolished parts from the background polished portion. Thus a flat wafer when it is synthesized is unsuitable for polishing. This is an unexpected result.

Figure 14:
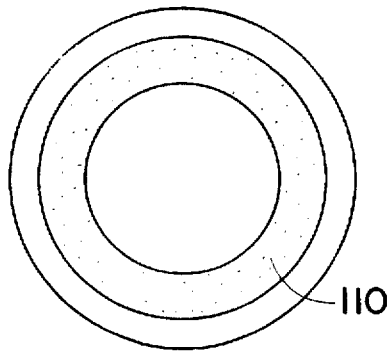
FIG. 14 is a plan view of wafer of a concave-distorted film which has been polished with a flat holder by the polishing machine.

(2) Case of a concave-distorted wafer (FIG. 14; H>0): The central part and the periphery are polished. A ring-shape unpolished part 110 is left unpolished in the intermediate region.

Figure 15:
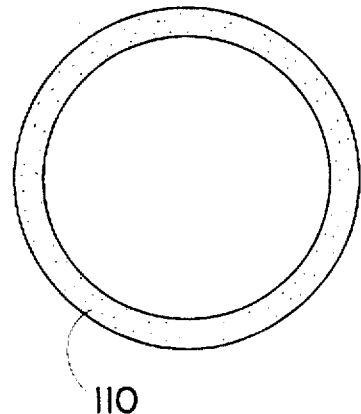
FIG. 15 is a plan view of a wafer of a convex-distorted film which has been polished with a flat holder by the polishing apparatus.
Figure 16:
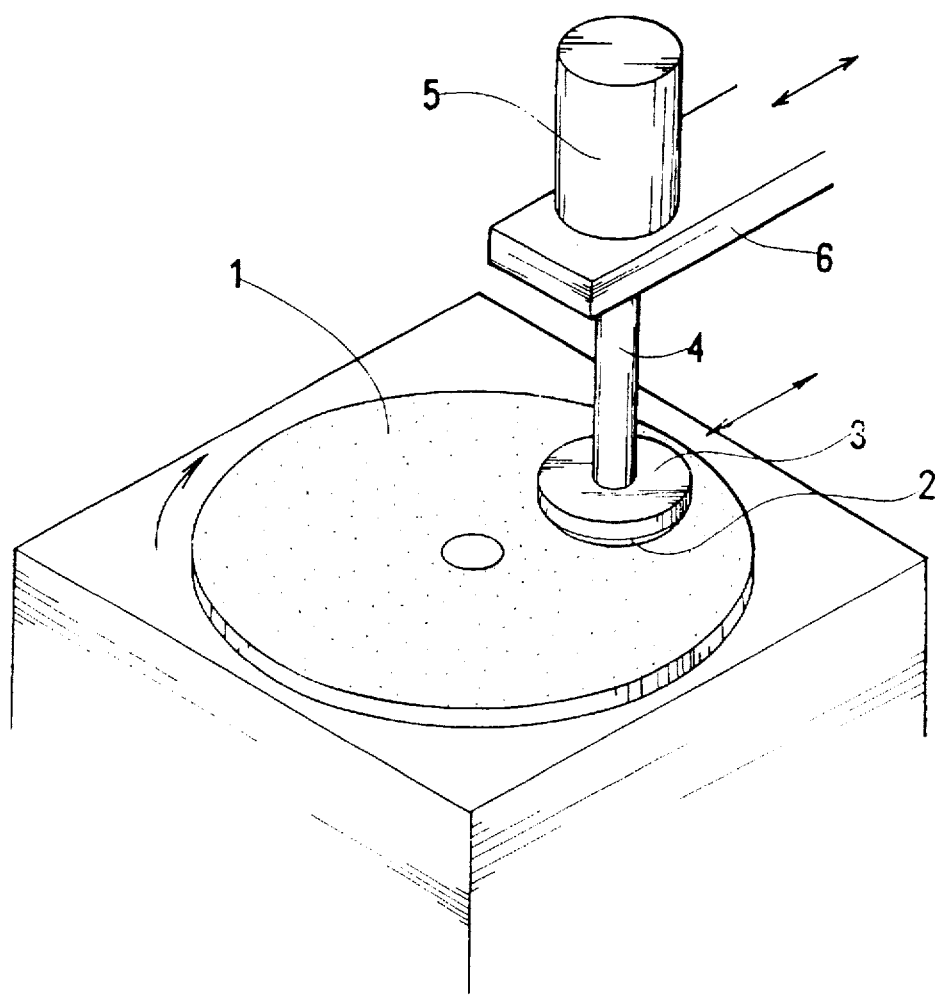
FIG. 16 is a perspective view of a conventional polishing apparatus which whets a wafer by pressing a static holder on which the wafer has been placed on a turn-table, and revolving the turn-table.

(3) Case of a convex-distorted wafer (FIG. 15; H<0): The central part and the intermediate part are polished. A periphery is left as the unpolished part 110.

As demonstrated by FIGS. 13–15, the conventional machines are incompetent for mirror-polishing hard-material wafers.

By contrast, this invention enables the whole wafer to be polished by adopting a holder capable of slanting with respect to the shaft and selecting a convex-shape wafer (H<0) to be polished. All the surface is mirror-polished by the polishing apparatus (FIG. 11 and FIG. 12) of the invention. The result of the polishing of this invention is not depicted in the figures, since the whole of surface becomes mirror-polished. Next, samples 1 to 12 were polished by the machine shown in FIG. 11 and FIG. 12. The roughness, the ratio of the polished area to the whole area and the distortion height were measured. Table 3 denotes the results of the measurement.

TABLE 3

Roughness (nm), ratio of polished parts (%), distortion (μm) of hard material wafer after polishing

| NO | roughness (nm) Rmax | roughness (nm) Ra | ratio of polished parts (%) | distortion height H' (μm) |
|---|---|---|---|---|
| 1 | 8 | 1 | 100% polished | −14 |
| 2 | 10 | 2 | 100% polished | −48 |
| 3 | 40 | 8 | 100% polished | −139 |
| 4 | 5 | 0.4 | 100% polished | −30 |
| 5 | 1 | 0.3 | 100% polished | −5 |
| 6 | 3 | 0.6 | 100% polished | −50 |
| 7 | 50 | 20 | 100% polished | −5 |
| 8 | 1 | 0.3 | 100% polished | −50 |
| 9 | not polished, since substrate was cracked. | | | |
| 10 | 70 | 25 | 50% unpolished | +200 |
| 11 | not polished, since substrate was broken. | | | |
| 12 | 100 | 40 | 10% unpolished | 0 |

(Be careful of the unit (nm) of roughness. 1000 nm = 1 μm)
Sample 9 and 11 were not polished, because of cracks or break caused in synthesis)

The roughness of the samples after polishing ranges from Rmax 1 nm to Rmax 100 nm and from Ra 0.3 nm to Ra 40 nm. It should be noted that the units of the distortion are different between the pre-polishing wafers and the post-polishing wafers. Table 2 for the pre-polishing samples uses "μm" for expressing roughness. Table 3 for the post-polishing wafers adopts "nm" for signifying roughness. FIG. 5 shows a simplified sectional view of the polished wafer.

Sample *1* had intermediate roughness before polishing; polishing reduced the roughness to Rmax 8 nm and Ra 1 nm. The distortion was −14 μm which is similar to the pre-polishing value.

Sample *2* had an intermediate value of roughness. The post-polishing roughness of sample *2* was Rmax 10 nm and Ra 2 nm. This is an intermediate roughness which enables patterns to be transcribed from masks to the resist on the wafer by photolithography. The photolithography requires roughness of less than Rmax 50 nm and Ra 20 nm. The distortion is −48 μm, which is only slightly different from the pre-polishing value (−50 μm).

Sample *3* which had big roughness before polishing exhibited a post-polishing roughness of Rmax 40 nm and Ra 8 nm. Big pre-polishing roughness invites big post-polishing roughness in general. The distortion slightly changed from −150 μm to −139 μm after polishing.

Sample *4* which had a GaAs substrate and a diamond film with a small roughness of Rmax 5 nm and Ra 0.4 nm, which is far lower than the critical values of Rmax 50 nm and Ra 20 nm. The distortion was −30 μm, which is equal to the pre-polishing value.

Sample *5* had an AlN substrate and a diamond-like carbon film with very small roughness before polishing. The roughness was reduced to Rmax 1 nm and Ra 0.3 nm. This is a quite smooth mirror-polished surface.

Sample *6* had a c-BN film. The inherent roughness was small enough (Rmax 1600 nm, Ra 500 nm). The polishing reduced the roughness to Rmax 3 nm and Ra 0.6 nm which are satisfactory values. The distortion was −50 μm both for pre-polishing and for post-polishing.

Sample *7* had a 100 μm diamond film on a LiTaO₃ substrate. A film which is too thick degenerates the surface morphology. Big pre-polishing roughness(Rmax 7000 nm, Ra 4200 nm) of this sample caused large post-polishing roughness of Rmax 50 nm and Ra 20 nm which is equal to the critical value for the application of photolithography. The distortion (−5 μm) was kept constant despite the polishing.

Sample *8* was a 4-inch quartz substrate and a thin (5 μm) diamond film. This is an inherently smooth film (Rmax 300 nm, Ra 100 nm). The polishing decreased the roughness to Rmax 1 nm and Ra 0.3 nm.

Sample *9* which had cracks on the wafer due to too thick a film could not be polished. Sample *10* had satisfactory small smoothness (Rmax 150 nm and Ra 50 nm) but concave-distortion of +200 μm before polishing. Since the roughness is inherently small, it is expected that the polishing would further reduce the roughness. But the results were otherwise. The post-polishing roughness was Rmax 70 nm and Ra 25 nm, which is beyond the scope of the application of photolithography. The polishing failed to make a smooth wafer. Furthermore, sample *10* left 50% of the film surface unpolished. Why is the polishing so inactive for sample *10* with little distortion? This is caused by the big concave-distortion. The concave-deformation prevents the concave portions from coming into contact with the turntable, despite the strong pressure applied from the main shaft. Sample *10* clarifies that the mode of distortion (H<0 or H>0) has a great influence on the polishing.

Sample *12* which included a c-BN film on a GaAs substrate had a small roughness of Rmax 2.1 μm and Ra 0.9 μm. The roughness was still Rmax 100 nm and Ra 40 nm after the polishing. 10% of the surface was left unpolished. A complex wafer of H=0 has wavy deformation with microscopic convexes or concaves. Then unpolished portions are distributed at random after the polishing.

In general, the polishing can reduce the roughness to about ¹⁄₁₀₀ to ¹⁄₃₀ of the original roughness in the case of moderate convex-distortion. The distortion H is slightly decreased to H' by the polishing, but the mode (sign of H) of distortion is maintained.

Then an aluminum film 104 is evaporated on the hard films to provide a thickness of 150 nm, as shown in FIG. 6. Comb-shaped electrodes 106 are formed on the hard films 102 by etching the Al film selectively by photolithography. FIG. 7 shows the section of the wafer. The comb-shaped electrodes are called interdigital transducers which are typical electrodes for surface acoustic wave devices (SAW). The line width of the Al electrodes is varied from 0.6 μm to 2 μm. The ruggedness of the film has a tendency of cutting the narrow wires. The yield against wire-cutting was investigated for all the samples. Table 4 lists the line width and the yield against the wire-cutting.

TABLE 4

Width and yield against wire cut of aluminum electrodes formed on hard films by evaporation and photolithography

| NO | width of aluminum electrodes (μm) | yield against wire cut (%) |
|---|---|---|
| 1 | 1 | 98% |
| 2 | 0.8 | 96% |
| 3 | 1.2 | 97% |
| 4 | 1.5 | 95% |
| 5 | 0.6 | 94% |
| 6 | 1 | 99% |
| 7 | 0.8 | 94% |
| 8 | 2 | 97% |
| 9 | Polishing and electrode-formation were impossible due to cracks occurring in synthesis. | |
| 10 | 1 | 3% |
| 11 | Polishing and electrode-formation were impossible due to break of wafer in synthesis. | |
| 12 | 0.6 | 15% |

Sample *1* having a 30 μm thick diamond film on a 2-inch (100) Si wafer exhibited a yield of 98% for the electrode pattern of a 1 μm line width. This is a satisfactory yield.

Sample *2* having a 50 μm diamond film on a 4-inch (111) Si wafer exhibited a yield of 96% for the electrodes of a line width of 0.8 μm. This result shows the possibility of making submicron wiring patterns with sufficiently high yield.

Sample *3* having a 100 μm diamond film on a 8-inch polysilicon wafer displayed a yield of 97% for the electrode pattern of a 1.2 μm line width. This is a satisfactory result.

Sample *4* having a 1-inch GaAs wafer and a 15 μm diamond film displayed a yield of 95% for the electrode pattern of a 1.5 μm line width.

Sample *5* having a 3-inch AlN wafer covered with a 5 μm diamond-like carbon film exhibited a good distortion (H=−5 μm) and an excellent smoothness of Rmax 1 nm and Ra 0.3 nm. The yield of producing an interdigital electrode of a 0.6 μm line width was 94%. This was the narrowest electrode among the samples. This result is astonishing for such a narrow line width.

Sample *6* having a 30 μm c-BN film on a 2-inch LiNbO₃ substrate with a distortion of −50 μm exhibited a yield of 99% for making an interdigital electrode of a 1 μm line width. This result indicates such a big distortion allows narrow wiring patterns to be formed on the film. Further, this sample denotes the possibility of producing a good wafer also from c-BN.

Sample *7* having a 100 μm thick diamond film on a 5-inch LiTaO₃ substrate had a poor smoothness of Rmax 50 nm and Ra 20 nm. The yield of making 0.8 μm line width electrode patterns, however, was 94%. This is a satisfactory result.

Sample *8* which consisted of a 4-inch quartz substrate and a 5 μm diamond film had a good smoothness but a big distortion of −50 μm. When comb-shaped electrodes of 2 μm wide lines were fabricated on the film, the yield was 97% despite of a considerably big distortion of −50 μm.

All these embodiments exhibit a high yield of more than 90%. Namely, the embodiments are immune from the break-down of lines. This is because the films have a smooth surface without convex and concave imperfections. Furthermore, all the embodiments leave no unpolished parts. 100% of the surface is perfectly polished for all the embodiments. This means that good SAW devices can be produced from the complex wafers of this invention with a high yield. Since the complex wafers allow narrow electrode patterns to be made, various devices can be produced from the hard-material wafer of this invention by the photolithography technique, when the substrate wafers are similar to those used in semiconductor devices.

Sample *9*, a comparison example, could not be polished, because the substrate was cracked during the synthesis. Sample *11* also could not be polished, since it had been broken during the synthesis.

Sample *10* having a 2 μm diamond film on a 8-inch (100) Si wafer exhibited a superb smoothness just after the film formation. But sample *10* had a poor smoothness of Rmax 70 nm and Ra 25 nm after polishing. 50% of the surface was left unpolished. The poor property perhaps derives from the big concave-distortion of +200 μm. When the interdigital electrodes were formed on the polished part, the yield was only 3%. Namely, sample *10* was unsuitable to form electrode paterns. This was caused by the concave-distortion and by the imperfection of the polishing.

Sample *12* having a 30 μm c-BN film on a 3-inch GaAs wafer exhibited no-distortion. Although the distortion was zero, it had a wavy deformation. Sample *12* cannot be polished smooth because of the wavy deformation. Sample *12* suffered a poor post-polishing roughness of a Rmax 100 nm and Ra 40 nm. 10% of the surface was left unpolished. The yield was 15%, when an electrode pattern of 0.6 μm width was produced on the polished part. This is beyond a practical utility. This poor yield results from the difficulty of polishing.

Figure 17:
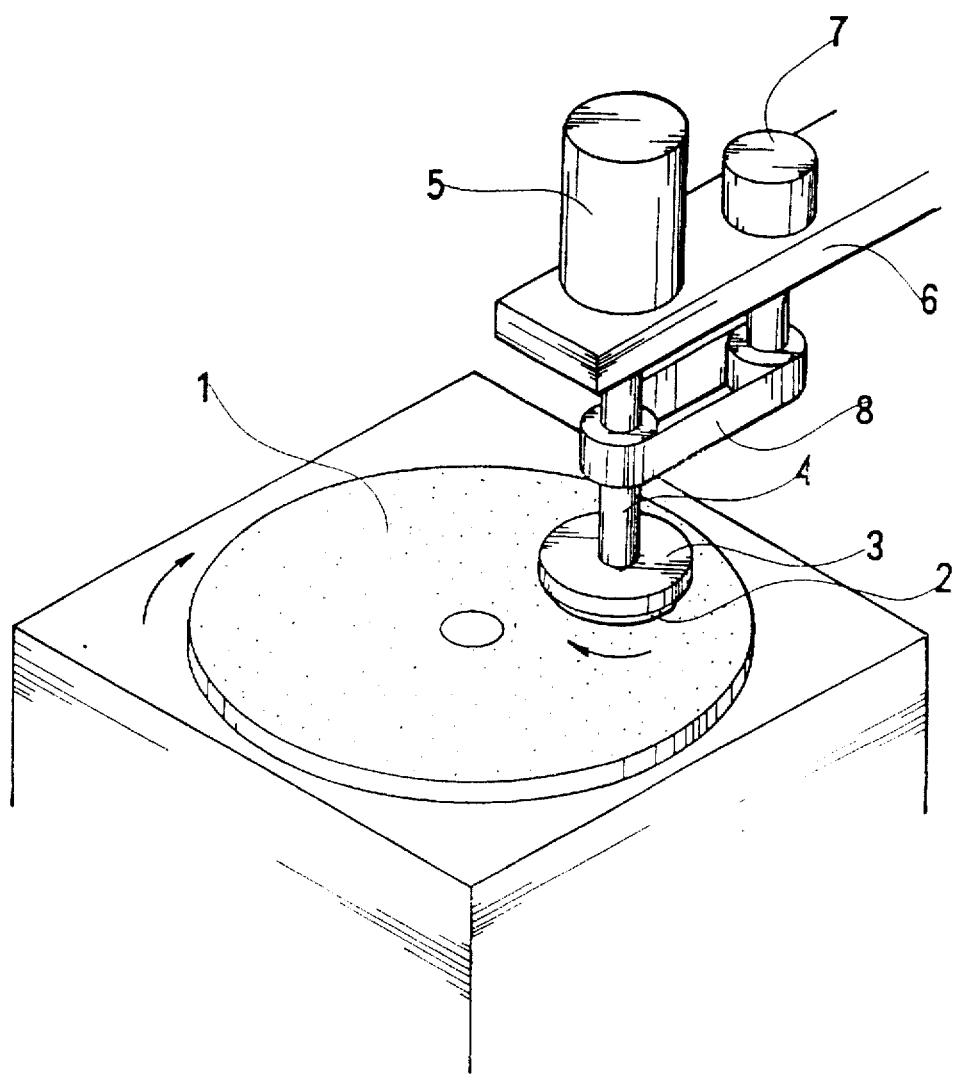
FIG. 17 is a perspective view of another conventional polishing machine which whets a wafer by pressing a rotary holder having the wafer on the bottom onto a turn-table, rotating the holder and revolving the turn-table.
Figure 18:
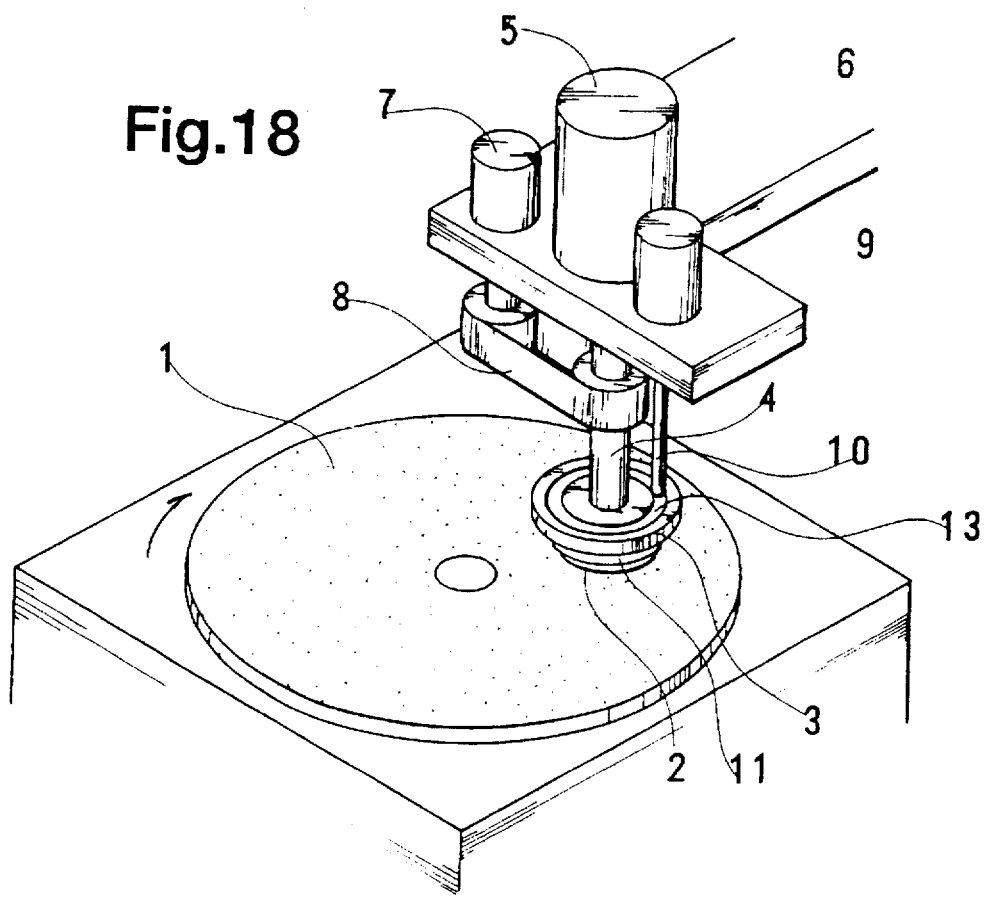
FIG. 18 is a perspective view of an apparatus of the present invention for polishing a wafer by pressing a rotary holder having the wafer on a turn-table, rotating the holder, revolving the turn-table and inclining the holder by a precession or swaying motion.

FIG. 18 shows the perspective view of another embodiment of the polishing apparatus of the present invention. This is similar to the apparatus shown in FIG. 11 and FIG. 12. This apparatus, however, can be applied also to a concave-distorted wafer having a positive H in addition to the convex-distorted wafers. The concave-distorted wafer can be reformed into a convex-distorted wafer by a convex-shape spacer. This apparatus comprises a revolving turn-table, and a rotating holder holding an object wafer which is in contact with the turn-table. What is conspicuously different from the apparatus of FIG. 17 is the precession or the swaying of the holder.

The turn-table (1) is a rotary, circular diamond whetstone having a diamond granules on the surface. The turn-table can be built by any one of resin-bonded diamond whetstones, metal-bonded diamond whetstones, electrode-posited whetstones, small diamond pellet whetstones or diamond pellet whetstones. The turn-table (1) revolves around its rotary shaft. The holder (3) is a smaller rotary, circular tool having a main shaft (4) at the center of the upper surface. A hard-material coated wafer (2) in the convex-distorted state is stuck to the bottom of the holder (3) via a buffer (11). The main shaft (4) gives the holder (3) pressure and torque, allowing the holder (3) to incline within some range of slating angles. The holder (3) is pushed downward and is rotated by the shaft (4). But the shaft (4) does not hinder the inclination of the holder (3). The shaft (4) is not always perpendicular to the holder (3). This is important.

The buffer (11) is produced with rubber, plastics or other elastic material. The buffer (11) has two roles. One is alleviating the strong pressure from the heavy load for protecting the wafer (2) from breaking. The other role is absorbing the anisotropic pressure which accompanies the precession of the holder to the shaft. Namely the buffer facilitates the precession of the holder (3) to the shaft (4) by the elastic deformation for equalizing the pressure acting on the wafer.

A driving device is installed above the shaft (4). The driving device includes bearings and a joint (not shown in the figures) which support the shaft (4) rotatably with some pressure. A pulley is fitted on a lower rotary part of the shaft (4) than the joint. A cylinder (5) is mounted above the joint for applying strong force on the shaft. A large weight is required for polishing a hard-material coated wafer. The cylinder (5) provides this large weight on the holder. The cylinder applies concentrated load to the center of the holder (3). The cylinder (5) is, e.g., an oil pressure cylinder or an air pressure cylinder.

A horizontally-extending arm (6) supports the cylinder (5) and the shaft (4). A motor (7) is furnishes upon the arm (6). The rotation of the motor (7) is transmitted via a motor pulley, belt (8) and shaft pulley to the shaft (4). The shaft rotates the holder (3) and the hard-material coated wafer (2). The holder (3) rotates around its own shaft (4). The turn-table (1) revolves around its rotary shaft, depicting a bigger circle.

Figure 19:
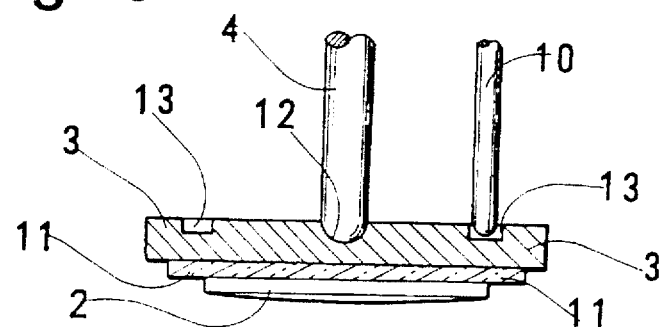
FIG. 19 is a sectional view of the shaft and the holder of the apparatus of the present invention.

FIG. 19 indicates a sectional view of the holder, the main shaft (4) and an auxiliary shaft (10). The shaft (4) is connected by a flexible joint (12) to the holder (3). The flexible joint (12) transmits the axial pressure and the rotation to the holder (3) but allows the holder to slant. The contact between the bottom of the shaft and the holder is made, for example, by a spherical surface enabling the shaft to incline. However the shaft and the holder have some device for transmitting rotation, for example, radial pins and holes in the embodiment in FIG. 18. Besides the torque, the shaft (4) applies the concentrated weight to the center of the holder (3).

Figure 20:
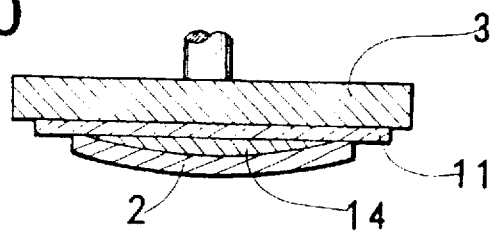
FIG. 20 is a sectional view of the holder which keeps the wafer in the convex-distorted state by fixing the wafer via a convex spacer to the bottom of the holder.

FIG. 20 shows the state of the holder having a wafer on the bottom. An elastic buffer (11) is glued to the bottom of the holder (3). Then a convex spacer (14) is disposed below the buffer (11). The wafer (2) is attached to the center of the holder (3) in the convex-distorted state via the convex spacer (14) and the buffer (11). Some wafers are initially convex-distorted. Other wafers are initially concave-distorted. The rest are flat. A flat wafer or a concave-distorted wafer is corrected into convex-distortion by inserting the convex spacer (14), as shown in FIG. 20. A convex-distorted wafer can dispense with the spacer. The convex-distorted wafer can be directly glued to the buffer (11) in this case, as shown in FIG. 19. Of course, the insertion of the convex spacer is useful even for an originally convex-distorted wafer, since the spacer settles the convex state of the wafer. Conventional methods stick a flat object to a holder, keeping the parallel-ism between the bottom of the object and the surface of the holder. Unlike conventional methods, this invention fixes the wafer on the holder in the convex-distortion configuration.

What is important is the precession or the swaying motion of the holder (3) to the shaft (4) in which the angle between tho shaft and the holder deviates from a right angle. The precession is similar to the motion of a top. The axis of a rotating matter also rotates to define an inverted cone in the precession. The precession of the holder means that the normal of the holder rotates on an inverted cone. A normal is defined for indicating a direction of a plane as a line which is perpendicular to the object plane. The shaft is always kept perpendicular to the turn-table. The holder freely slants to the shaft. Then the axis of rotation of the holder is not equal to the shaft. The axis of rotation is identical to the normal defined at the center of the holder. In the precession, the inclination angle between the shaft and the axis is always constant and equal to a half of the top angle of the cone.

The swaying motion means that the axis of a rotating matter oscillates in a vertical plane within a certain range. Then the slanting angle between the shaft and the rotation axis oscillates with a certain amplitude. Rotating around the own axis, the holder (3) changes the slanting angle $\Phi$ in the swaying motion.

Namely the swaying movement includes two kinds of rotation of the holder. A three-dimensional coordinate is now defined for the convenience of explanation. An origin is the center of the turn-table. Z-axis is the direction of the main shaft of the holder or the shaft of the turn-table. X-axis is the radial direction which connects the center of the turn-table to the center of the holder. Y-axis is in parallel with the tangential direction at the center of the holder. One kind of the rotation is the normal rotation around the shaft (or around Z-axis). The other is the reciprocal partial rotation (or oscillation) of the holder around Y-axis (tangential direction).

The aforementioned flexible joint allows the rotation of the holder around Y-axis. The flexible joint transmits the pressure from the cylinder (5). However the flexible joint either transmits the rotation torque or does not transmit the torque to the holder in general.

In the latter case, the apparatus has no motor for driving the holder and allows the free rotation to the holder. The holder is rotated by the difference of the line velocities of the turn-table between the inner region and the outer region. This rotation is induced by the revolution of the turn-table. In this case, the flexible joint need not transmit the rotation torque.

In the former case, the apparatus has a motor which rotates the holder positively. In this case, the rotation torque is transmitted by the flexible joint. FIG. 18 indicates such an example having the motor. Of course, this invention is applicable both two cases.

The sway of the holder is allowed partly because the wafer has been fixed on the bottom of the holder in the convex state. But the convex-wafer is only one of the conditions required for the sway of the holder. The other more important condition is a device which positively sways the holder. Examples of the swaying device are explained.

An auxiliary shaft (10) which can reciprocate up and down is installed on the arm (6) for inducing the swaying motion of the holder, as shown in FIG. 18 and FIG. 19. A pressure cylinder (9) pushes down or lifts up the auxiliary shaft (10) periodically. The auxiliary shaft (10) extends downward in the vertical direction to the top surface of the holder (3). The bottom of the auxiliary shaft (10) pushes a circular groove dug on the holder (3). The rotary shaft of the turn-table, the main shaft of the holder and the auxiliary shaft need not necessarily align in a vertical plane. The reciprocal motion of the auxiliary shaft (10) lifts up and presses down the peripheral point of the holder (3). Thus the holder (3) makes a swaying motion whose amplitude is determined by the stroke of the auxiliary shaft (10).

Figure 24:
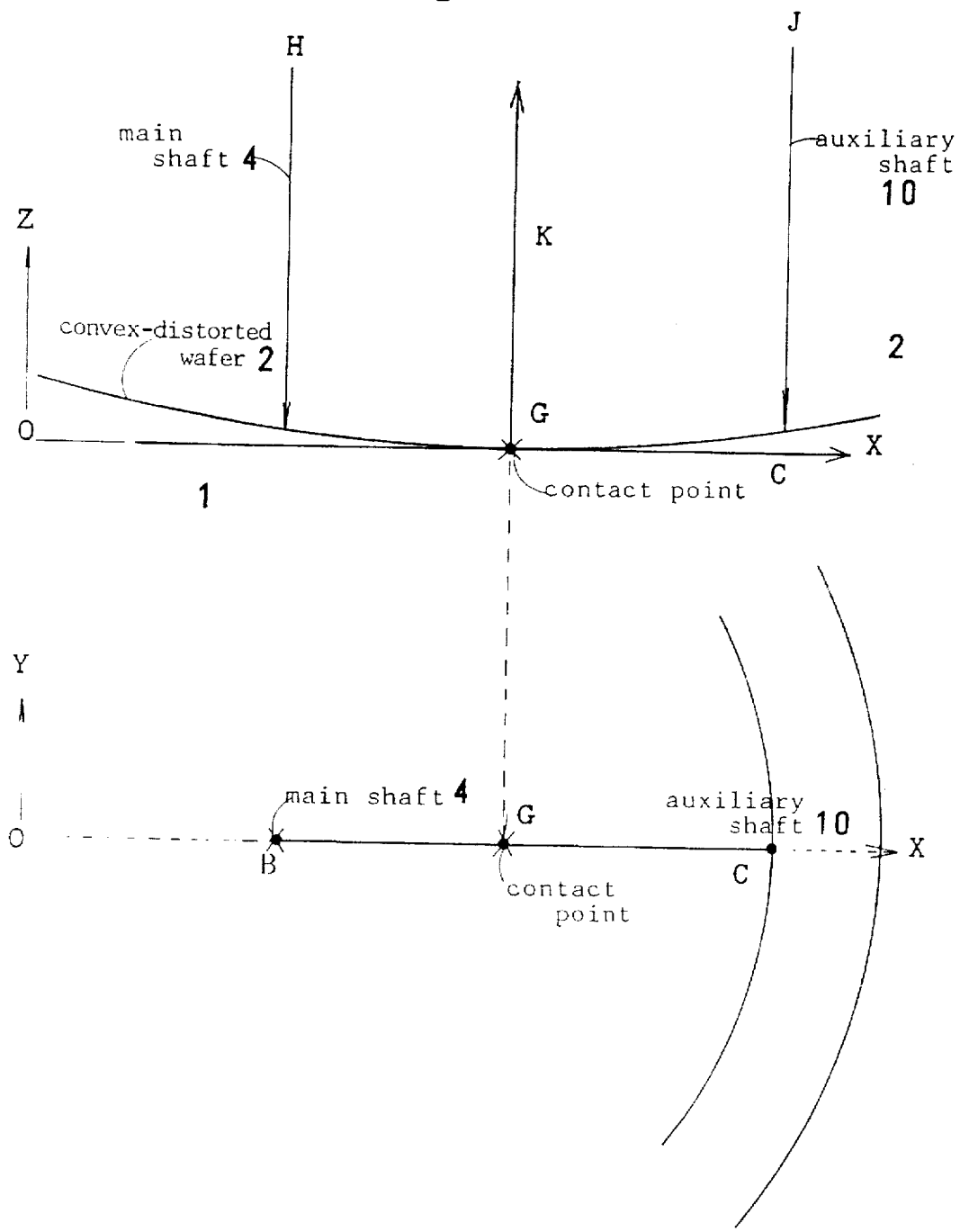
FIG. 24 is a simplified sectional view and a plan view of the wafer, the auxiliary shaft and the main shaft explaining the determination of the contact position of the wafer on the turn-table as a function of the forces applied on the auxiliary shaft and the main shaft.

The number of the auxiliary shafts is arbitrarily determined. FIG. 18 indicates an example of a single auxiliary shaft. Even a single auxiliary shaft can induce the reciprocal swaying motion of the holder. The reason why the single auxiliary shaft can sway the holder is that the wafer has been glued on the bottom of the holder in the convex-distortion which allows the slanting of the holder. The mechanics are now clarified more in detail. The three-dimensional coordinate which has been adopted previously is used for the explanation. Z-axis is the upward direction of the shaft of the turn-table. X-axis is the radial direction which is drawn from the center of the turn-table to the center of the holder. Y-axis is the tangential direction at the center of the holder. For simplifying the explanation, the shaft of the turn-table, the main shaft of the holder and the auxiliary shaft(10) are assumed to be aligned in a single plumb plane. This assumption does not impair the generality of the action of the auxiliary shaft (10) for inducing the swaying motion of the holder (10). FIG. 24 signifies the geometric relations among the center (0) of the turn-table (1), the center (B) of the main shaft (4) and the center (C) of the auxiliary shaft (10). G is the center of the contact region of the wafer on the turn-table. Points 0, B, G and C align along X-axis.

Point B of the main shaft is denoted by B(b,0,0). Point C of the auxiliary shaft is denoted by C(c,0,0). The circular groove (13) has been dug on the periphery of the holder. The radius (f) of the groove (13) is c-b (f=c-b). The foot of the auxiliary shaft (10) glides on the groove (13). The holder (3) rotates but the auxiliary shaft (10) does not rotate. The auxiliary shaft reciprocates in the plumb direction (Z-axis)in a small amplitude by the cylinder (9). When the auxiliary shaft (10) sinks, the left of the holder (3) descends and the right of the holder ascends. When the auxiliary shaft (10) rises, the left of the holder (3) ascends and the right descends. These movements are only a swaying movement in ZX-plane. When the auxiliary shaft reciprocates, the holder oscillates in ZX-plane. Namely the normal of the holder is simply oscillating in ZX-plane.

FIG. 25 indicates the change of the contact point. The surface of the wafer is now assumed to be spherical. The wafer is in contact with the turn-table at point G. In practice, the turn-table and the wafer deform. The contact region become some definite area. Then point (G) should be considered as the center of the contact region. Then the coordinate of point G(g,0,0) is now determined by the balance of the forces.

H is the force applied on the main shaft. J is the force acting on the auxiliary shaft. K is the counter force at point G. The balances of the forces and the torque give two equations $$H+J=K, \quad Hb-Kg+cJ=0$$

The solution of the equations is $$g=(Hb+Jc)/(H+J).$$

This answer which determines the position of point G is valid irrespective of the curvature of the wafer, the singularity of the curve, the elastic coefficient of the turn-table, and the friction coefficient between the turn-table and the wafer. When J=0, point G coincides with point B. As J becomes bigger, point G displaces from point B toward point C. The convex-distortion is one of requisites for the displacement of point G. The convex-distortion is satisfactory for allowing the smooth displacement of point G. The position of point G is uniquely determined by the ratio of the forces acting upon the shafts (4) and (10). When point G coincides with point b, only the narrow central part of the wafer is polished. However when point G deviates from point B, the contact point depicts a circle as a locus, since the holder rotates. Thus the contact region becomes a circular band with a definite breadth.

FIG. 25 signifies the relation between the slanting angle Φ of the wafer and the contact point as functions of the ratio of forces acting on the shafts. *1* of FIG. 25 shows the case of J=0. The wafer is horizontal and Φ is 0. Contact point G1 is point B. *2* of FIG. 25 denotes a small inclination of the wafer with a small Φ induced by a small force J on the auxiliary shaft. Contact point G2 deviates from point B. *3* shows further inclination of the wafer caused by an increase of force J. Contact point G3 displaces a bit to point C. *4* indicates a bigger inclination. G4 becomes near point C. *5* shows an extreme case of a still bigger J, contact point G4 coincides with point C. As force J on the auxiliary shaft increases, contact point G is moved from point B to point C.

Figure 34:
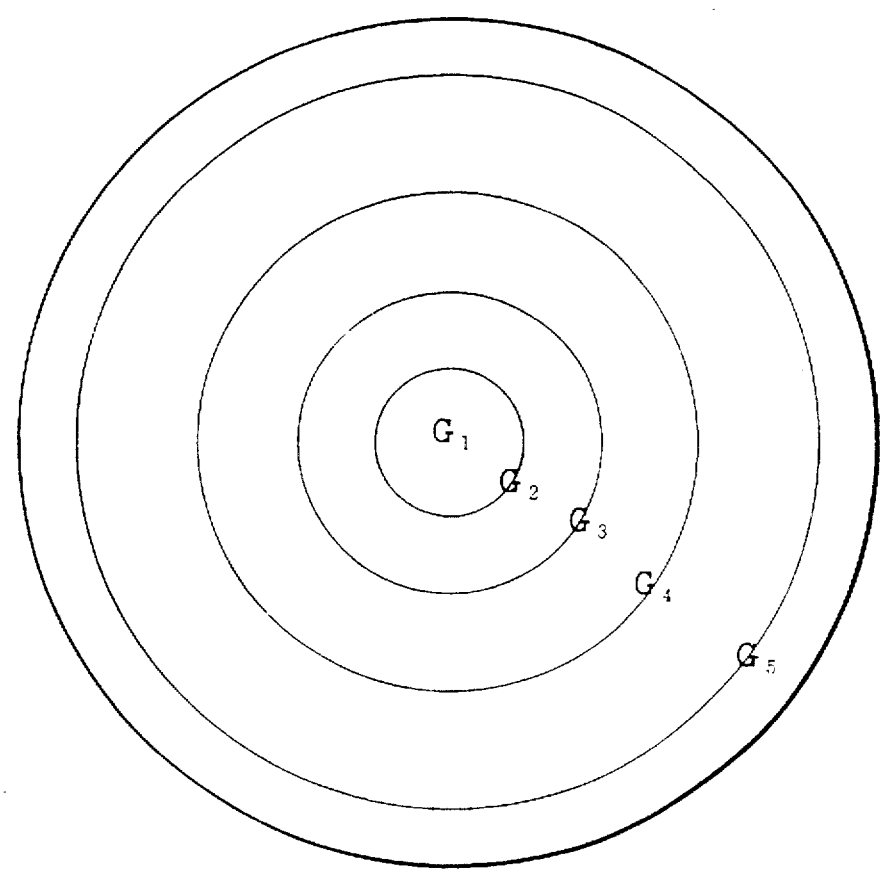
FIG. 34 is a plan view of a turn-table showing the locuses of the contact point when the contact points vary as a function of the force of the auxiliary shaft as shown in FIG. 25.

Since the holder rotates, the contact points depict concentric circles on the wafer. FIG. 34 denotes the change of the contact regions on the wafer in correspondence with points G1, G2, G3, G4 and G5. Contact G1 is only a narrow region of the center. Contact line G2 is the smallest circle. Contact line G3 is the next smallest circle. Contact line G4 is a medium-sized circle. Contact line G5 is the biggest circle. In practice, elastic deformation of the wafer and the turn-table broadens the contact from lines to areas. The contact regions becomes ring areas which extend by a certain width on both sides of lines G2 to G5.

When the contact is moved from G1 to G5, the whetting progresses from the center toward the periphery of the wafer. On the contrary, if the contact point is displaced from the periphery to the center, the polishing transfers from the periphery to the center. In either manner, the whole surface of the wafer can be polished by the swaying motion. The reason why this invention fixes a wafer to the holder in the convex-distortion state and sways the holder is that the contact regions change freely between the center and the periphery for polishing all of the surface of the wafer.

The position of the contact point G depends on the ratio of the force H of the main shaft to the force J of the auxiliary shaft but is independent of the absolute values of J or H. This fact is convenient, because the total force (J+H) can be reserved as an extra controlling variable. The speed of polishing is freely controlled by the total force (J+H). For example, there are some cases in which the speed of polishing or the pressure should be adjusted according to the material, the thickness, the diameter and so on of the wafer. The existence of the free variable K=H+J is convenient to control the process of polishing.

The contact point G reciprocates between the center (B) and the periphery (C) of the wafer by varying the ratio of J/H. Thus the whole of the wafer surface can be polished uniformly. The wafer has initially no concaves nor wavy parts. Then the wafer can be whetted uniformly without leaving unpolished parts or insufficiently-polished parts.

Figure 21:
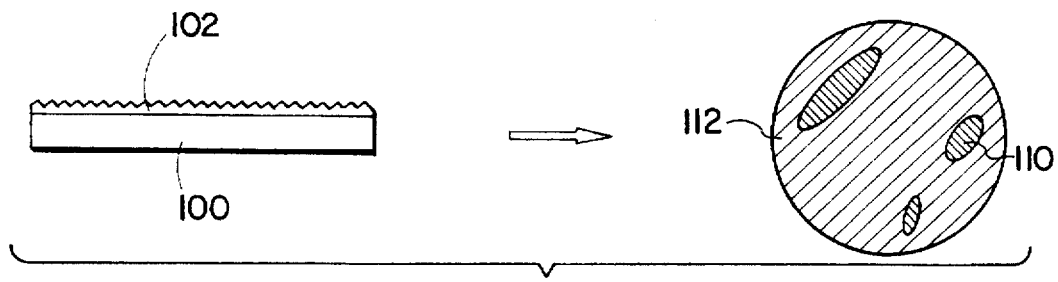
FIG. 21 is a sectional view of a wafer before polishing and a plan view of a flat wafer polished by the conventional apparatus.
Figure 22:
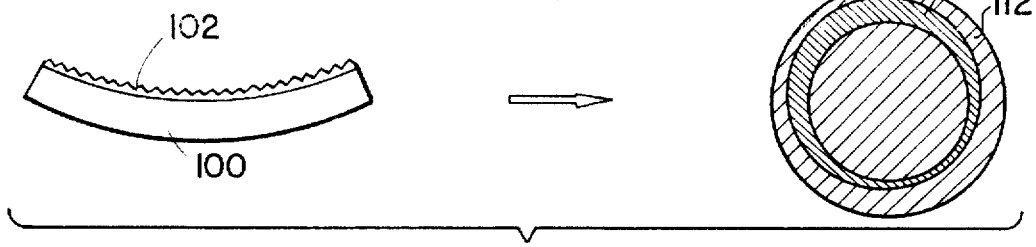
FIG. 22 is a sectional view of a wafer before polishing and a plan view of a concave-distorted wafer polished by the conventional apparatus.
Figure 23:
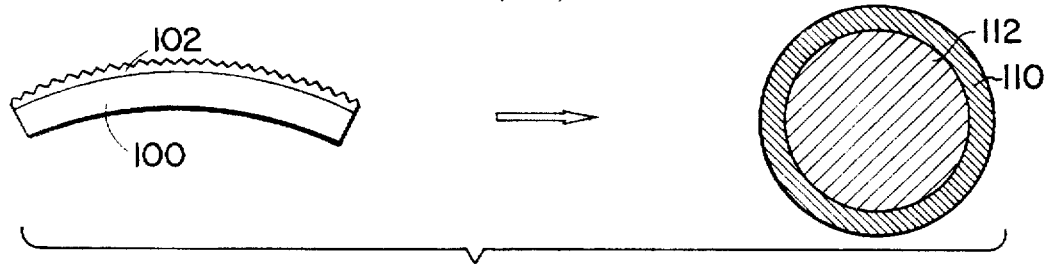
FIG. 23 is a sectional view of a wafer before polishing and a plan view of a convex-distorted wafer polished by the conventional apparatus.

Conventional polishing methods could not polish the peripheral part in the case of a convex-distorted wafer, thus providing an outer unpolished portion 110 and an inner polished portion 112, as shown in FIG. 23. Intermediate unpolished portion 110 remained within a circle distanced by 5 mm to 10 mm form the circumference in the case of concave-distorted wafer, as shown in FIG. 22. In the case of a flat but wavy wafer, unpolished portions 110 remained at random and within a circle distanced by 5 mm to 10 mm from the circumference, as shown in FIG. 21. Unlike the conventional methods, this invention fixes a wafer in the convex-distortion and polishes the wafer by swaying the rotating holder. This invention is entirely novel because of the swaying of the axis of rotation of the holder for whetting a convex-deformed wafer. The precession is as profitable as the swaying motion for the holder in the present invention.

But the precession is a more complicated motion than the swaying motion. Thus the precession will be explained later.

The rigidity of the substrate and the size of the wafer determine the preferable convex-distortion height. The suitable convex-distortion height is between −3 μm and −50 μm for the wafers of a thickness ranging from 0.1 mm to 2.1 mm and a diameter of more than 1 inch (25 mm). A more suitable convex-distortion height is −3 μm to −20 μm. As mentioned before, the distortion is represented by the height of the center from the plane including the circumference. The height is determined to be negative for the convex-distortion and to be positive for the concave-distortion. For circular bending, the radius R of curvature relates to the height H by the equation $R=D^2/8H$, where D is the diameter of the wafer. Thus the absolute value |H| of the preferable distortion increases for a larger wafer or a thicker wafer.

When the object wafer is inherently flat or concave-distorted, the wafer is forcibly deformed into the pertinent convex-distortion. The conversion of the distortion is carried out by the aforementioned spacer (14). A flat wafer or a concave-distorted wafer is fixed via the convex spacer (14) to the buffer (11) which has been stuck to the holder. In addition, an inherently convex-distorted wafer of a bending of −3 μm to −50 μm can be directly glued to the buffer without the spacer. Of course, insertion of the spacer is possible also to convex-distorted wafers.

As shown in FIG. 20, the wafer (2) is fixed to the holder (3) via the spacer (14) and the buffer (11) in general. This invention enables the turn-table to come into contact with all the surface of the wafer by swaying the rotating holder. The polishing progresses from the center to the periphery by the swaying motion. Otherwise the polishing progresses from the periphery to the center. There is neither concave portions nor wavy portions in the convex-distorted wafer. No portions are left unpolished or insufficiently-polished.

The reason why the concentrated load is applied on the center of the holder is to facilitate the swaying motion of the holder.

The reason why the buffer is interposed between the wafer and the holder is that the buffer prevents the wafer from breaking by deforming itself and alleviating the localized force acting on the wafer, when a strong force is applied to the wafer during the polishing. Besides the shock-absorbing function, the buffer allows the holder to incline with respect to the turn-table by deforming itself in the swaying motion. Even if the distortion height is not appropriate, the self-adjustment of the buffer corrects the distortion so as to be suitable for polishing and thereby permits the turn-table to polish the whole wafer surface.

Another improvement is now explained. If the holder were always in contact with the same region on the turn-table, only the ring region would be selectively defaced on the turn-table. Then a circular broad groove would be formed on the turn-table surface. The use of such a turn-table with the cavity would vary the pressure on the wafer and fluctuate the thickness of the film polished. Furthermore the occurrence of the ring-shaped groove would reduce the life time of the turn-table.

To prevent the occurrence of the circular groove, this invention changes the contact region of the wafer on the turn-table in the radial direction by moving the arm and the holder. The relative movement of the holder in any direction other than the circular direction induces a radial displacement of the contact region on the turn-table. Then abrasion arises uniformly across the turn-table. The radial displacement of the contact region maintains the evenness of the turn-table and prolongs the life time of the turn-table.

Figure 30:
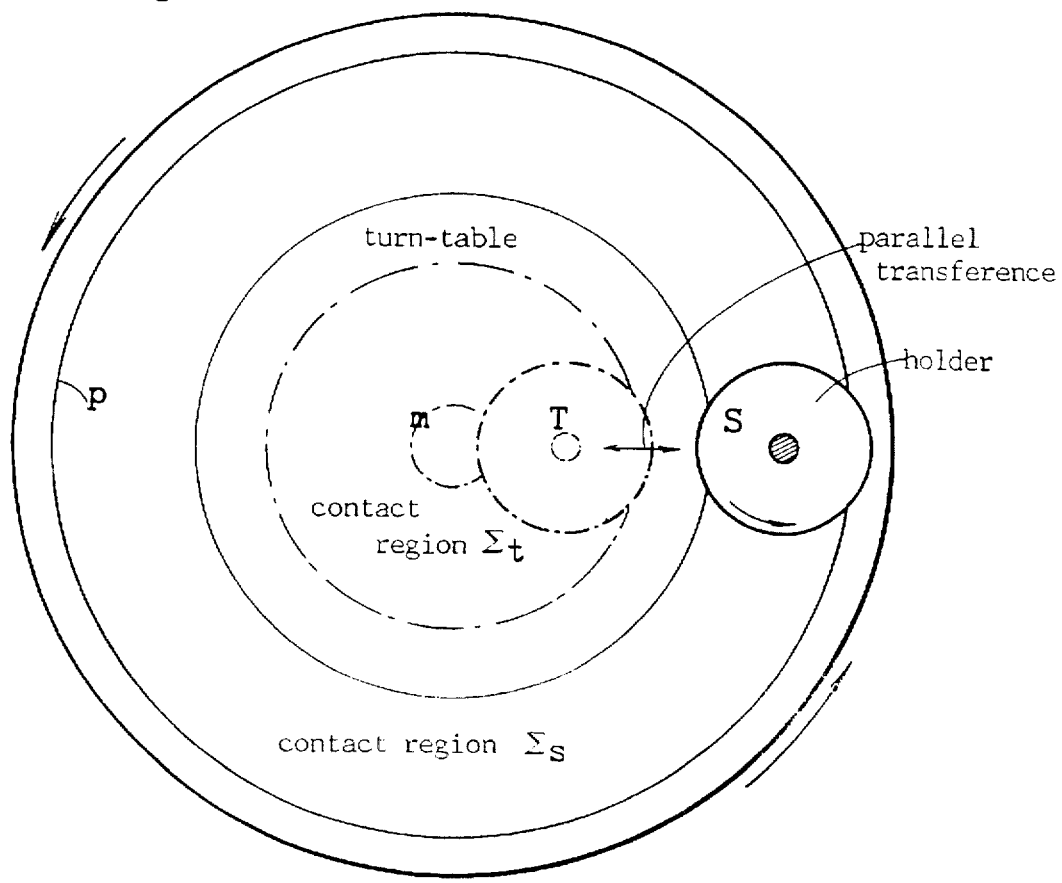
FIG. 30 is a plan view of the turn-table and the holder explaining the change of the contact region between the holder and the turn-table in accordance with the parallel displacement of the holder in the radial direction.
Figure 31:
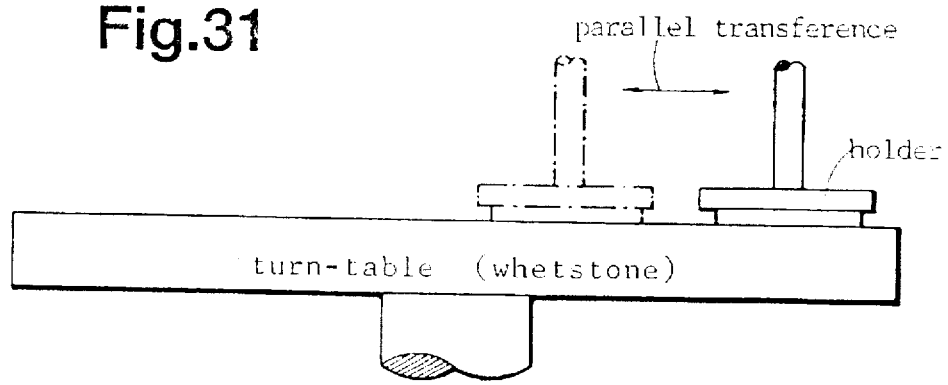
FIG. 31 is a front view of the turn-table and the holder explaining that the radial reciprocation of the holder changes the contact region and widens the total contact region to encompass almost all of the surface of the turn-table.

FIG. 30 and FIG. 31 demonstrate the displacement of the holder on the turn-table. The holder can take an outermost position (S) and take an innermost position (T). Further, the holder can continually reciprocate between S and T. When the holder is at S, the contact region on the turn-table is a big ring-shaped Σ s. When the holder is at T, the contact region of the turn-table is a small ring-shaped Σ t. The width of the regions is equal to the diameter of the wafer. Since the holder can move between T and S, the total contact region occupies the wide area enclosed by the smallest circle (m) and the biggest circle (p). The wafer touches the whole of the region between circle m and circle p. The wear of the turn-table can be equalized by the reciprocal movement of the holder. The evenness of the turn-table is maintained by the common wear of the turn-table.

This invention is capable of polishing hard-material coated wafers of more than Vickers hardness Hv3000, e.g., diamond, diamond-like carbon or c-BN, to a roughness of less than Rmax 50 nm and Ra 20 nm. Since the wafer is fixed to the holder in the convex-distorted state and the holder sways the rotation axis for bringing the whole surface into contact with the turn-table, this invention can polish at least 50% of the surface to a roughness of Rmax 50 nm and Ra 20 nm in general. Further, the adoption of a heavier load or longer polishing time can increase the ratio of the sufficiently polished portions with a smoothness of less than Rmax 50 nm and Ra 20 nm above 70%. A pertinent selection of the curvature, the load and the time enables the apparatus to polish 100% of the surface of a hard wafer into a smoothness of less than Rmax 50 nm and Ra 20 nm.

The next problem to be addressed is the fluctuation of the thickness of the smooth polished film. If the initial thickness of a film is uniform, this invention is capable of reducing the fluctuation in the film thickness after polishing to less than ±20%. It is easy to suppress the fluctuation of the thickness of a polished film, if the initial thickness of the film was uniform, because of the hardness of the film, the difficulty of polishing and the slow speed of polishing reduce the chances of fluctuation.

Additional contrivances enable this invention to reduce the fluctuation of the thickness of the smooth part of less than Rmax 50 nm and Ra 20 nm within ±10%. There are two contrivances for reducing the fluctuation of the thickness of the smooth-polished film. One is a distortion-reducing method. The other is a two-layered method. *1* distortion-reducing method—a method which gradually decreases the distortion in accordance with the advance of polishing. If the convex-distortion is large, the central part is mainly polished in the wafer. If the convex-distortion is small, the peripheral part is mainly polished. This tendency is caused by the constant amplitude of the swaying motion of the holder. If the distortion can be reduced during the polishing process, the central part is mainly polished in an early stage and the peripheral part is polished in a later stage. Thus the whole of the surface can be perfectly polished by the transference of the polishing from the center to the periphery. Then the thickness of the film becomes uniform across the whole surface. This method is quite novel and superb, since the dynamical change of the curvature of a film equalizes the thickness of the film.

Figure 26:
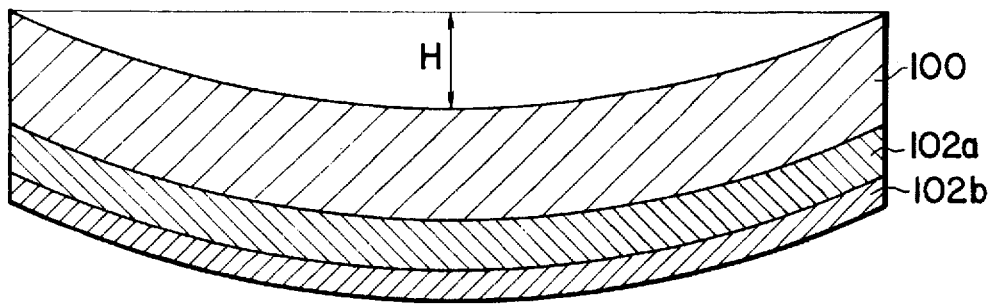
FIG. 26 is a sectional view of a wafer having a (substrate)/(hard film 102a)/(hard film 102b) structure. The hard film 102b which has inner compressive stress strongly bends the wafer.
Figure 27:
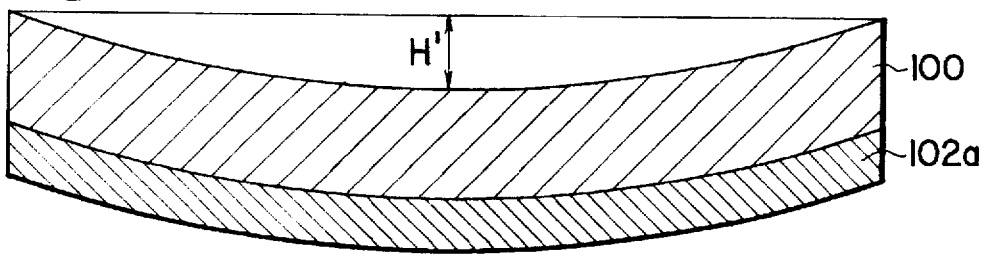
FIG. 27 is a sectional view of the wafer of FIG. 26 after polishing. Since the film 102b with compressive stress is eliminated, the distortion of the wafer has been reduced.
Figure 28:
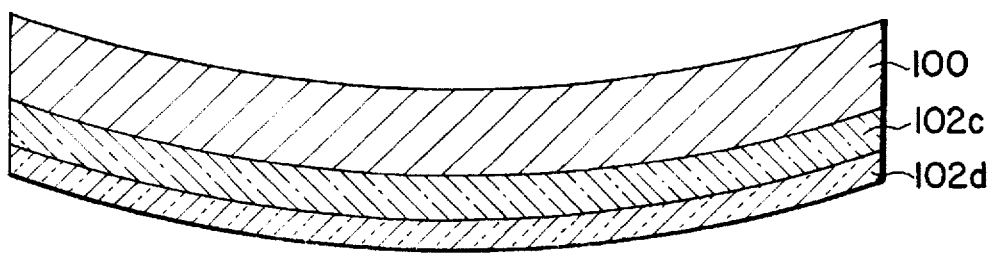
FIG. 28 a sectional view of a wafer having a (substrate)/(polishing-difficult film)/(polishing-easy film) structure.
Figure 29:
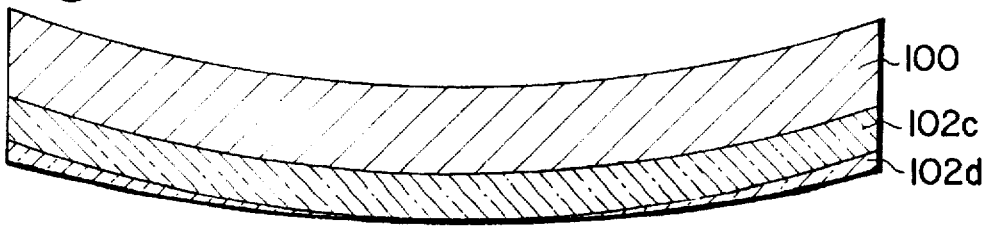
FIG. 29 is a sectional view of the wafer of FIG. 28 after polishing. The outer polishing-easy film is removed and the polishing-difficult film is revealed. The thickness of the film is uniform.

This method is carried out by the following steps. FIG. 26 and FIG. 27 indicate the sections of a wafer before and after polishing. FIG. 26 denotes an inverted structure of (substrate 100)/(hard film 102a)/(hard film 102b). At first, a hard film 102a with weak compressive stress is grown on a substrate. Then another hard film 102b with strong compressive stress is deposited on the film 102a. Film 102b forces the wafer to bend into a large convex-distorted state which is designated by FIG. 26. This wafer has a strong convex-distortion at first. The central part is selectively polished at an early step of polishing because of the excess distortion. As the hard film 102b is removed from the center of the wafer, the wafer loses its compressive stress and reduces the distortion gradually. Since the distortion is decreasing, the peripheral portions are brought into contact with the turn-table. Then the periphery of film 102b is also polished. Finally, all the film 102b is polished away from the wafer. The compressive stress decreases and the wafer becomes flatter. FIG. 27 indicates the final state, in which the wafer has only film 102a with weak compressive stress. The film is perfectly polished. The fluctuation of the film thickness is small, since the periphery has been sufficiently polished. This contrivance reduces the compressive stress and the distortion as a function of the progress of polishing. The polishing of the periphery is enhanced by the release of the stress. Then the thickness of the film becomes uniform. *2* two-layered method—a method which forms two hard films with different hardness on a substrate and decreases the fluctuation of the thickness of the film by leaving only the harder film on the substrate. FIG. 28 and FIG. 29 denote an initial section of the wafer before polishing and a final section after polishing. The inverted wafer has a structure of (substrate 100)/(polishing-difficult film 102c)/(polishing-easy film 102d). This contrivance first makes a harder film (polishing-difficult film 102c) on a substrate and then coats the harder film with a softer film (polishing-easy film 102d). Here "difficult" or "easy" for polishing has only a comparative meaning. Both are hard material of a Vickers hardness higher than Hv3000 and difficult for polishing. In the case of diamond, a (111) oriented film is very difficult for polishing but a (110) oriented film is comparatively easy to polish. Diamond which is synthesized from vapor phase on a substrate is generally composed of polycrystals which are sometimes oriented in random directions. However, the Inventors have discovered the fact that the orientation of the diamond polycrystals can be controlled by the condition of synthesis. Although the diamond is still polycrystalline, the condition of synthesis can determine the direction of orientation of the granules of polycrystals. Thus, a (111) oriented film or a (110) oriented film can be produced by controlling the conditions of growth. The contrivance makes the best use of the orientation-selectivity of the CVD synthesis for making the two-layered structure shown in FIG. 28. At an early stage, the polishing-easy film 102d is removed. The undercoat layer (polishing-difficult film 102c) is revealed. The polishing progresses no more at the spots where the polishing-difficult film appears. Only the polishing-easy film is polished further. The undercoat polishing-difficult film appears both at the central part and at the peripheral part. Since the undercoat film has been grown in a certain thickness, the polished film has a uniform thickness. Another advantage of coating the polishing-easy film 102d is that unpolished parts or insufficiently-polished parts do not remain on the surface. The two-layered method is a promising method for whetting all the surface without changing the curvature during the polishing. The above explanation clarifies the excellence of this invention in promoting the uniformity of the thickness of the hard film.

The next problem to be addressed is the speed and the pressure of polishing. This invention fixes a wafer to the holder in the convex-distortion of a height ranging from −3 μm to −50 μm and brings the convex-distorted wafer into contact with the flat turn-table. Only a part of the wafer contacts the turn-table. The area of the contact is narrow. The load plays an important role, since diamond granules fixed on the turn-table grind the hard-material film by applying a heavy load upon the contact region by the shaft. The narrowness of the contact region enhances the pressure, that is, the force per unit area. The high pressure raises the efficiency of polishing and increases the speed of polishing. Accordingly, the narrowness of the contact can alleviate the load of the apparatus by reducing the weight. The possibility of reducing the load is one of the advantages of the invention which whets the wafer which is fixed in the convex-distorted state on the holder.

Figure 32:
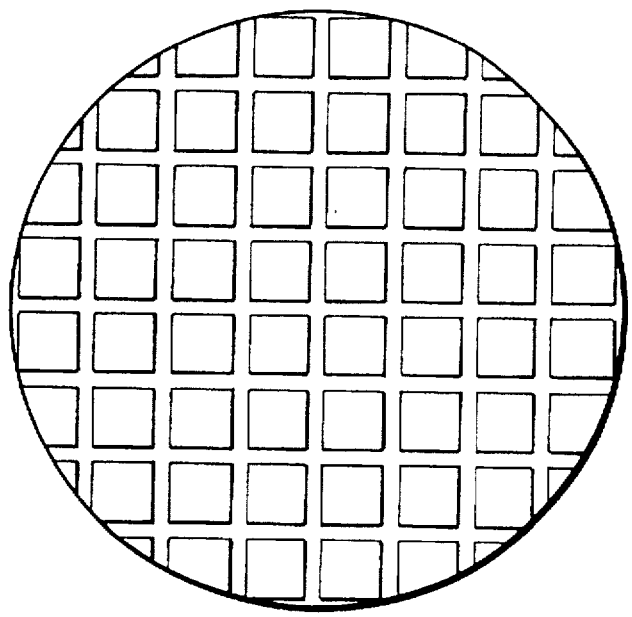
FIG. 32 is a plan view of a turn-table on which lattice-like grooves have been formed for decreasing the effective contact area of the turn-table to the wafer.
Figure 33:
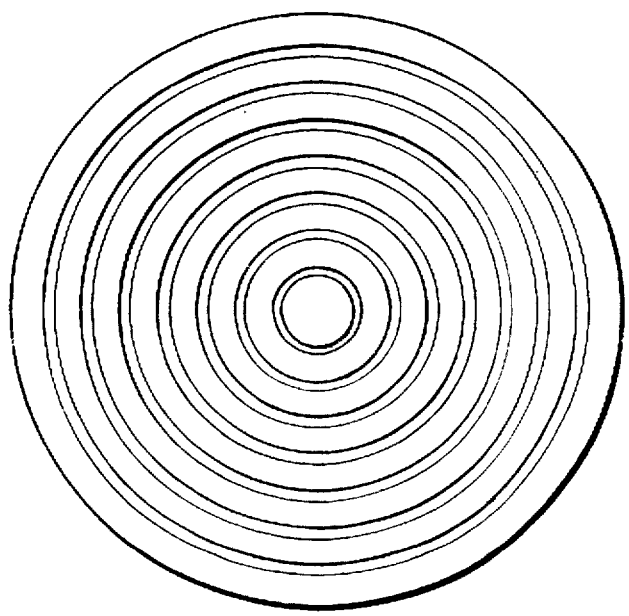
FIG. 33 is a plan view of another turn-table on which concentric grooves have been formed for reducing the effective area of contact.

In addition, the pressure, that is, the force per unit area, is further enhanced by making the contact region discontinuous and reducing the contact area. Two methods are available for reducing the contact area. One is forming lattice-like grooves or concentric grooves on the turn-table. The other is forming lattice-like grooves (FIG. 32) or concentric grooves (FIG. 33) on the hard film of the wafer. Both have the similar effect of raising the pressure per unit area upon the contact region by reducing the effective contact area. However, making grooves on the turn-table is perhaps more convenient, since the grooves do not affect the shape of the film or the wafer at all. The formation of grooves on the wafer is also possible for some wafers having a special purpose.

Another advantage originates from the convex-distortion polishing and the formation of grooves. Polishing yields various particles dissociated from the turn-table and the wafers. These particles are waste which must be removed from the wafer and the turn-table. In the present invention, the wafer is convex-distorted, the contact region is narrow and the other portions of the wafer separate from the turn-table. The gaps between the wafer and the turn-table facilitate the exhaust of the waste by forming passageways. Besides, the grooves denoted in FIG. 32 or FIG. 33 accelerate the elimination of the waste further.

Strong friction between the wafer and the turn-table produces enormous heat. The heat raises the temperature of the wafer and the turn-table. Sometimes cooling water is supplied on the turn-table for adjusting the temperature of the abrasion region. If a flat wafer were in full contact with the turn-table, the water would not cool the wafer, since no water flows between the wafer and the turn-table. However, because this invention keeps the wafer in the convex-distorted shape, other parts than the contact region sufficiently pull in the cooling water with the aid of the capillary tube phenomenon. The gaps play the role of conduits for the cooling medium. The convex shape of the wafer contributes to rapid and correct temperature control. The formation of grooves on the wafer or the turn-table is more effective.

As mentioned before, this invention features the swaying movement or the precession of the holder. Only the swaying motion has been clarified until now, because the swaying motion is simpler than the precession. The precession is another concept for defining the movement of the holder. This invention can periodically change the contact region by the precession of the holder. Now the precession of the holder is explained by referring to FIG. 35, FIG. 36, FIG. 37 and FIG. 38.

Figure 35:
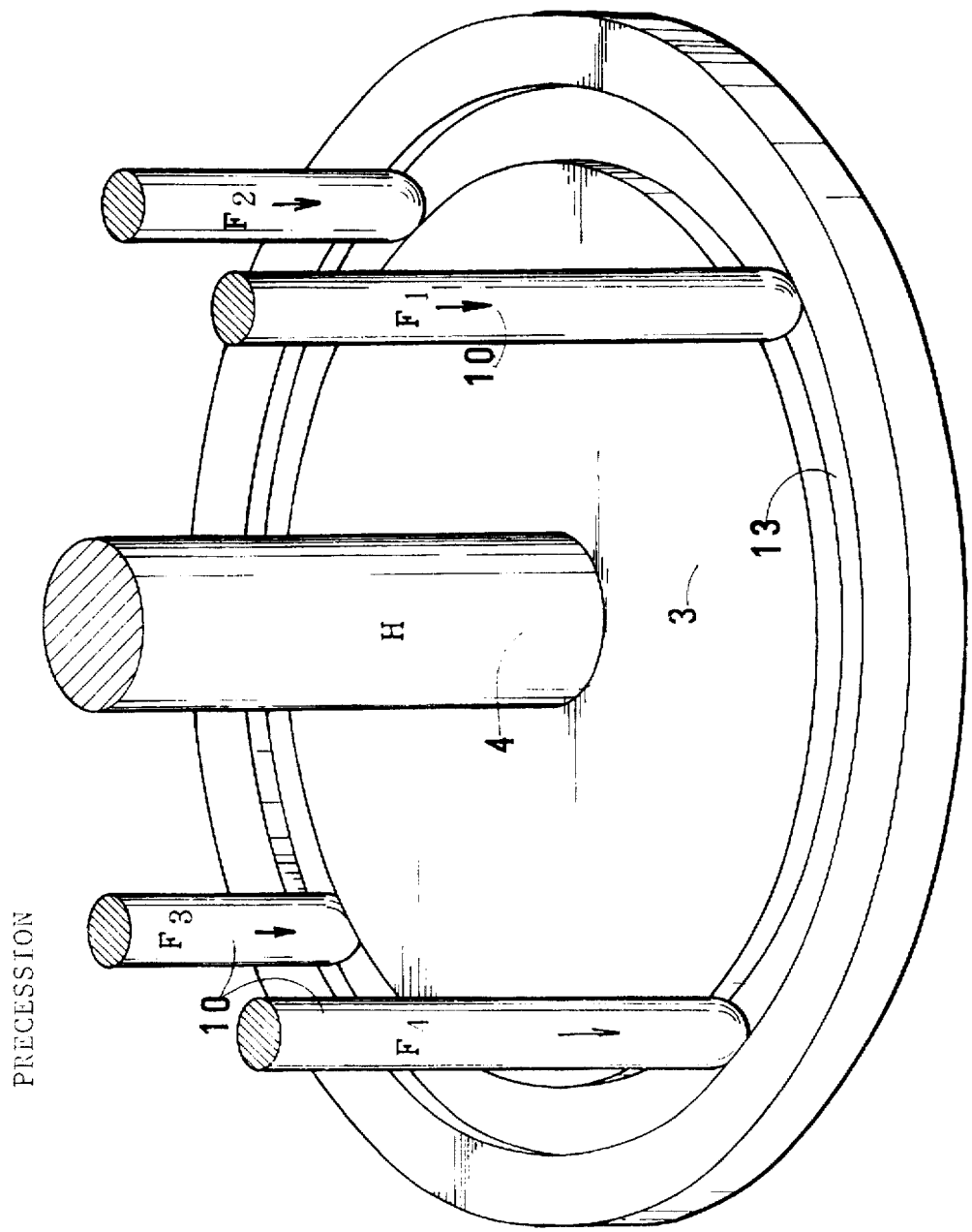
FIG. 35 is a perspective view of a holder, a main shaft and four auxiliary shafts for generating the precession of the holder by changing the forces acting on the auxiliary shafts by a periodically function.

As explained by referring to FIG. 35, precession is the rotation (or gyration) of the rotation axis of the holder 3 about the main shaft 4 to define an imaginary inverted cone. This precession occurs without a change of the rotation speed. Now M denotes the rotational moment, N is the external force applied upon the rotating matter and I means the inertia second-order moment. The motion of the rotating matter is described by a torque equation $I(dM/dt)=M \times N$, where "x" is the vector product. Therefore the rotation axis itself rotates in the direction vertical both to the external force and to the axis. The rotation speed itself is always constant but the axis itself rotates around the direction of the external force with an angular velocity $\omega=N/I$. This motion is far more complex than the swaying motion which has been clarified until now. The precession has been well known as a typical motion of a top. The reason why the axis of a rotating top moves along a path that defines an inverted cone is that the gravity acts to the center of gravity of the top. The angular velocity $\omega=N/I$ is constant but the radius of the inverted cone gradually increases by the energy loss due to the friction, until the top tips over and finally comes into contact with the ground.

This invention forcibly creates the precession of the holder by employing more than three auxiliary shafts, instead of gravity. FIG. 35 shows a simplified perspective view of a holder and shafts. On the bottom of the holder, a wafer has been attached. A main shaft (4) pushes the center of the holder for pressing and rotating the holder. A flexible joint which connects the main shaft (4) to the holder (3) transmits the torque and pressure. Due to the flexible joint, the holder (3) can incline to the main shaft (4) which is always kept in the plumb direction. A circular groove (13) is formed on the periphery of the holder (3). Four auxiliary shafts (10) are installed at the arm. The auxiliary shafts (10) are vertically pressed by pressure cylinders (oil or air) not shown in the figures. Bottoms of the auxiliary shafts glide in the circular groove (13). The auxiliary shafts press four peripheral points of the groove (13). The auxiliary shafts (10) do not rotate but reciprocate in the vertical direction with some amplitude.

Figure 36:
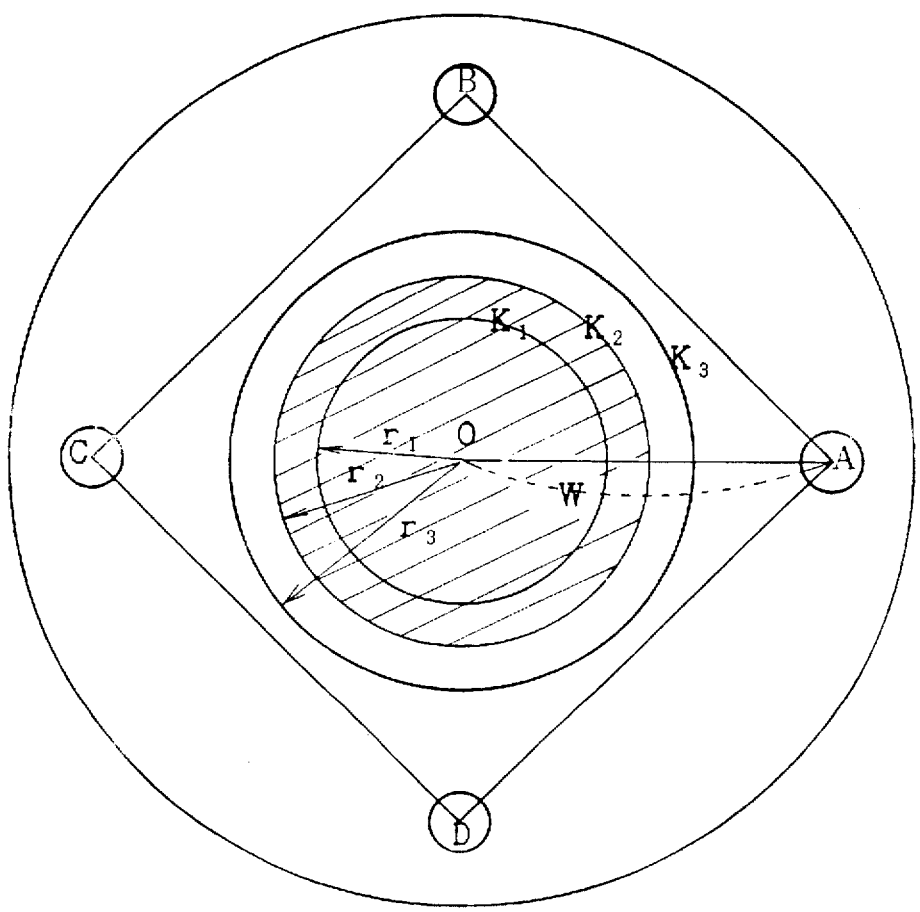
FIG. 36 is a plan view of the holder for explaining how the holder accomplishes the precession by the periodical changes of the forces of the four auxiliary shafts.

This example has four auxiliary shafts. More than three auxiliary shafts are necessary to induce the precession of the holder. "n" denotes the number of the auxiliary shafts ($n \geq 3$). The auxiliary shafts are indicated by J1, J2, J3, - - -, Jn. A constant load is applied to the main shaft. The auxiliary shaft is supplied with a force which is a sum of a constant part and a sinusoidally-changing part. The phases of the sinusoidally-changing parts differ by $2\pi/n$ for the neighboring auxiliary shafts. Then the center (G) of gravity of the applied forces deviates from the geometric center (O) of the holder (3) and moves on a circle of a definite radius. FIG. 36 shows the locus of the center of gravity of the applied pressures.

Figure 37:
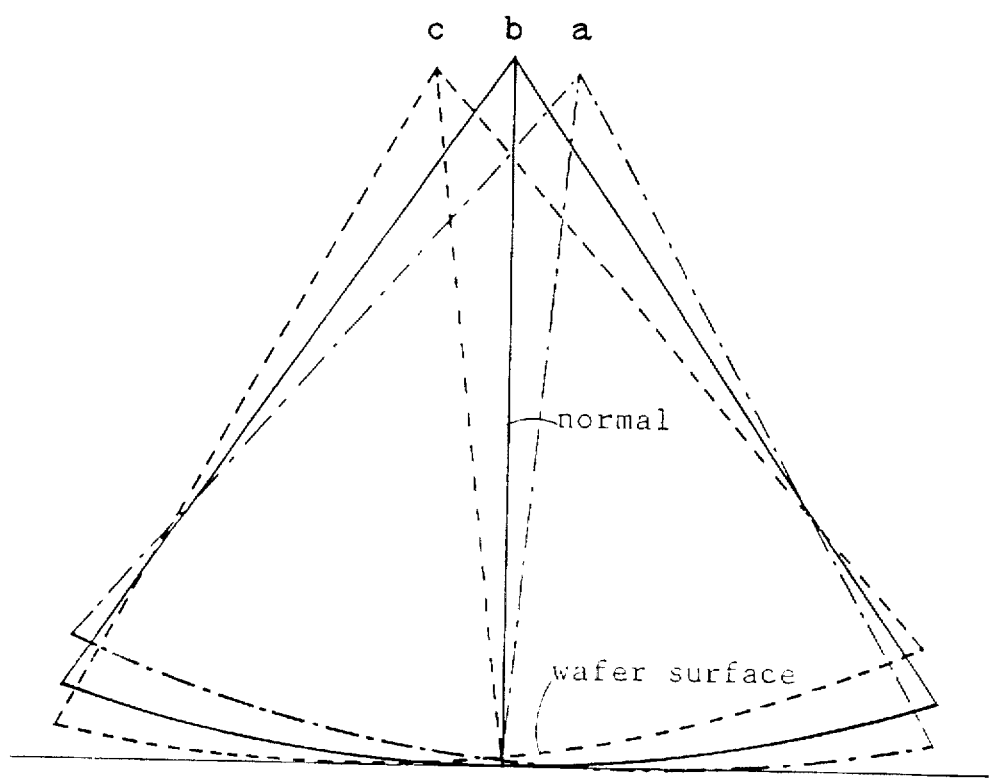
FIG. 37 is a simplified view of the wafer and the normal explaining that the normal rotates to define an invented cone by the precession.

The holder has a convex-distorted wafer on the bottom. Since the center of gravity of the pressures supplied by the main shaft and the auxiliary shafts depicts a locus of the circle and the wafer has the convex-distorted face, the holder does the precession. FIG. 37 indicates the movements of the holder and the normal of the holder. When the holder inclines, the contact point differs from the center.

F1, F2, F3, - - -, and Fn which are the forces applied on auxiliary shafts J1, J2, J3, - - -, and Jn are assumed to be the values given by the following equations.

$F1 = S+Q \sin(\Omega t - 2\pi/n)$.

$F2 = S+Q \sin(\Omega t - 4\pi/n)$.

$F3 = S+Q \sin(\Omega t - 6\pi/n)$.

$Fi = S+Q \sin(\Omega t - 2i\pi/n)$.

$Fn = S+Q \sin(\Omega t)$.

S is the constant part of the forces. Q is the amplitude of the sinusoidal components. H is the force on the main shaft. All the forces H, F1, F2, F3, Fi, - - -, and Fn are parallel and directed downward. Thus the vector sum of these forces gives the physical sum T of the forces. The acting point of the forces is identical to the center of the gravity of the forces. The auxiliary shafts which are all gliding on the groove are disposed at the rotationally symmetric positions in the XY-plane. The positions of J1, J2, J3, - - - , and Jn are indicated by J1 ($W \cos(2\pi/n), W \sin(2\pi/n)$)

J2 ($W \cos(2 \times 2\pi/n), W \sin(2 \times 2\pi/n)$)

Ji ($W \cos(2\pi i/n), W \sin(2\pi i/n)$)

Jn ($W, 0$)).

The vector sum of the forces of the shafts shall be calculated. X-component Fx of the total moment is:

$$Fx = \sum_{i=1}^{n} JixFi$$

$$= SW \sum_{i=1}^{n} \cos(2i\pi/n) + QW \sum_{i=1}^{n} \cos(2i\pi/n)\sin\left(\Omega t - 2\pi \frac{i}{n}\right)$$

$$= (QW/2) \sum_{i=1}^{n} [\sin(\Omega t) - \sin\{(4\pi i/n) - \Omega t\}]$$

$$= (QWn/2)\sin(\Omega t).$$

The scope of the summation in $\Sigma$ is 1, 2, 3, - - - ,n. From the symmetry, $\Sigma \cos(2i\pi/n)=0$ and $\Sigma \sin\{(4\pi i/n)-\Omega t\}=0$. Similarly, Y-component Fy of the total moment is:

$$Fy = \sum_{i=1}^{n} JiyFi$$

$$= SW \sum_{i=1}^{n} \sin(2i\pi/n) + QW \sum_{i=1}^{n} \sin(2i\pi/n)\sin\left(\Omega t - 2\pi \frac{i}{n}\right)$$

$$= (QW/2) \sum_{i=1}^{n} [-\cos(\Omega t) + \cos\{(4\pi i/n) - \Omega t\}]$$

$$= -(QWn/2)\cos(\Omega t).$$

The result means that the total moment applied on the holder changes as a sinusoidal function of time. The center G(Gx,Gy) of gravity of the forces is calculated by dividing the moment (Fx, Fy) by the total force which is equal to (H+nS). "H" is the constant force of the main shaft. "S" is the constant component of an auxiliary shaft. "n" is the number of the auxiliary shafts. Then the center of gravity G is denoted by:

$Gx=(QWn/2(H+nS)) \sin(\Omega t)$ $Gy=-(QWn/2(H+nS)) \cos(\Omega t)$

This means a circular locus. The center of gravity of the forces applied on the shafts depicts a round locus whose radius is (QWn/2(H+nS)). The angular velocity is $\Omega$ which is equal to the angular frequency $\Omega$ of the reciprocal motion of the auxiliary shafts. W is the radius of the circular groove. Q is the variable component of the force. S is the constant component of the force of the auxiliary shafts. In the limit of H/nS→0, the radius of point G is (QW/2S). If all the forces {Fi} should be positive, S is bigger than Q and the radius of point G is always less than half of the radius W of the groove. However, if negative Fi is allowed, the radius of gravity point G can become bigger than half of the radius W of the groove. For allowing the negative force Fi, the groove must be shaped for preventing the auxiliary shafts from disengaging from the groove.

The precession also can be explained without the assistance of these calculations. A spherical wafer is glued on the bottom of the holder. Then the contact point S of the wafer to the turn-table must coincide with the center of gravity G of the forces (S=G). This is easily proved by the following reasons. Since the wafer has a convex face, the contact of the wafer to the turn-table must be a single point. If G differed from S, the wafer would topple. Then S=G. This is valid only for convex wafers. Concave wafers or flat wafers do not ensure S=G, because these shapes allow plural contact points. This is one of the most important reasons for employing the convex-distorted wafers.

Therefore, the center G of gravity of the applied forces is always equal to the contact point of the wafer to the turn-table. Furthermore, since the wafer has a spherical surface, the slanting angle $\theta$ is s/R, where s is the deviation of the contact point from the center and R is the radius of curvature of the wafer $R=D^2/8H$).

Until now, it has been proved that the center G of gravity of the applied forces moves along a circular locus. It is also proved that the center G of gravity of the forces is identical to the contact point S for the convex-distorted wafer. The slanting angle $\theta$ of the normal has also been calculated from the deviation s. The result shows that the contact point of the wafer depicts a circle and the inclination angle is constant. The deviation s and the slanting angle $\theta$ are given by s=(QWn/2(H+nS)) and $\theta$=(QWn/2R(H+nS)). Since the inclination angle of the normal (line) of the holder is constant, the normal moves in a circular motion. Thus this movement is precession. The precession is a movement which makes the normal draw an inverted cone. Thus, the turn-table can polish a non-central part of the wafer which is distanced by s from the center.

Nevertheless, a simple precession has the same deviation s of the contact point from the center. The contact point depicts a circle which is named a contact circle now. Only the band region including the contact circle can be polished by the precession, even when the holder rotates around its axis. Unlike the swaying motion, the precession has a constant radius of a constant circle, because the normal rotates along an inverted cone with a definite top angle. The swaying motion is a motion which changes the radius of the contact circle. The precession is another motion which keeps the radius of the contact circle at a constant value. They are contradictory motions with regard to the radius of the contact circles.

The uniform whetting of the whole surface of the hard wafer requires a change of the radius of the contact circle. As the radius s is given by s=(QWn/2(H+nS), s can be varied by changing the forces H, Q and S of the shafts.

The contact circle radius "s" is decreased by an increase of H which is the force of the main shaft. A decrease of H raises the contact circle radius s. An enhancement of the constant term S of the auxiliary shafts decreases the contact circle radius s. Increment of the oscillating term Q of the auxiliary shafts enlarges the contact circle radius s. The radius s is determined by three parameters, which are the main shaft force H, constant part S and oscillating part Q of auxiliary shafts.

The whole surface of the hard wafer can be whetted by changing the radius of the contact circle by varying the parameters. For example, the radius s can infinitely be reduced by decreasing the oscillating force Q of the auxiliary shafts. On the contrary, the radius of the contact circle can be enhances by abatement of H and S.

Next, the upper limit of the radius of the contact circle is now considered. When the main shaft force H vanishes, the radius s takes the maximum value. In the case of the auxiliary shafts, the constant force S cannot vanish. The force acting upon the auxiliary shaft which is a sum of the constant term S and the oscillating term QsinΩt must always be positive in order to push the groove without special contrivance. Then S≧Q. When the S=Q, the force becomes 0 for the auxiliary shaft. In this case, the radius attains the maximum. The maximum value is $_{max}$=W/2. W is the radius of the groove, that is, the distance from the center to the auxiliary shafts. Therefore, the maximum radius of the contact circle caused by the precession is half of the distance between the center and the auxiliary shaft. The radius D of the wafer shall be shorter than $_{max}$ (D<$_{max}$).

The precession is different from the swaying motion with regard to the limitation of the radius s. In the swaying motion, the maximum radius of the contact circle is W which is the distance from the center to the auxiliary shaft. The contact region can displace between the main shaft and the auxiliary shaft.

The foregoing general explanation assumes that "n" is the number of auxiliary shafts. FIG. 35 and FIG. 36 exhibit an example of four auxiliary shafts (n=4). FIG. 36 denotes the shafts by A, B, C and D. The main shaft stands at O. When the forces consisting of a constant S and an oscillating Q are applied upon the auxiliary shafts, the contact point changes on the wafer, depicting a circle. If arbitrary positive forces can be applied on the shafts A, B, C and D, the center of gravity of the forces can take any spot within the square ABCD. However, where the center of gravity of the forces move on a circular locus and the forces are positive, the center of gravity is restricted within the circle of a radius of W/2. In FIG. 36, the center of gravity of the forces exists in the hatched circle K2 because of the restriction of the sinusoidal changes of the forces. The circle K3 cannot be the contact circle, although the entire circle K3 lies in square ABCD. Allocation of positive forces on the shafts can determine the center of gravity at an arbitrary point on circle K3 but the positive forces cannot satisfy the requirement of the sinusoidal change of the forces.

Figure 38:
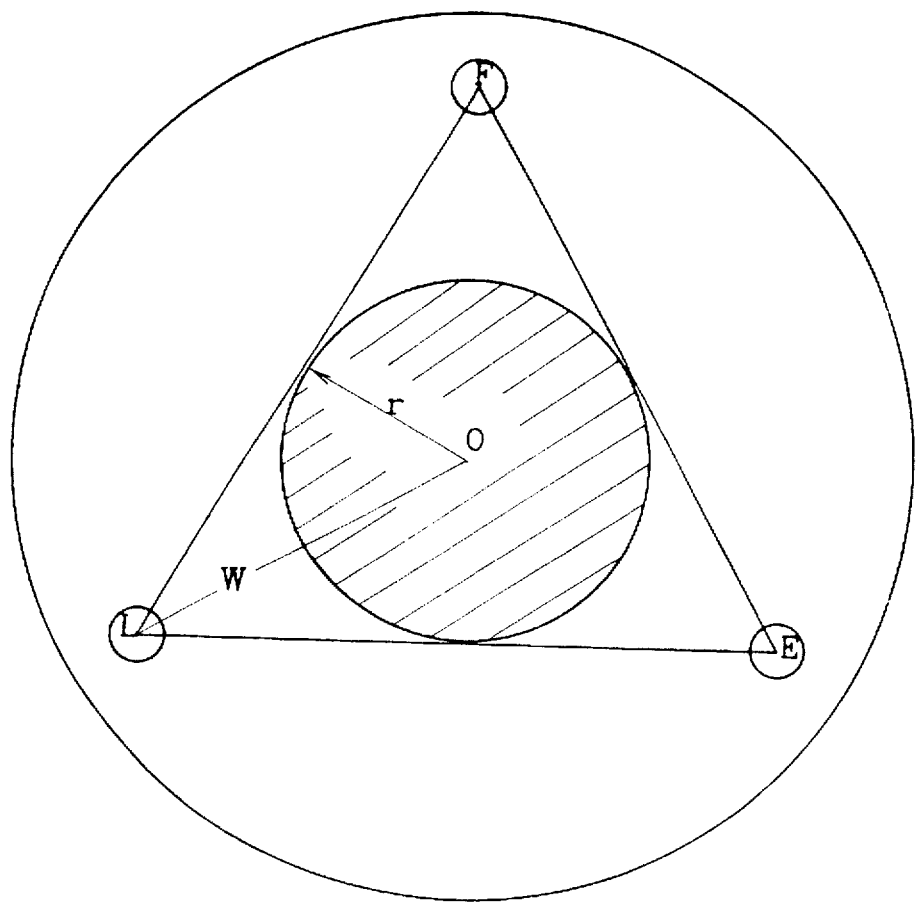
FIG. 38 is a plan view of the holder and three auxiliary shafts for explaining how the precession is induced by the action of the three auxiliary shafts.

FIG. 38 demonstrates the case of three auxiliary shafts E, F and L. The shafts define an equilateral triangle. In this case, the maximum contact circle is the circle which is in contact with the sides of the triangle. Namely, the radius s of the maximum circle is half of the distance W from the center to the auxiliary shaft (s=W/2). Application of the sinusoidally varying forces on the three shafts induces the precession of the holder in a similar manner to the case of the four shafts. The number of the auxiliary shafts is more than three. Two auxiliary shafts cannot cause the precession, because two points do not define a two-dimensional space. An increase of the number of the auxiliary shafts does not enlarge the maximum contact circle ($_{max}$=W/2), but does make the movement of the holder smoother by allotting smaller forces evenly to many shafts. Adoption of many auxiliary shafts, however, will complicate the devices for applying pressure on the shafts.

Figure 39:
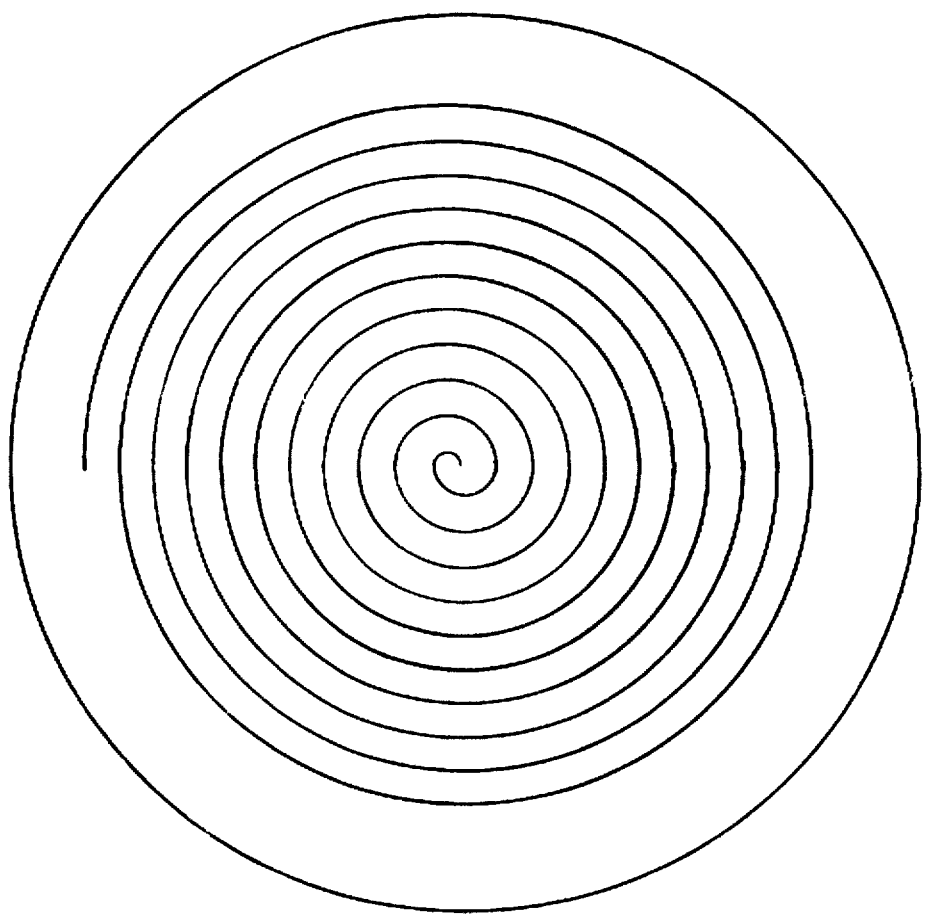
FIG. 39 is a plan view of a turn-table on which the contact region depicts a spiral locus.

Although the device for introducing the precession is rather complex, it is not impossible to make the device. In the precession, it is desirable to polish the whole convex-distorted wafer uniformly by increasing or decreasing the radius s of the contact circle. FIG. 39 indicates another mode in which the locus of the contact point is a spiral. In the spiral, the contact point can be moved either from the center to the periphery or from the periphery to the center.

Figure 40:
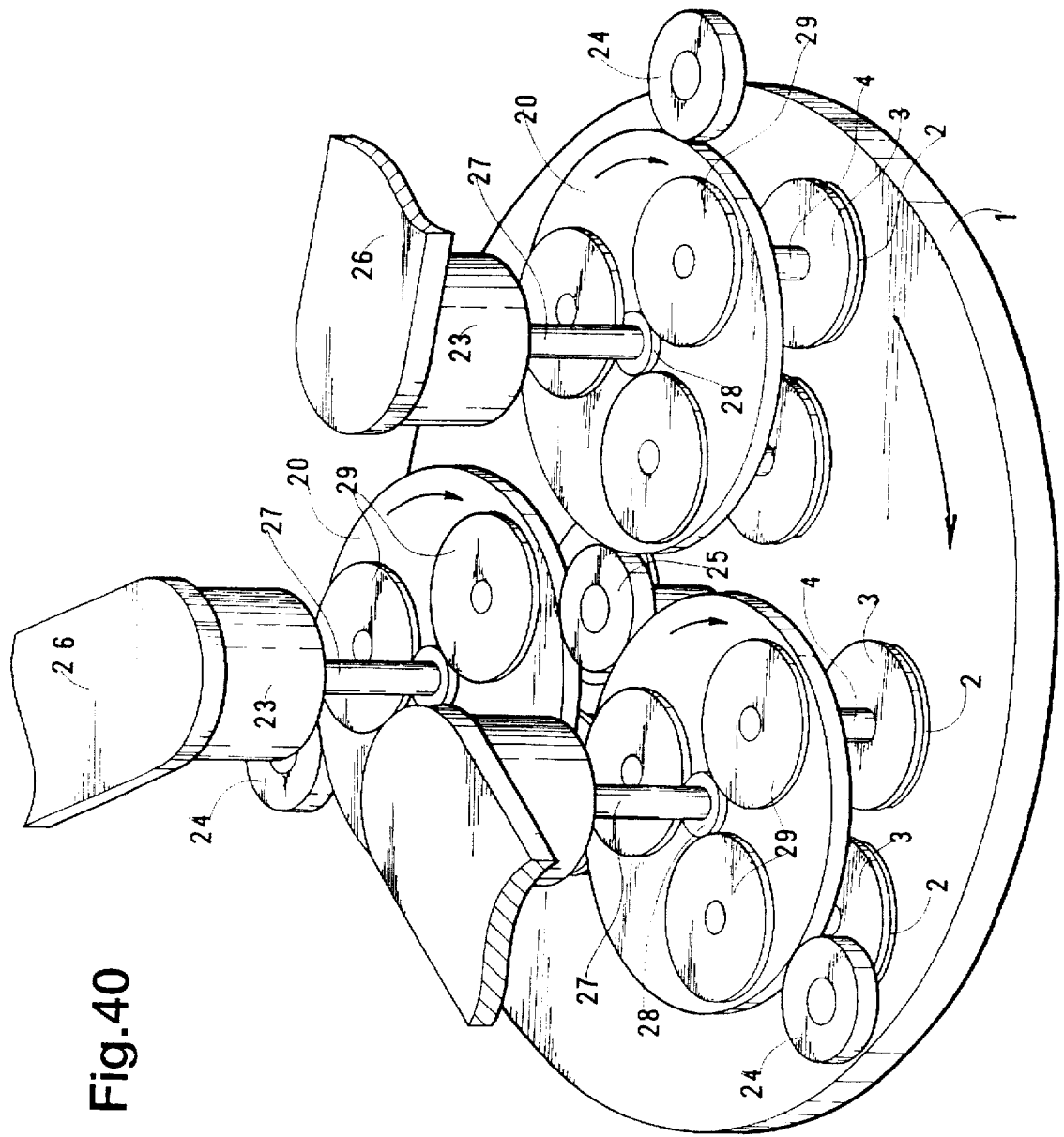
FIG. 40 is a perspective view of a polishing machine which is capable of polishing nine wafers at the same time.

The apparatus which has been explained so far has a single holder. However,it is still preferable to install a plurality of holders to an apparatus in order to enhance the throughput by polishing a plurality of wafers at the same time. FIG. 40 designates such a high-throughput machine. The machine has three heads (23) which each support three holders (3) for polishing three wafers (2). The auxiliary shafts are omitted in FIG. 40 for simplicity. Each holder (3) having a wafer (2) on the bottom is pushed by a main shaft (4). The main shafts (4) are rotatably supported by the intermediate discs (20) at their tops. The heads (23) are fixed respectively to arms (26). The heads (23) apply an axial force to the intermediate discs (20) by the common shafts (27). The heads (23) transmit the rotation to the holders (3) by the common shafts (27) at the same time.

A smaller sun gear (28) is fitted to the foot of each common shaft (27). Each smaller sun gear (28) meshes with planetary gears (29) on the intermediate disc (20). Each planetary gear (29) rotates a respective holder (3) via a respective main shaft (4). The pressures are transmitted by the common shafts (27) and the main shafts (4) to the holders (3). The rotation torque for the holders (3) is supplied by the heads (23). The turn-table (1) revolves around its own shaft. Thus, nine holders (3) rotate about their respective axes and the turn-table (1) revolves around the central shaft. Two-mode motion of the apparatus is enough to polish the wafers with the help of the swaying motion or the precession.

But the example has a more sophisticated device which induces three-mode motion. The intermediate discs (20) rotate round the common shafts. Thus, three different modes of rotation occur in the apparatus. One is the wide revolution of the turn-table (1). Another is the rotation of the intermediate discs (20). The last one is the rotation of the individual wafers (3). The revolution of the turn-table (1) resembles the revolution of planets in the solar system. The motion of the intermediate discs (20) is similar to the motion of satellites to the master planets. The motion of the individual holders is akin to the rotation of the satellites.

In order to rotate the intermediate discs (20), the intermediate discs (20) have outer-toothed gear on the circumferences. The intermediate gears engage with a central bigger sun gear (25) and outer gears (24). The central sun gear (25) and the outer gears (24) have shafts and bearings for sustaining them, but the shafts and the bearings are omitted in FIG. 40. The central sun gear (25) and the outer gears (24) apply a rotational movement to the intermediate discs (20). I, S, and O are tooth numbers and $i$, $s$ and $o$ are angular velocity of the intermediate discs (20), the central sun gear (25) and the outer gears (24), respectively. "j" denotes the number of the intermediate disc. Clockwise angular velocity is defined as positive. The rotations of the parts satisfy the equations;

$$sS = -i_j I = oO_j \; (j=1, 2, 3)$$

If all the outer gears have the same tooth-number O ($O_1=O_2=O_3=O$) and all the intermediate gears have the same tooth-number I($I_1=I_2=I_3$), the rotations are uniquely determined by the velocity of the sun gear. $i_1=i_2=i_3=-sS/I$. $_1=_2=_3=-sS/O$. If the sun gear is only a free wheel, the rotation of the outer gears determines the motions of the intermediate gears. Thus, the equations $i_1=i_2=i_3=oO/I$ clearly describe the motion. The rotation of the wafer is also influenced by the rotation of the intermediate discs of course. "C" and "P" are the tooth numbers of the smaller sun gear (28) and the planetary gear (29). "c" and "p" denote the angular velocities of the sun gear (28) and the planetary gear (29). The rotation of the holders is equal to the planetary gear (29). The engagement among the sun gear (28) and planetary gears (29) gives the equation of motion C(c-i)=-pP. Since i=oO/I, the rotation of the wafer p becomes p=COo/P-Cc/P, where o the angular velocity of the outer gear and c is the angular velocity of the common shaft (27).

The rotation p of the wafer can be controlled by the parameters o and c. "p" is not necessarily equal to $-Cc/P$.

The apparatus designated by FIG. 40 enables nine wafers to be polished at the same time. Further the wafers are polished by the three modes of rotations, which enhances the uniformity of the polishing.

The next problem to be addressed is the whetstone of the turn-table. Polishing powder can be granules of hard materials, e.g., alumina powder, diamond powder and so on. The granules should be selected from a material that is at least as hard as the hard material. Since this invention aims at polishing a hard material wafer of diamond, diamond-like carbon and c-BN, any material other than these materials cannot be used for the whetstone. Diamond granules which polish object hard material tend to thereby dissipate. Polishing of hard material consumes diamond powder.

There are two methods for polishing with regard to the condition of powder. One method uses free powder contained in a polishing liquid. The other method adopts fixed powder. The free powder method is not suitable for diamond powder, because it wastes expensive diamond powder. The free powder method has other drawbacks of low efficiency of polishing and low accuracy of the finished face. Sometimes scratches occur on the surface polished by the free powder method.

Thus, this invention adopts the fixed powder method. A whetstone is composed of polishing powder, bonding material and a filler. The polishing powder includes fine granules of a hard material. Bonding materials bond granules with each other. Whetstones are classified into resin-bonded whetstones, metal-bonded whetstones, vitrified-bonded whetstones, and rubber whetstones by the bonding materials. The filler is powder which contributes neither to polishing nor to bonding. Fine powder of calcium carbonate ($CaCO_3$), alumina ($A_2O_3$) or silicon carbide (SiC) is used as a filler.

In the case of diamond whetstone, the volume ratio of diamond powder is represented by a parameter "concentration". "Concentration 100" signifies a whetstone including diamond of 25 vol %. The effectiveness of polishing is in proportion to the concentration, because the active medium of polishing is diamond powder. "Concentration 100" had been the maximum volume ratio of diamond powder until now. The advance of the technology of the bonding material enhances the maximum concentration. Now "concentration 200" is the maximum ratio which means 50 vol % of the whetstone includes diamond powder.

Another parameter is mesh "#" which denotes the average size of granules. Mesh is defined to be a quotient of 1 inch divided by the average diameter of the granules. Higher number of "mesh" means smaller granules.

This invention can employ resin-bonded diamond whetstones, metal-bonded diamond whetstones, or diamond electrodeposition whetstones as the turn-table. Furthermore, this invention can be realized by small diamond pellet whetstones or diamond pellet whetstones. These are whetstones on which many diamond pellets are stuck. These whetstones have advantages and drawbacks.

Among them, electrodeposit whetstones are favored with the highest performance of polishing, because the density of diamond powder on the surface is the highest. Since these whetstones electrodeposition diamond powder to a base plate without bonding material, the density of diamond can be raised. However, electrodeposition makes only a single-layered diamond coating on the base plate. When the single layer of diamond is worn out, the electrodeposition whetstone loses its polishing capability. When the object is diamond, the abrasion of whetstone is high. Polishing a hard wafer invites a rapid degeneration of the electrodeposition whetstone. Unlike other whetstones, the electrodeposition whetstone has only a single diamond layer; the whetstone cannot be restored by "dressing".

Small diamond pellet whetstones or diamond pellet whetstones have the next highest polishing efficiency to the electrodeposition whetstones, since the density of diamond granule on the surface is relatively high. When the whetstones are worn out, a new polishing surface and the initial performance can be restored by dressing. Repetitions of recovery prolong the life time of these whetstones. However, small diamond pellet whetstones and diamond pellet whetstones are quite expensive.

Resin-bonded diamond whetstones and metal-bonded diamond whetstones have advantages in that they can be restored by dressing and include a lower price than the pellet whetstones. However, the concentration of diamond powder is still insufficient. The speed of polishing is not satisfactory. Between metal-bonded whetstones and resin-bonded whetstones, metal-bonded whetstones are more likely to enhance the concentration of diamond powder and are preferable for the speed of polishing. However, resin-bonded whetstones are less expensive than metal bonded-whetstones. An optimum whetstone should be chosen by taking account of the material, the thickness or the necessary margin of polishing of the object film.

The above is an explanation of the mechanical polishing of a hard wafer at room temperature. This may be called room temperature mechanical polishing.

Of course this invention can be applied to polishing techniques which make use of chemical reaction at a high temperature. The hot chemical polishing method employs a flat, smooth metal plate as a turn-table instead of a whetstone. The method eliminates the surface of the object film by taking advantage of a chemical reaction at a high temperature. The polishing apparatus is installed in a vacuum chamber. A holder on which an object wafer has been stuck in the convex-distorted state is introduced into the chamber and is fitted to the driving device. The chamber is closed and is made vacuous. The turn-table is heated at a high temperature ranging from 400° C. to 900° C. The vacuum chamber is supplied with at least one gas selected from oxygen gas, hydrogen gas, carbon oxide gases, hydrocarbon gases and rare gases for controlling the atmosphere. The suitable pressure is $10^3$ (0.13 Pa) to $10^2$ ($1.3 \times 10^4$ Pa) Torr. The metal of iron group reacts with diamond at a high temperature and eliminates diamond chemically from the surface of the object.

In the hot chemical method, the wafer is attached on the holder in the convex-distortion state. The holder makes the swaying motion or the precession. The entire face of the wafer can be polished by slanting the holder for changing the contact region from the center to the periphery or vice versa. These processes are similar to the aforementioned mechanical polishing.

EXAMPLE 1

The wafers made by the following conditions were polished by the method defined by the present invention. {Production of hard films} The substrate was a mirror-polished (100) silicon monocrystal wafer of a 2-inch (50 mm) diameter and a 1 mm thickness. The silicon wafer was bruised by diamond powder of diameters of 0.5 μm to 1 μm for raising the density of nucleus generation and facilitating the deposition of diamond crystals.

Diamond was deposited on the wafer by the known filament CVD apparatus to a film of a thickness of 20 μm.

The filament CVD was used to produce a film on a substrate by the steps of mounting a substrate on a susceptor in the reaction chamber,introducing a material gas including hydrogen gas and a hydrocarbon gas into the reaction chamber, heating the material gas by the filament, exciting the material gas and inducing vapor phase reaction on the substrate. The filaments were built with ten tungsten wires of a 0.3 mm diameter which were stretched in parallel with a 7 mm spacing. The conditions of synthesis were as follows:

```
Filament temperature = 2100° C.
Material gas = hydrogen gas (H₂) = 500 sccm
               methane gas (CH₄) = 5 sccm
Pressure = 50 Torr (6500 Pa)
Substrate temperature = 910° C. (Sample *13*),
                        860° C. (Sample *14*),
                        810° C. (Sample *15*)
Thickness of diamond film = 20 μm.
```

In the reaction chamber, the substrate was heated by the filaments. The susceptor had a cooling device. The temperature of the substrate could be set by adjusting the power of the cooling device, while the temperature of the filament was maintained constant (2100° C.). Here the temperature of the substrate was selected from three different values of 910° C. (Sample *13*), 860° C.(Sample *14*) and 810° C. (Sample *15*) for three samples *13*, *14*, and *15* in order to examine the influence of the temperature. The results demonstrate that the difference of the substrate temperature has an influence upon the distortion of the complex wafer. The mode of distortion depends upon the temperature of the substrate. The results further show that a higher temperature of substrate has a tendency of making convex-distorted complex wafers and a lower temperature of the substrate has the tendency of making concave-distorted complex wafers. This is important. The thickness is determined by the time of reaction. Here Samples *13*, *14* and *15* had the same thickness of 20 μm.

The distortions of the samples were measured.

| Sample *13*: | concave-distortion with a height of 30 μm. H = +30μm |
|---|---|
| Sample *14*: | flat but wavy. The height of wave was 5 μm. H = 0 |
| Sample *15*: | convex-distortion with a height of 20 μm. H = −20 μm |

Sample *13* corresponds to FIG. 22. Sample *14* is denoted by FIG. 21. Sample *15* is indicated by FIG. 23. As mentioned before, the distortion is represented by the height of the center from the plane including the circumference. The convex-distortion on the film side has a minus sign. The concave-distortion on the film side has a plus sign.

Each of Sample *13*, Sample *14* and Sample *15* was fixed at the center of the holder via a buffer of a natural rubber disc of a 60 mm diameter and a 2 mm thickness. The buffer had a uniform thickness of 2 mm overall. Thus the inherent distortion was maintained in the wafers attached to the holder. Namely, an initially concave-distorted wafer was attached to the holder in the concave-distorted shape. Another initially convex-distorted sample was attached to the holder in the convex-distorted state. Samples were treated by the following polishing conditions.

{Condition of polishing}

| Turn-table | electrodeposition whetstone deposited with diamond granules of #400 |
|---|---|
| Diameter of the turn-table | 300 mm |
| Revolution speed of the turn-able | 80 rpm |
| Rotation speed of the sample wafers | 50 rpm |
| Force on the sample wafer | 5 kgf |
| Amplitude of swaying motion of holder | 1 degree |
| Whetting time | 30 Hr, 80 Hr |

The samples were polished under these conditions for 30 hours. The results of the 30 hour polishing were examined. Then the samples were further polished under the same conditions for 50 hours. The results of the 80 hour polishing were also examined.

(A. States after the 30 hour polishing) (FIG. 21, FIG. 22 and FIG. 23)

Sample *13*: Sample *13* which had been deformed into a concave-shape of a height of +30 μm was polished at the center and the periphery by the 30 hour polishing. However, an unpolished portion remained in a ring-shaped middle region distanced by 5 mm to 10 mm from the circumference. Although the apparatus swayed the holder, the unpolished portion in the middle region could not be extinguished, because the wafer was deformed into the concave-form inherently. The shaft pushed at the center of the wafer with a strong force. The buffer elastically deformed at the center. Thus the center of the wafer was deformed into convex shape locally, allowing the central part to be polished. Since the wafer was inherently distorted in the concave shape, the periphery was in contact with the turn-table with a strong pressure. The periphery also could be whetted. However, the intermediate region between the center and the periphery was still convexly deformed. The inherent concave-distortion prevented the intermediate region from being in contact with the turn-table. Thus, the intermediate region was left unpolished in a ring-shape.

Sample *14*: Sample *14* which was substantially flat but wavy with a peak-to-peak difference of 5 μm was nearly uniformly polished by the 30-hour treatment. However, unpolished portions randomly remained within the circle distanced by 5 mm to 10 mm from the circumference. The reason for this result is that the concave portions and convex portions had initially been distributed randomly.

Sample *15*: Sample *15* which was deformed into a convex shape of a height H of −20 μm was polished uniformly from the center to the middle region. However, a narrow peripheral portion was left unpolished in a ring shape, as shown in FIG. 23. These results indicate that a 30-hour polishing with 5 kgf is insufficient for all the three kinds of distortion. Then the samples were further treated by the same machine for an additional 50 hours. The results were again investigated.

(B. States after 80 hour polishing)

Sample *13*: The doughnut-shaped unpolished portion slightly decreased but still remained in the intermediate region. It was impossible to eliminate the unpolished portion entirely, because sufficient pressure did not act on the intermediate concave region.

Sample *14*: The random distributed unpolished portions were reduced a little, but not entirely. The unpolished portions could not be perfectly removed. Although sample *14* appeared flat, it was hard to polish sample *14*. The incompetence of the 80-hour polishing of sample *14* signifies that substantially flat wafers with a wavy distortion cannot be perfectly polish.

Sample *15*: The 80-hour treatment polished sample 3 perfectly to the periphery. All the unpolished parts vanished. The convex-distortion enabled the entire wafer surface to touch the rotary turn-table. This fact means that a wafer should be attached in a convex-state to the holder.

These results signify the best shape of the wafer on the holder is the convex-distortion. Wafers with any distortions attached to the holder are not polished perfectly, despite the heavy load imposed by the central main shaft. The samples which are initially concave distorted do not leave the central part, but the intermediate part, unpolished. The samples which are initially flat are likely to leave random parts unpolished due to waves on the surface, contrary to expectations. In conclusion, the convex-distortion is the best form for the wafers stuck to the holder.

All the polished portions of all the samples had a smoothness of less than Rmax 10 nm and Ra 5 nm which is sufficient to make various devices on them. Sample *15* had a film thickness of 22 μm+2 μm after the 80-hour polishing. The central portion of the film was thinner than the peripheral portion.

EXAMPLE 2

Samples *16* and *17* which were produced by the following method were polished by the method of the present invention. Example 2 examines the influence of changing the distortion of a wafer during whetting.
{Conditions of producing hard films}

The substrates were mirror-polished 3 inch (100) silicon single crystal wafers of a thickness of 1 mm (75 mm×1 mm). The silicon wafers were bruised by diamond powder of an average diameter of 0.5 μm to 1 μm. A diamond film of a 15 μm thickness was grown on the bruised Si wafer by the microwave plasma CVD apparatus oscillating $TM_{01}$ mode of microwave. The conditions of synthesizing the film were:

| Material gas: | |
|---|---|
| hydrogen gas ($H_2$) | 1000 sccm |
| methane gas ($CH_4$) | 20 sccm |
| Pressure: | 30 Torr |
| Microwave power: | 900 W |
| Film thickness: | 15μm |
| Substrate temperature: | |
| Sample *16* | 860° C. (former 10 μm), 800° C. (latter 5 μm) |
| Sample *17* | 820° C. (for all 15 μm) |
| Distortion of wafers: | |
| Sample *16* | convex-distortion −50 μm |
| Sample *17* | convex-distortion −50 μm |

The temperature of the substrate could be controlled by changing the cooling power of the susceptor. Higher temperature had the tendency of deforming the wafer in more concave shape. Lower temperature had the reverse tendency. Thus, lower temperature is preferable for distorting the wafer in the convex state.

In making sample *16*, an earlier part of a 10 μm thickness was synthesized at 860° C. for inducing smaller convex-distortion and a later part of a 5 μm thickness was produced at 800° C. for causing bigger convex-distortion. Sample *16* had an outer layer of a 5 μm thickness and an inner layer of a 10 μm thickness. Finally, sample *16* had a convex-distortion of a height of −50 μm. The reason why the condition of synthesis was changed halfway was to make two layers with different distortions, to change the distortion midway by removing one layer and to examine the influence that the change in the distortion has on the polishing.

Sample *17* was synthesized overall at 820° C. Sample *17* also had a convex-distortion of a height of −50 μm. Although the final distortion of sample *17* was equal to that of sample *16*, these two samples had different inner stresses.

The buffer is a natural rubber disc of a 85 mm diameter and a 1 mm thickness (ϕ 85×1 t). Samples *16* and *17* were attached to the holders via the buffers. Then samples were treated by the polishing machine of the present invention by fitting the holder to the pressure cylinder and the driving device under the following conditions:
{Conditions of polishing}

| Turn-table: | resin-bonded diamond whetstone of concentration 100 and #270 |
|---|---|
| Diameter of turn-table: | 300 mm |
| Speed of rotation: | 200 rpm |
| Rotation of wafer (holder): | 40 rpm |
| Pressure: | 8 kgf |
| Amplitude of swaying motion: | 0.5 degree |
| Polishing time: | 20 Hr, 50 Hr |

{A. After 20 hour polishing}

The samples were polished under the conditions for 20 hours and the surfaces of the samples were examined. About 70% of the surfaces from the center toward the periphery were smoothly polished for both sample *16* and sample *17. The peripheral part remained unpolished. The distortions were different for sample *16* and sample *17*. Sample *16* had its distortion reduced to −20 μm of convex-distortion. The reduction was caused by the elimination of the outer layer of a 5 μm thickness which had been synthesized at 800° C. and given a strong convex-distortion. Sample *17* was still convex-distorted with H=−45 μm. All of sample *17* was grown on the same condition which gives small convex-distortion. The reduction of the distortion was far less than sample *16* because of the smaller reduction of the inner stress.

{B. After 50 hour polishing}

Since the polishing is insufficient, both sample *16* and sample *17* were further polished for 30 hours under the same conditions. 50 hour treatment polished perfectly sample *16*. As the polishing progressed, the distortion gradually decreased because of the inner layer with weaker inner stress. The reduction of the distortion enabled the machine to polish the peripheral portion by the swaying motion. Sample *17* did not lose the strong convex-distortion which hinders the contact of the periphery to the turn-table. Thus the periphery remained unpolished despite the long-term polishing. About 80% of the total surface was polished by the 50 hour whetting. Comparison between sample *16* and sample *17* indicates that a desirable film is such a film which reduces the distortion in accordance with the progress of the polishing.

The final thickness of sample *16* was 11 μm±1.5 μm. The central portion was thinner than the periphery, similar to sample *15*. All the polished portions had a satisfactory smoothness of less than Rmax 9 nm and Ra 4 nm both for sample *16* and sample *17*.

EXAMPLE 3

Samples *18* and *19* were made by the microwave plasma CVD method under the following conditions. Then the samples were polished by the machine of the present invention.
{Production of the hard material films}

The substrate was a mirror-polished (100) silicon single crystal wafer of a 3 inch (75 mm) diameter and a 1 mm thickness (φ 3 inches×1 mm). The silicon wafer was bruised by diamond powder of average diameters of 0.5 μm to 1 μm. Samples *18* and *19* were prepared by coating the Si wafers by a 25 μm thick diamond film synthesized by the microwave plasma CVD method oscillating $TM_{01}$ mode under the following conditions. The components of the material gas were varied midway for the preparation of sample *18*.

| Material gas: | |
|---|---|
| **Sample *18*:** | |
| early 20 μm | hydrogen gas ($H_2$) 1000 sccm |
| | methane gas ($CH_4$) 10 sccm |
| later 5 μm | hydrogen gas ($H_2$) 1000 sccm |
| | methane gas ($CH_4$) 35 sccm |
| **Sample *19*:** | |
| whole 25 μm | hydrogen gas ($H_2$) 1000 sccm |
| | methane gas ($CH_4$) 30 sccm |
| Pressure = 400 Torr (5300 Pa) | |
| Microwave power = 1000 W | |
| Thickness of film = 25 μm | |
| Substrate temperature | |
| Sample *18*: | 850° C. |
| Sample *19*: | 830° C. |
| Distortion of wafer | |
| Sample *18*: | convex −35 μm |
| Sample *19*: | convex −40 μm |

The substrate temperature can be varied by changing the cooling power of the susceptor, while the filament temperature is kept constant. The higher the substrate temperature rises, the stronger the wafer is distorted into a concave shape. The lower the substrate temperature is, the stronger the wafer is deformed into a convex shape. Then sample *19* had a larger convex-distortion than sample *18*.

In Sample *18*, an undercoat 20 μm thick film was synthesized at an early stage from a material gas containing lower concentration of methane but a top 5 μm thick film was synthesized at a later stage from another material gas containing higher concentration of methane. The methane concentration dictates the orientation of the diamond film deposited on a silicon wafer. Namely, the orientation of the diamond film is capable of being controlled by the concentration of methane. The initial low concentration of 1 vol % of methane makes a(111) oriented diamond film. The later high concentration of 3.5 vol % produces a (110) oriented diamond film. Sample *18* had two films of a bottom 20 μm (111) oriented film and a top 5 μm (110) oriented film. By contrast, sample *19* utilized 3 vol % of methane concentration from beginning to end for making a (110) oriented film. "Oriented" indicates that almost all of the crystals are arranged in a certain direction, although the film is polycrystalline. A (111) oriented crystal is different from a (111) single crystal. The (111) oriented crystal is essentially a polycrystal. A polycrystal is an assembly of small single crystals whose crystallographical directions are aligned at random. A (klm) oriented crystal means almost all of the single crystal granules have its [klm] directions perpendicular to the face of the film. One direction is thus determined in the film. Nevertheless, other two axes vertical to [klm] are left indeterminate for all the granules. A (klm) crystal is essentially a polycrystal but [klm] direction of the granules is parallel to a normal of the film.

The diamond film produced by example *19* was not a single crystal. However, the orientation which determines one crystallographical direction of granules can generally be controlled by the concentration of a hydrocarbon gas in a material gas, namely by the ratio of hydrocarbon gas to hydrogen gas. This fact has been discovered by the Inventors of the present invention for the first time. Thus, the ratio of hydrocarbon to hydrogen is an important parameter in the production of diamond-coated wafers. Nobody has been aware of the relation before this invention. The degree of difficulty of polishing diamond depends on the orientation of the diamond. (111) orientation is very difficult to polish. (110) orientation is less difficult for polishing than (111).

The buffer was a flat natural rubber disc of a 85 mm diameter and a 1 mm thickness (φ 85×1 t). Sample *18* and *19* were attached to the center of holders via the elastic rubber buffers. The diamond-coated wafers were whetted by the polishing machine of the present invention.

{Conditions of Polishing}

Turn-table: diamond pellet whetstone which consists of many metal-bonded diamond pellets of a 15 mm diameter having concentration 120 of #600 diamond powder and a base disc to which many diamond pellets were attached.

Diameter of turn-table: 450 mm

Revolution speed of turn-table: 40 rpm

Rotation speed of wafer (holder): 30 rpm

Pressure: 12 kgf

Amplitude of swaying motion: 0.5 degree

Time of polishing 15 Hr, 35 Hr.

{A. After 15 hour polishing}

Samples *18* and *19* were polished for 15 hours under the conditions. About 70% of the surface from the center to the middle region was polished. The swaying motion of 0.5 degree enabled a wide portion of the convex-distorted wafer to come into contact with the surface of the turn-table. 30% of the surface near the circumference was left unpolished in both samples *18* and *19*.

{B. After 35 hour polishing}

Samples *18* and *19* were treated further for 20 hours under the same conditions. The entire surfaces were entirely polished both in sample *18* and sample *19*. The roughnesses of the surfaces were less than Rmax 100 nm and Ra 50 nm both for sample *18* and sample *19*.

The final thickness of the film of sample *18* was 20 μm±1 μm. Sample *19* had a final film thickness of 15 μm±5 μm. Sample *18* was superior in the fluctuation of film thickness to sample *19*. The excellence of the small fluctuation originated from the two-layered structure of sample *18* which has been explained before by referring to FIG. 28 and FIG. 29. Sample *18* had an undercoat 20 μm (111) oriented film and a top 5 μm (110) oriented film. The (111) film was quite difficult to polish; the (110) film was easier. In sample *18*, the polishing-easier (110) film was polished at first and almost all of the (110) film was abraded away. The undercoat (111) layer appeared. The polishing was substantially stopped by the polishing-difficult (111) layer. Then the final thickness was nearly equal to the thickness of the initial (111) layer. Small fluctuation ±1 μm resulted from the fact that almost all the (110) layer was perfectly eliminated. The (111) layer determined the final surface of the film. Of course, the two-layered method required small fluctuation of the thickness of the original (111) layer.

By contrast, since sample *19* had a single (110) layer which was easier to polish, the central portion was polished. The periphery had less of a likelihood of being polished than the center. Thus the film was thicker at peripheral portions than at the center. Then the fluctuation was 5 μm in sample *19*. Example 3 clarifies the improvement achieved by reducing the thickness fluctuation by depositing first a polishing-difficult film of a definite thickness on a substrate, depositing next a polishing-easy film on the undercoat, polishing the top layer entirely and revealing the polishing-difficult layer.

What we claim is:

1. A hard material-coated wafer comprising:

a distorted substrate which is flat in a free-standing state; and a hard material film of a Vickers hardness more than Hv3000 formed on at least one surface of said substrate by a CVD method, wherein said wafer has a total thickness that ranges from 0.1 mm to 2.1 mm and a diameter that is larger than 25 mm, wherein more than 50% of said film is polished to a roughness less than Rmax 50 nm and Ra 20 nm, and wherein said wafer has a convex-shape, such that said wafer is distorted to a film side of said wafer with a distortion height H of −150 µm to −2 µm.

2. A hard material-coated wafer as claimed in claim 1, wherein said wafer is circular and has a monotonously distorted shape from a center to a periphery thereof, such that said wafer exhibits said convex shape on said film side.

3. A hard material-coated wafer as claimed in claim 1, wherein a ratio ($T_1/T_2$) of film thickness ($T_1$) to substrate thickness ($T_2$) ranges from 0.05 to 1, and wherein the substrate thickness ($T_2$) is 0.1 mm to 2 mm and the film thickness ($T_1$) is 0.002 mm to 0.2 mm.

4. A hard material-coated wafer as claimed in claim 3, wherein the hard material is selected from the group consisting of diamond, diamond-like carbon and c-BN.

5. A hard material-coated wafer as claimed in claim 4, wherein said substrate is a polycrystal or a single crystal of Si, GaAs, GaP, AlN, SiC, $Si_3N_4$, $LiTaO_3$, $LiNbO_3$, $Li_2B_4O_7$, $PbTiO_3$, PZT($PbZrO_3$-$PbTiO_3$) or quartz.

6. A hard material-coated wafer as claimed in claim 5, wherein said substrate is a (100) Si single crystal.

7. A hard material-coated wafer as claimed in claim 5, wherein more than 50% of said film from said center toward said periphery is polished to a roughness less than Rmax 50 nm and Ra 20 nm.

8. A method for forming a hard material-coated wafer comprising a substrate with a hard material film formed directly on the substrate, said method comprising the steps of:

providing a substrate which is flat in a free-standing state;

synthesizing a hard material film of a Vickers hardness more than Hv3000 directly on at least one surface of the substrate by a CVD method to form a wafer and thereby distorting the wafer into a convex shape so that the wafer is distorted to a film side of the wafer with a distortion height H of −150 µm to −2 µm; and polishing more than 50% of the film to a roughness less than Rmax 50 nm and Ra 20 nm, wherein the wafer has a total thickness ranging from 0.1 mm to 2.1 mm and a diameter larger than 25 mm.

9. A method as claimed in claim 8, wherein the wafer is circular and has a monotonously distorted shape from a center to a periphery thereof.

10. A method as claimed in claim 8, wherein a ratio ($T_1/T_2$) of film thickness ($T_1$) to substrate thickness ($T_2$) ranges from 0.05 to 1, and wherein the substrate thickness ($T_2$) is 0.1 mm to 2 mm and the film thickness ($T_1$) is 0.002 mm to 0.2 mm.

11. A method as claimed in claim 10, wherein the hard material is selected from the group consisting of diamond, diamond-like carbon and c-BN.

12. A method as claimed in claim 4, wherein the substrate is a polycrystal or a single crystal of Si, GaAs, GaP, AlN, SiC, $Si_3N_4$, $LiTaO_3$, $LiNbO_3$, $Li_2B_4O_7$, $PbTiO_3$, PZT ($PbZrO_3$-$PbTiO_3$) or quartz.

13. A method as claimed in claim 12, wherein the substrate is a (100) Si single crystal.

* * * * *